United States Patent
Roy

(10) Patent No.: US 10,802,164 B2
(45) Date of Patent: Oct. 13, 2020

(54) METHOD AND APPARATUS FOR PERFORMING PATTERN RECOGNITION FOR A TUNABLE SENSOR SYSTEM TO DETECT NEUTRON AND GAMMA PARTICLES

(71) Applicant: Rhombus Holdings LLC, Mountain View, CA (US)

(72) Inventor: Anshuman Roy, Mountain View, CA (US)

(73) Assignee: RHOMBUS HOLDINGS LLC, Mountain View, CA (US)

(*) Notice: Subject to any disclaimer, the term of this patent is extended or adjusted under 35 U.S.C. 154(b) by 6 days.

(21) Appl. No.: 16/100,043

(22) Filed: Aug. 9, 2018

(65) Prior Publication Data
US 2019/0244056 A1 Aug. 8, 2019

Related U.S. Application Data

(60) Provisional application No. 62/626,513, filed on Feb. 5, 2018.

(51) Int. Cl.
*G01T 3/08* (2006.01)
*H01L 27/146* (2006.01)
(Continued)

(52) U.S. Cl.
CPC ............. *G01T 3/08* (2013.01); *G01N 21/39* (2013.01); *G01N 23/222* (2013.01);
(Continued)

(58) Field of Classification Search
CPC ........ G01T 3/08; G06N 7/005; G06N 3/0454; G06K 9/6256; G06K 9/6212;
(Continued)

(56) References Cited

U.S. PATENT DOCUMENTS

| 5,098,640 A | 3/1992 | Gozani et al. |
| 5,399,863 A | 3/1995 | Carron et al. |

(Continued)

FOREIGN PATENT DOCUMENTS

| JP | H05174634 | 7/1993 |
| JP | H11174292 | 7/1999 |

(Continued)

OTHER PUBLICATIONS

Vavrik D., et al., "Position Sensitive Detection of Neutrons in High Radiation Background Field", Review of Scientific Instruments, Jan. 27, 2014, vol. 85, Issue 1, 013304.

(Continued)

*Primary Examiner* — Neil R McLean

(57) ABSTRACT

A computer implemented method of detecting neutrons in images from a tunable sensor system comprises training a deep learning process to recognize known radiation-dependent signature patterns created by neutrons in test images. The method further comprises splitting an input image into a plurality of frames and passing the plurality of frames through the deep learning process in order to recognize neutrons in the plurality of frames. Subsequently, the method comprises recombining the plurality of frames back into the input image. For each pixel within the input image, the method comprises examining pixels connected to a respective pixel to determine if a signature pattern particular to neutrons is present within the input image and counting a number of neutrons within the input image using results from the examining.

20 Claims, 43 Drawing Sheets

(51) Int. Cl.
*G01N 23/222* (2006.01)
*G01N 21/39* (2006.01)
*G06K 9/62* (2006.01)
*G06N 3/04* (2006.01)
*G06N 7/00* (2006.01)

(52) U.S. Cl.
CPC ......... *G06K 9/6202* (2013.01); *G06K 9/6212* (2013.01); *G06K 9/6256* (2013.01); *G06N 3/0454* (2013.01); *G06N 7/005* (2013.01); *H01L 27/14659* (2013.01)

(58) Field of Classification Search
CPC .... G06K 9/6202; G01N 21/39; G01N 23/222; G01N 23/025; H01L 27/14659
See application file for complete search history.

(56) References Cited

U.S. PATENT DOCUMENTS

| | | | |
|---|---|---|---|
| 5,479,023 A | 12/1995 | Bartle | |
| 5,519,225 A | 5/1996 | Mohr et al. | |
| 5,559,336 A | 9/1996 | Kosai et al. | |
| 5,940,460 A | 8/1999 | Seidel et al. | |
| 6,423,972 B1 | 7/2002 | Fehrenbacher et al. | |
| 6,657,199 B2 | 12/2003 | Frederick et al. | |
| 7,332,726 B2 | 2/2008 | Friedman et al. | |
| 7,626,178 B2 | 12/2009 | Ivan et al. | |
| 7,847,260 B2 | 12/2010 | Inbar | |
| 8,022,369 B2 | 9/2011 | Orava et al. | |
| 8,044,367 B2 | 10/2011 | Yoshikawa et al. | |
| 8,263,940 B2 | 9/2012 | Orava et al. | |
| 8,558,187 B1 | 10/2013 | Seidler, II | |
| 8,569,708 B2 | 10/2013 | Stradins et al. | |
| 8,759,784 B2 | 6/2014 | Prendergast et al. | |
| 8,822,924 B2 | 9/2014 | Valentino et al. | |
| 9,012,863 B2 | 4/2015 | Kopp | |
| 9,081,100 B1 | 7/2015 | Bellinger et al. | |
| 9,085,537 B2 | 7/2015 | Nomura et al. | |
| 9,204,849 B2 | 12/2015 | Kurokawa et al. | |
| 9,360,565 B2 | 6/2016 | Clark et al. | |
| 9,395,454 B2 | 7/2016 | Orava et al. | |
| 9,435,755 B2 | 9/2016 | Roy | |
| 9,435,897 B2 | 9/2016 | Roy | |
| 9,557,423 B2 | 1/2017 | Ahlen et al. | |
| 9,702,988 B1 | 7/2017 | Rhiger et al. | |
| 9,835,742 B1* | 12/2017 | Nagarkar | G01T 3/08 |
| 9,864,072 B2 | 1/2018 | Li et al. | |
| 9,910,171 B2 | 3/2018 | Kunnen et al. | |
| 9,958,560 B1 | 5/2018 | Ogasawara | |
| 9,958,561 B2* | 5/2018 | Bellinger | G01T 3/00 |
| 9,977,138 B2 | 5/2018 | Kunimoto | |
| 10,067,239 B2 | 9/2018 | Nelson et al. | |
| 10,088,580 B2 | 10/2018 | Nelson et al. | |
| 10,267,927 B2 | 4/2019 | Nelson et al. | |
| 10,274,610 B2 | 4/2019 | Nelson et al. | |
| 10,295,681 B2 | 5/2019 | Taguchi et al. | |
| 10,365,383 B2 | 7/2019 | Nelson et al. | |
| 10,473,795 B2 | 11/2019 | Wang et al. | |
| 10,483,316 B2 | 11/2019 | Okandan et al. | |
| 2002/0195564 A1 | 12/2002 | Frederick et al. | |
| 2004/0188677 A1 | 9/2004 | Luszik-Bhadra | |
| 2006/0169905 A1 | 8/2006 | Wenstrand | |
| 2006/0185165 A1 | 8/2006 | Vafi et al. | |
| 2007/0001123 A1 | 1/2007 | Andrews et al. | |
| 2009/0140150 A1 | 6/2009 | Ivan et al. | |
| 2009/0269244 A1 | 10/2009 | Cunningham et al. | |
| 2010/0155611 A1 | 6/2010 | Fullwood et al. | |
| 2011/0095194 A1 | 4/2011 | Orava et al. | |
| 2011/0284755 A1 | 11/2011 | Stradins et al. | |
| 2012/0012957 A1 | 1/2012 | Larsen et al. | |
| 2012/0148004 A1 | 6/2012 | Caruso et al. | |
| 2012/0280133 A1 | 11/2012 | Kagey et al. | |
| 2012/0298846 A1 | 11/2012 | Nomura et al. | |
| 2013/0068956 A1 | 3/2013 | Friedman | |
| 2013/0240744 A1 | 9/2013 | Hurst, Jr. et al. | |
| 2013/0284884 A1 | 10/2013 | Friedman | |
| 2013/0320212 A1 | 12/2013 | Valentino et al. | |
| 2014/0077092 A1 | 3/2014 | Kopp | |
| 2014/0079171 A1 | 3/2014 | Roy | |
| 2014/0158893 A1* | 6/2014 | Platt | G01T 3/08 250/370.05 |
| 2015/0204984 A1 | 7/2015 | Friedman | |
| 2016/0003953 A1* | 1/2016 | Kunnen | G01T 3/08 250/370.05 |
| 2016/0047918 A1 | 2/2016 | Friedman | |
| 2017/0003405 A1 | 1/2017 | Ahlen et al. | |
| 2017/0153340 A1* | 6/2017 | Bellinger | G01T 3/00 |
| 2017/0192107 A1* | 7/2017 | Li | G01T 1/202 |
| 2017/0322326 A1 | 11/2017 | Friedman | |
| 2018/0120460 A1* | 5/2018 | Ogasawara | G01T 1/26 |
| 2019/0242835 A1 | 8/2019 | Roy | |
| 2019/0243012 A1 | 8/2019 | Roy | |

FOREIGN PATENT DOCUMENTS

| | | |
|---|---|---|
| JP | 2010056396 A | 3/2010 |
| WO | 2009115956 A2 | 9/2009 |

OTHER PUBLICATIONS

Kotov S., "Machine Learning Methods for Cluster Identification on Pixel Detectors", New Trends in High-Energy Physics 2018, Joint Institute for Nuclear Research, Sep. 24, 2018, Online.

Sultan Salahuddin, et al., Development of Active Pixel Photodiode Sensors for Gamma Camera Application, Proceedings of the International Conference on Electrical Engineering and Informatics, Institut Teknologi Bandung, Indonesia Jun. 17-19, 2007.

Bouchami, et al., "Estimate of the neutron fields in ATLAS based on ATLAS-MPX detectors data", 12th International Workshop on Radiation Imaging Detectors, Robinson College, Cambridge, U.K., Jul. 11-15, 2010. Retrieved Feb. 27, 2013 from http://iopscience.iop.org/1748-0221/6/01/C01042.

Bouchami, et al., Estimate of the neutron fields in ATLAS based on ATLAS-MPX detectors data, 12th International Workshop on Radiation Imaging Detectors, Jul. 11-15, 2010, Robinson College, Cambridge U.K., published Jan. 11, 2011, http://iopscience.iop.org.

Rynes, et al., Abstract of Gamma-ray and neutron radiography as part of a pulsed fast neutron analysis inspection system, Nuclear Instruments and methods in Physics Research Section A, Feb. 1999, p. 859-899, vol. 422 , SOA/NASA ADS Physics Abstract Service, http://adsabs.harvard.edu.

\* cited by examiner

| Pixel number 710 | Element number 720 | Module number 730 | Intensity value 740 | Time-stamp 750 |

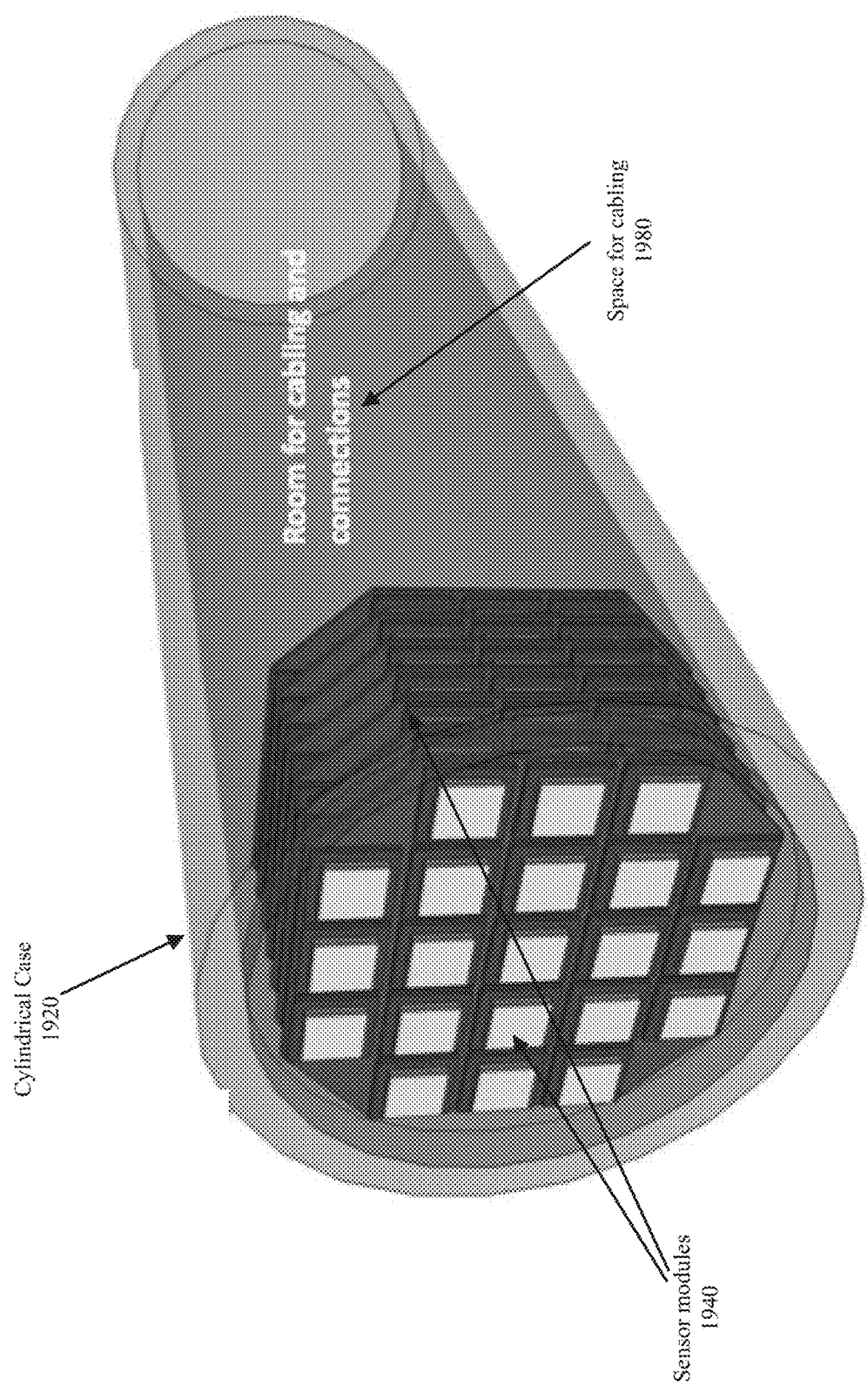

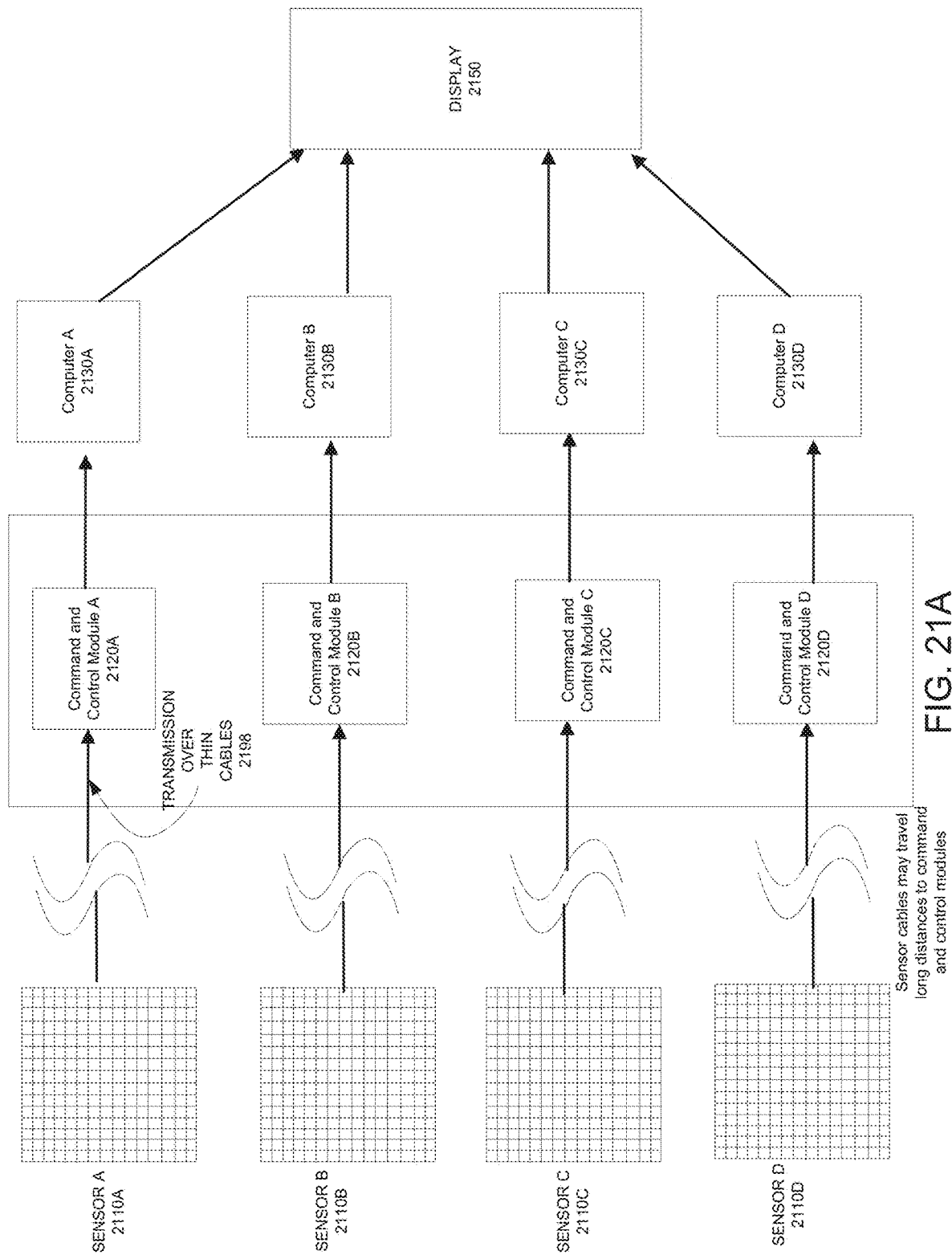

METHOD AND APPARATUS FOR PERFORMING PATTERN RECOGNITION FOR A TUNABLE SENSOR SYSTEM TO DETECT NEUTRON AND GAMMA PARTICLES

CROSS-REFERENCE TO RELATED APPLICATIONS

Related Applications

This application is a conversion of and claims priority to and the benefit of Provisional Patent Application No. 62/626,513, entitled "Subatomic Particle Detection System For Decommissioning Activities," having a filing Date of Feb. 5, 2018, which is herein incorporated by reference in its entirety.

The present application is related to U.S. patent application Ser. No. 13/894,305, filed May 14, 2013, now issued as U.S. Pat. No. 9,435,755, entitled "SCALABLE AND TUNABLE NEUTRON DETECTION INSTRUMENT," naming Anshuman Roy as inventor. That application is incorporated herein by reference in its entirety and for all purposes.

The present application is related to U.S. patent application Ser. No. 13/894,272, filed May 14, 2013, now issued as U.S. Pat. No. 9,435,897, entitled "TUNABLE DETECTION INSTRUMENT FOR SUBATOMIC PARTICLES," naming Anshuman Roy as inventor. That application is incorporated herein by reference in its entirety and for all purposes.

The present application is related to U.S. patent application Ser. No. 16/100,024, filed Aug. 9, 2018 entitled "COMPONENT CONFIGURATION FOR A ROBUST TUNABLE SENSOR SYSTEM FOR A HIGH RADIATION ENVIRONMENT," naming Anshuman Roy as inventor. That application is incorporated herein by reference in its entirety and for all purposes.

The present application is related to U.S. patent application Ser. No. 16/059,959, filed Aug. 9, 2018, entitled "PHYSICAL STRUCTURE FOR A TUNABLE SENSOR SYSTEM FOR PARTICLE DETECTION," naming Anshuman Roy as inventor. That application is incorporated herein by reference in its entirety and for all purposes.

FIELD OF THE INVENTION

Embodiments according to the present invention generally relate to detecting subatomic particles and more specifically to a device for detecting subatomic particles.

BACKGROUND OF THE INVENTION

Neutrons are subatomic particles with no net electric charge. Neutrons and protons, another subatomic particle, together form the nucleus of all elements in the periodic table except hydrogen. Free neutrons are produced as a consequence of either nuclear fission, radioactive decay of elements or fusion. Special nuclear materials ("SNMs") such as plutonium that are used for making dirty bombs decay radioactively to produce neutrons. Detection of such neutrons is an effective way of tracking the source of SNMs. However, since neutrons do not carry any electric charge, their detection is problematic as compared to other charged subatomic particles. One method of neutron detection that has been successfully employed is to use materials that can capture incident neutrons and convert them into other easily detectable subatomic particles, such as alpha particles, tritons, gamma rays, etc.

Historically, high-pressure Helium-3 (He3) tubes have been the mainstay of neutron detection. Neutrons impinging on these tubes interact with He3 nuclei to produce triton and protium, both of which are energetically charged subatomic particles that migrate in the presence of a strong electric field inside the tubes towards the electrodes. Unfortunately, He3 supplies on the planet are running low and the price of He3 in recent years has increased twenty-fold in the last decade alone. Thus, there is a strong consensus in the field to replace He3 technology with alternatives, mostly scintillation based detection systems and Boron lined proportional tubes.

Scintillator detectors also have several limitations. First, scintillation crystals are expensive and made in small volumes due to a limited market. Second, complicated pulse shape discrimination algorithms need to be employed in these systems to discriminate neutrons from gamma rays, which also interact heavily with the scintillating crystals. Scintillation detectors also suffer from reliability issues on the field due to the use of scintillating crystals that can be sensitive to environmental factors such as humidity and salinity. The gamma discrimination capability of Boron lined tubes is better than scintillator detectors. However, being a proportional counter technology, Boron lined tubes are limited by their form factor in the scope of their applications. Moreover, there is an absence of a global supply chain to drive down their cost over time. Both scintillation and proportional counter based systems must contend with significant system-level noise that interferes with measurements of low incident neutron flux levels close to the cosmic background. They also lack modularity, flexibility to detect subatomic particles other than neutrons, and potential for rapid scalability.

Further, conventional methods of particle detection are typically too sensitive for extreme environmental conditions. For example, if a conventional particle detection system is being used to detect neutrons in a nuclear power plant or nuclear reactor after an accident, it may likely destroy any of the known systems for radiation detection.

BRIEF SUMMARY OF THE INVENTION

Accordingly, what is needed is a technology for neutron detection that employs readily available and easily replaceable components that are readily tunable to detect neutrons and designed to be modular. Further, the technology needs to be flexible so that other subatomic or other particles besides neutrons can also be detected. Moreover, the technology needs to be robust enough to detect radiation particle in intense radiation environments.

Disclosed herein is a modular and tunable technology platform comprising simple, easy-to-acquire, off-the-shelf components that are modified and assembled together to form a highly sensitive, high-performance instrument. The off-the-shelf components used to assemble the device may be tuned to be sensitive to different particles including neutrons. The readily available and easily replaceable components of the present invention may be tuned to be sensitive to neutrons of different energies. The architecture of the embodiments of the invention disclosed herein not only allows for rapid, sensitive and flexible detection and imaging of neutrons, especially thermal neutrons, but also of a wide variety of other subatomic particles that may accompany neutrons that originate from an SNM or other radioactive source. The system architecture also enables identification of the element (radionuclide) that acts as a source of the incident neutrons. The architecture also enables tracking the direction of the source of neutrons and identification of the radionuclide or non-radionuclide source from which the neutrons originated. Finally, the architectures of the embodiments of the invention disclosed herein enable real time gamma discrimination thereby reducing false positives and response times of the instrument.

In one embodiment, a method for detecting particles is disclosed. The method comprises generating a reaction to a plurality of particles using a converter material, wherein the converter material is operable to interact with the plurality of particles, and wherein a subset of the plurality of particles comprises neutrons. Further, the method comprises converting a response to the reaction to a readable electrical signal using a sensor, wherein the sensor comprises an array of pixels. Also, the method comprises processing the readable electrical signal from the sensor to generate information for each pixel on the array of pixels and transmitting the information to a processing unit. Finally, the method comprises executing a discrimination procedure using the information for distinguishing between instances of impingement of neutrons and instances of impingement of non-neutron particles on the array of pixels.

In one embodiment, an apparatus for detecting neutrons is disclosed. The apparatus comprises a converter layer operable to interact with and generate a reaction to a plurality of particles, wherein a subset of the plurality of particles comprises neutrons. It also comprises a sensor coupled to the converter layer, wherein the sensor is operable to convert a response to the reaction to a readable electrical signal, and wherein the sensor comprises an array of discrete pixel sensors each with a respective (x,y) coordinate within the array. The apparatus further comprises a first processing device operable to process the readable electrical signal to generate information for each pixel on the array and a second processing device communicatively coupled to the first processing device. The second processing device is configured to: (a) control the first processing device; (b) receive the information from the first processing device; and (c) execute a discrimination procedure using the information to distinguish between instances of impingement of neutrons and instances of impingement of non-neutron particles on the array.

In one embodiment, a system for detecting neutrons is disclosed. The system comprises a plurality of sensor modules, wherein each sensor module comprises a plurality of sensor elements and a first processing device. Each of the sensor elements comprises at least one converter layer operable to interact with and generate a reaction to a plurality of particles, wherein a subset of the plurality of particles comprises neutrons. Each sensor element also comprises a sensor coupled to the at least one converter layer, wherein the sensor is operable to convert a response to the reaction to a readable electrical signal. Further, the sensor comprises an array of discrete pixel sensors each with a respective (x,y) coordinate within the array. The system can also comprise a second processing device communicatively coupled to the plurality of sensor modules, wherein the second processing device is operable to read information regarding a respective readable electrical signal from a respective first processing device on each of the plurality of sensor modules. Further, the second processing device is operable to execute a discrimination procedure using the information to distinguish between instances of impingement of neutrons and instances of impingement of non-neutron particles on respective arrays of pixel sensors associated with the plurality of sensor modules. Finally, the system comprises a housing to encapsulate the plurality of sensor modules, wherein at least one of the plurality of sensor modules is tuned to detect a neutron and at least one of the plurality of sensor modules is tuned to detect a non-neutron particle.

In one embodiment, a sensor for detecting particles is disclosed. The sensor comprises a silicon wafer substrate and a charge detection layer disposed on the silicon wafer substrate, wherein the charge detection layer comprises a plurality of discrete pixel sensors. The sensor also comprises a converter material operable to interact with particles of a first type to generate a reaction, wherein the reaction produces charged particles, wherein the charge detection layer is configured to detect charged particles produced by the reaction, and wherein the charge detection layer is configured to generate a readable electrical signal with information regarding the charged particles detected. Further, the sensor comprises a substrate layer operable to filter particles of a second type, wherein the converter material is coated on an underside of the substrate layer wherein the converter material faces the charge detection layer and an air gap is formed between the converter material and the charge detection layer.

In a different embodiment, a sensor for detecting particles is disclosed. The sensor comprises a silicon wafer substrate and a charge detection layer disposed on the silicon wafer substrate, wherein the charge detection layer comprises a plurality of discrete pixel sensors. The sensor further comprises a converter material operable to interact with a particles of a first type to generate a reaction, wherein the reaction produces charged particles, wherein the charge detection layer is configured to detect charged particles produced by the reaction, and wherein the charge detection layer is configured to generate a readable electrical signal with information regarding the charged particles detected. Also, the sensor comprises a substrate layer operable to condition particles of a second type, wherein an interaction with the substrate layer changes a characteristic of particles of the second type, wherein the converter material is coated on an underside of the substrate layer wherein the converter material faces the charge detection layer and an air gap is formed between the converter material and the charge detection layer.

In one embodiment, a sensor for detecting particles is disclosed where the sensor comprises a silicon wafer substrate and a charge detection layer disposed on the silicon wafer substrate, wherein the charge detection layer comprises a plurality of discrete pixel sensors. The sensor further comprises a converter material operable to interact with one or more types of particles to generate a reaction, wherein the reaction produces charged particles, wherein the charge detection layer is configured to detect charged particles produced by the reaction, and wherein the charge detection layer is configured to generate a readable electrical signal with information regarding the charged particles detected. Also, the sensor comprises a substrate layer operable to filter a type of particles different from the one or more types of particles that interact with the converter material, wherein the substrate layer is adjacent to the converter material and on an opposite side from the charge detection layer.

In one embodiment, a method of capturing and analyzing information for a particle detection system is disclosed. The method comprising generating a reaction to a plurality of particles using a converter material, wherein the converter material is operable to interact with the plurality of particles. The method further comprises converting a response to the reaction to an electrical signal using a plurality of sensors, wherein the converter material is operable to be coated onto the plurality of sensors, and wherein each of the plurality of sensors comprises an array of discrete pixel sensors each with a respective (x,y) coordinate within the array. Further, the method comprises processing the electrical signal to generate data regarding each pixel on the array of discrete pixels and serializing the data collected from the plurality of sensors and transmitting the data over thin cables to a processing unit, wherein the processing unit is located at a separate and remote location from the plurality of sensors. Finally, the method comprises converting the data into a sequence of images comprising a visual representation of the plurality of particles impinging on the plurality of sensors.

In one embodiment, an apparatus for capturing and analyzing information for a particle detection system is disclosed. The apparatus comprises a converter layer coated onto a substrate and operable to interact with and generate a reaction to a plurality of particles, wherein the plurality of particles comprise neutrons. The apparatus also comprises a plurality of sensors in proximity to and facing the converter layer, wherein the plurality of sensors is operable to convert a response to the reaction to an electrical signal, and wherein the sensor comprises an array of discrete pixel sensors. Furthermore, the apparatus comprises a first processing device operable to process the electrical signal to generate information for each pixel on the array of discrete pixel sensors, a data serializer to serialize the information generated, and transmission line cables for transmitting the information to a second processing unit, wherein the second processing unit is located at a separate and remote location from the plurality of sensors. The second processing device is communicatively coupled to the first processing device, and the second processing device is configured to: a) control the first processing device; b) receive the information from the first processing device; and c) convert the information into a sequence of images comprising a visual representation of the plurality of particles impinging on the plurality of sensors.

In an embodiment, a system for detecting neutrons is disclosed. The system comprises a plurality of sensor arrays, wherein each sensor array comprises a plurality of sensors, wherein each sensor comprises: a) a converter layer disposed on the sensor, wherein the converter layer is operable to interact with and generate a reaction to a plurality of particles, wherein the plurality of particles comprises neutrons; b) an array of discrete pixel sensors each with a respective (x,y) coordinate within the array, wherein the discrete pixel sensors are operable to convert a response to the reaction to a readable electrical signal; c) a first processing device operable to process the readable electrical signal to generate information for each pixel on the array of discrete pixel sensors; and d) a data serializer to serialize the information. The system also comprises a plurality of second processing devices communicatively coupled to the plurality of sensors, wherein each second processing device is associated with a discrete one of the plurality of sensors, wherein each second processing device is operable to receive the serialized information from an associated sensor using thin cables, and wherein the plurality of second processing devices are located at a separate and remote location from the plurality of sensors arrays.

In one embodiment, a system for detecting neutrons is disclosed. The system comprises a plurality of sensor arrays, wherein each sensor array comprises a plurality of sensors, wherein each sensor comprises: a) a converter layer disposed on the sensor, wherein the converter layer is operable to interact with and generate a reaction to a plurality of particles, wherein the plurality of particles comprises neutrons; b) an array of discrete pixel sensors each with a respective (x,y) coordinate within the array, wherein the discrete pixel sensors are operable to convert a response to the reaction to a readable electrical signal; c) a first processing device operable to process the readable electrical signal to generate information for each pixel on the array of discrete pixel sensors; and d) a data serializer to serialize the information, wherein the first processing device and the data serializer are located in proximity to a respective sensor. The system also comprises a plurality of second processing devices communicatively coupled to the plurality of sensors, wherein each second processing device is associated with a discrete one of the plurality of sensors, wherein each second processing device is operable to receive the serialized information from an associated sensor using thin cables, wherein the plurality of second processing devices are located at a separate and remote location from the plurality of sensors arrays, and wherein the plurality of second processing device are operable to detect a particle type based on the serialized information received from the plurality of sensor arrays.

In a different embodiment, a computer implemented method of detecting neutrons in images from a tunable sensor system is disclosed. The method comprises training a deep learning process to recognize known radiation-dependent signature patterns created by neutrons in test images. The method further comprises splitting an input image into a plurality of frames and passing the plurality of frames through the deep learning process in order to recognize neutrons in the plurality of frames. Subsequently, the method comprises recombining the plurality of frames back into the input image. For each pixel within the input image, the method comprises examining pixels connected to a respective pixel to determine if a signature pattern particular to neutrons is present within the input image and counting a number of neutrons within the input image using results from the examining.

In another embodiment, a system for detecting neutrons in images from a tunable sensor system is disclosed. The system comprises a memory for storing a plurality of test images, an input image, and instructions associated with a deep learning process and a process for detecting particles of interest in images. The system also comprises a processor coupled to the memory, the processor being configured to operate in accordance with the instructions to: a) train the deep learning process to recognize known radiation-dependent signature patterns created by a particle of interest in test images; b) split an input image into a plurality of frames; c) pass the plurality of frames through the deep learning process in order to recognize the particle of interest in the plurality of frames; d) combine the plurality of frames back into the input image; e) for each pixel within the input image, examine pixels connected to a respective pixel to determine if a signature pattern particular to the particle of interest is present within the input image; and f) determine a count of the particle of interest within the input image using the connected pixels.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 19A illustrates a cylindrical configuration that enables multiple sensors to be stacked to increase sensitivity in accordance with an embodiment of the present invention.

FIG. 21A is a logical diagram that illustrates the manner in which data is transmitted from the sensors to the command and control equipment in accordance with an embodiment of the present invention.

DETAILED DESCRIPTION OF THE INVENTION

Figure 1:
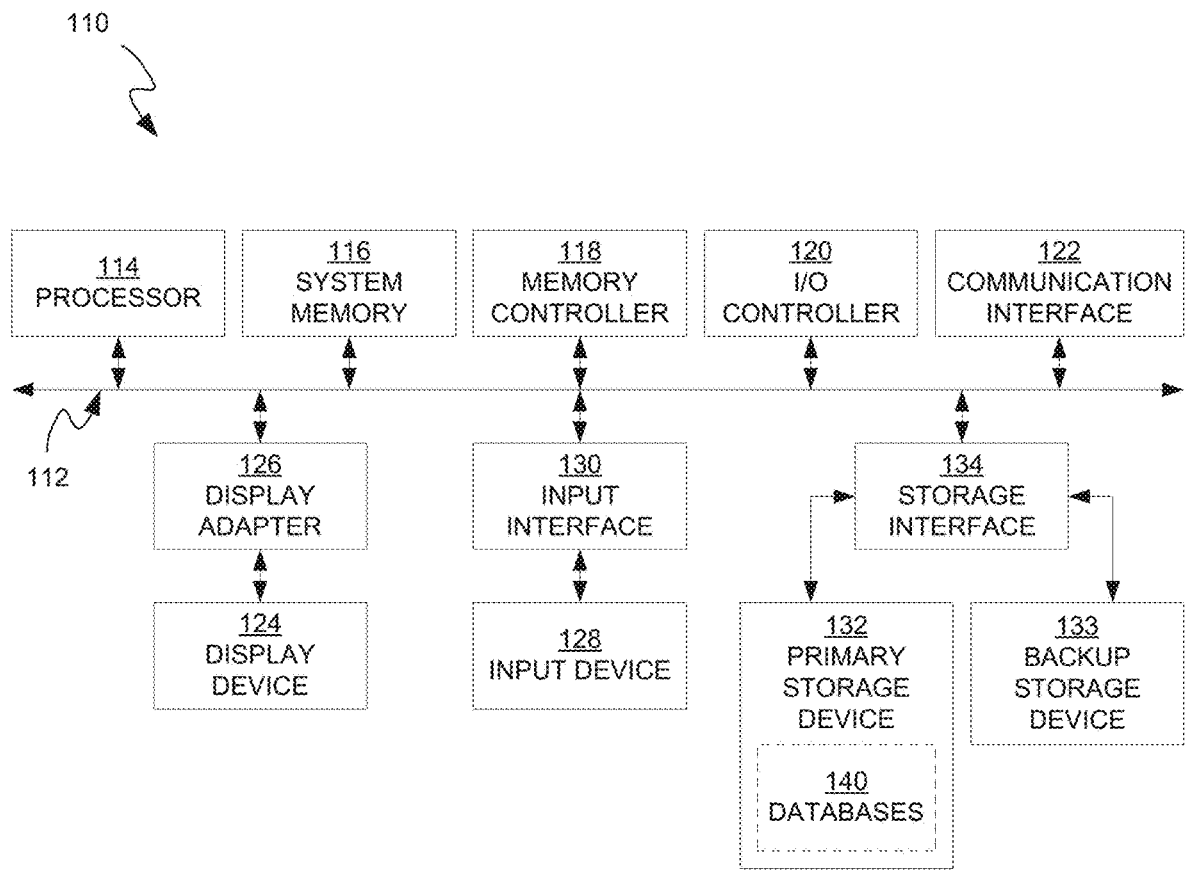
FIG. 1 is a block diagram of an example of a computing system capable of implementing embodiments of the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "converting," "processing," "analyzing," "transmitting," "allocating," "detecting," "associating," "accessing," "erasing," "freeing," "controlling," "determining," "identifying," or the like, refer to actions and processes (e.g., flowchart 800 of FIG. 8) of a computer system or similar electronic computing device or processor (e.g., computing system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram of an example of a computing system 110 for a neutron and other subatomic particles detecting system 110 capable of implementing embodiments of the present disclosure. Computing system 110 broadly represents any single or multi-processor computing device or system capable of executing computer-readable instructions. Examples of computing system 110 include, without limitation, workstations, laptops, client-side terminals, servers, distributed computing systems, handheld devices, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing system 110. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

A computer program for controlling the particle detection system may be stored on the computer readable medium and then stored in system memory 116 and/or various portions of storage devices 132 and 133. When executed by the processor 114, the computer program may cause the processor 114 to perform and/or be a means for performing the functions required for carrying out particle detection.

Figure 2:
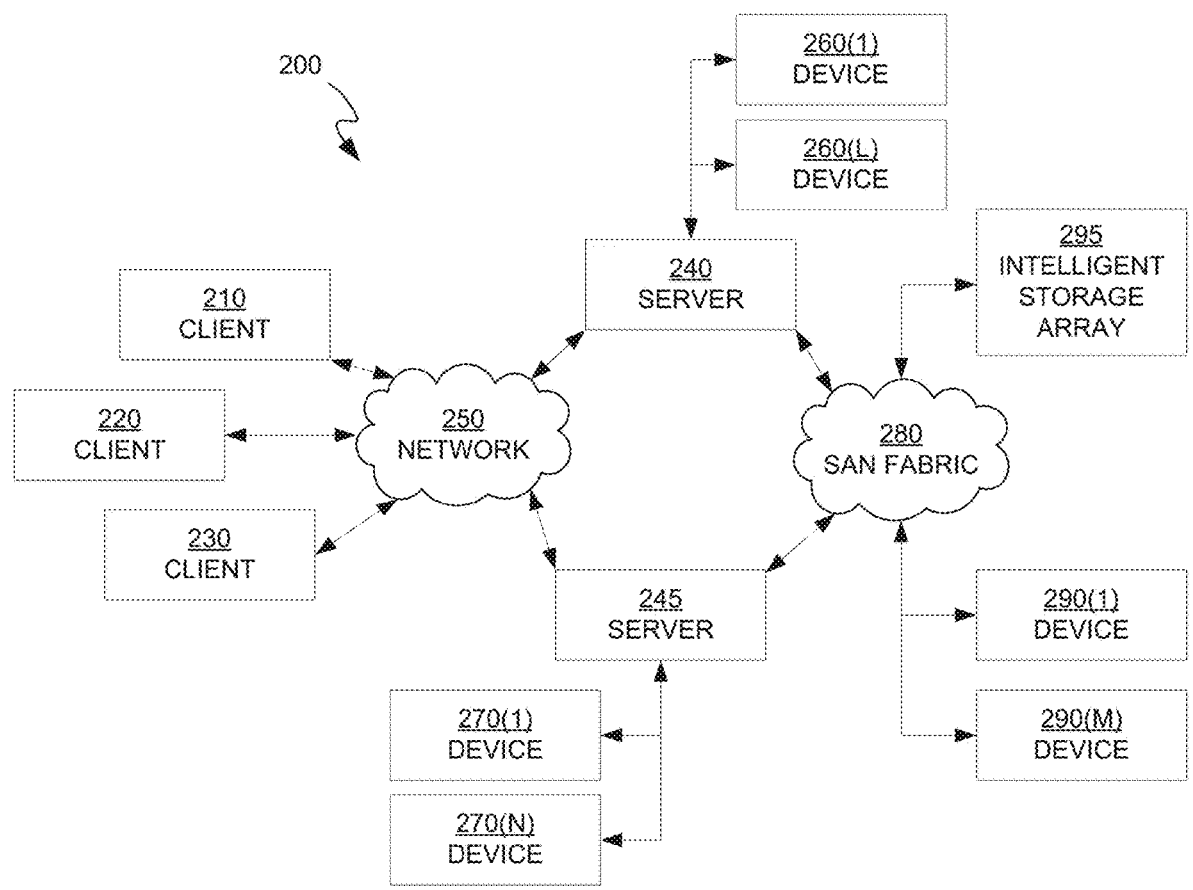
FIG. 2 is a block diagram of an example of a network architecture in which client systems and servers may be coupled to a network, according to embodiments of the present invention.

FIG. 2 is a block diagram of an example of a network architecture 200 in which client systems 210, 220, and 230 and servers 240 and 245 may be coupled to a network 250. Client systems 210, 220, and 230 generally represent any type or form of computing device or system, such as computing system 110 of FIG. 1.

Similarly, servers 240 and 245 generally represent computing devices or systems, such as application servers or database servers, configured to provide various database services and/or run certain software applications. Network 250 generally represents any telecommunication or computer network including, for example, an intranet, a wide area network (WAN), a local area network (LAN), a personal area network (PAN), or the Internet.

With reference to computing system 110 of FIG. 1, a communication interface, such as communication interface 122, may be used to provide connectivity between each client system 210, 220, and 230 and network 250. Client systems 210, 220, and 230 may be able to access information on server 240 or 245 using, for example, a Web browser or other client software. Such software may allow client systems 210, 220, and 230 to access data hosted by server 240, server 245, storage devices 260(1)-(L), storage devices 270(1)-(N), storage devices 290(1)-(M), or intelligent storage array 295. Although FIG. 2 depicts the use of a network (such as the Internet) for exchanging data, the embodiments described herein are not limited to the Internet or any particular network-based environment.

In one embodiment, all or a portion of one or more of the example embodiments disclosed herein are encoded as a computer program and loaded onto and executed by server 240, server 245, storage devices 260(1)-(L), storage devices 270(1)-(N), storage devices 290(1)-(M), intelligent storage array 295, or any combination thereof. All or a portion of one or more of the example embodiments disclosed herein may also be encoded as a computer program, stored in server 240, run by server 245, and distributed to client systems 210, 220, and 230 over network 250.

Scalable and Tunable Neutron Detection Instrument

Embodiments of the present invention provide methods and systems for detecting neutrons and other subatomic particles. While the discussion below predominantly focuses on subatomic particles including neutrons, embodiments and principles of the present invention can also be used to detect atomic species, e.g., ions, gases, etc. or molecular species as well.

Disclosed herein is a modular and tunable technology platform comprising readily available, easy-to-acquire, off-the-shelf components that are assembled together to form a highly sensitive, robust, high-performance instrument. The off-the-shelf components used to assemble the device may be tuned to be sensitive to different particles. The architecture of the invention disclosed herein allows for rapid, sensitive and flexible detection and identification of a wide variety of subatomic particles such as neutrons, gamma rays, beta particles, alpha particles, neutrinos, muons, etc. using the same instrument. Also, the particle detection device of embodiments of the present invention can be designed using solid-state electronics which helps reduce noise and vibration.

Figure 3:
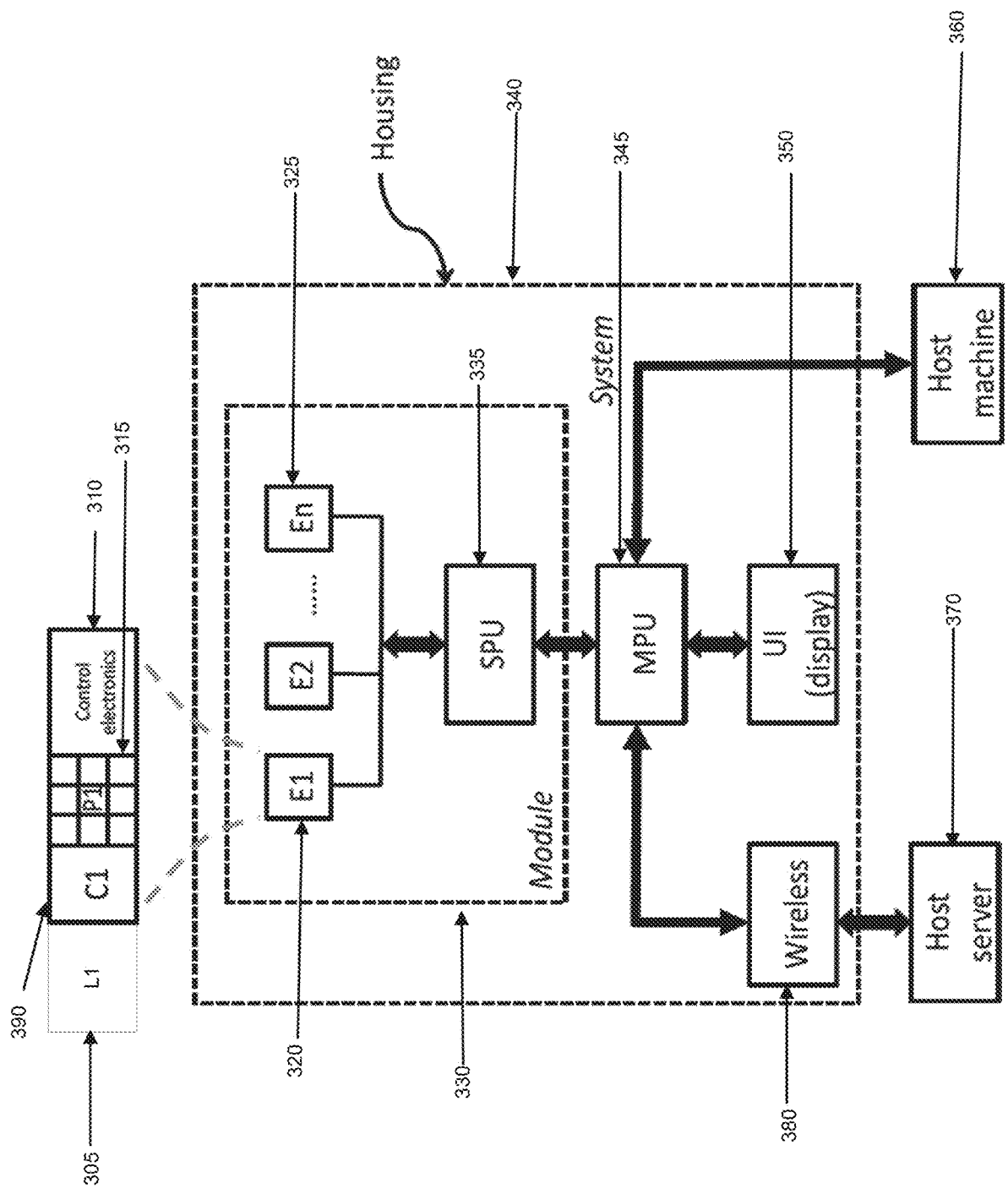
FIG. 3 is an exemplary block diagram of a subatomic particle detection system in accordance with one embodiment of the present invention.

FIG. 3 is an exemplary block diagram of a subatomic particle detection system in accordance with one embodiment of the present invention. The subatomic particle detection system can have a hierarchical architecture comprising elements and modules that are arranged in a configuration specific to the application. FIG. 3 illustrates a subatomic particle detection system comprising "N" number of elements, from element E1 320 to element En 325. These elements comprise the basic building blocks of the subatomic particle detection system. Each sensor module 330 within the subatomic particle detection system may comprise hundreds or even thousands of elements. Accordingly, the number of elements "N" may only be bounded by practical considerations.

As shown in FIG. 3, in one embodiment, each element may have a converter layer, C1 390, that interacts with incident subatomic particles. In one embodiment, converter layer, C1 390, can be a thin film material that can be applied directly to the sensor. The design of the subatomic particle detection system is tunable because different materials (referred to herein interchangeably as "converter materials" or "reactive materials") can be used to develop C1 390 so as to make the elements sensitive to different subatomic particles.

For example, in one embodiment, the subatomic particle detection system may be tuned for neutron detection by making C1 a layer of reactive neutron-capturing materials such as $^{157}$Gadolinium (also known as "native Gadolinium" which is a mixture of several isotopes including $^{157}$Gadolinium), $^{10}$Boron (also known as native Boron), $^{6}$Lithium (also known as native Lithium), etc. These converter layers may be in pure elemental form or in compound form or be a mixture of elements and compounds of neutron absorbing isotopes of elements in any combination. In a different embodiment, the subatomic particle detection system may be tuned for gamma-ray detection by developing C1 with a reactive material that interacts with gamma rays such as Cesium Iodide, Sodium Iodide, etc. In another embodiment, the subatomic particle detection system may be tuned for fast neutron detection by designing C1 with a layer of polyethylene, paraffin wax, any compound from the epoxy or silicone families, or other such hydrogenous material. In one embodiment, C1 can be designed to be placed in conjunction with a hydrogenous material as well.

In another embodiment, one or more groups of elements may be coated with different converter layers to make the subatomic particle detection system sensitive to multiple types of particles simultaneously. For example, in one application related to utilities, a utility company may need a single sensor that can simultaneously detect neutron, gamma, alpha and beta particles. Instead of using four different types of detectors to detect these particles separately, which was done in the past, embodiments of the present invention can have a single detector with four sensors, where each sensor detects one of the four types of particles. Alternatively, embodiments of the present invention, allow a single sensor to be partitioned in multiple ways, where each partition can detect a different type of particle because each partition may be coated with a different converter layer.

In one embodiment, C1 can be selected from the following: Xenon, Cadmium, Hafnium, Gadolinium, Cobalt, Samarium, Lithium, Titanium, Europium, Molybdenum, Ytterbium, Dysprosium, Erbium, and Boron in their native form, or isotope enriched form, as well as compounds from the foregoing list in their native or isotope enriched forms, such as but not limited to oxides, carbides, halides (e.g., iodides, chlorides, to name a few), etc. as well as combinations of the elements in a blend/alloy form or compounds of such combinations, such as Gadolinium Titanate, Boron Carbide, DiMolybdenum Pentaboride ($Mo_2B_5$) etc.

The converter layers may be deposited by vapor state, liquid state or plasma state deposition techniques. In one manifestation, the converter layer used can be a fullerene compound of lithium, C60AxLix, that is deposited from solution state using a combination of solvents such as chlorobenzene and dichlorobenzene. In another embodiment, modified Boron fullerenes can be deposited from the solution state. In one embodiment, converter layer can also be nanotube or graphene compound (made of any material comprising a molecule from the carbon based fullerene family such as $C_{60}$, $C_{70}$, $C_{84}$ etc.) chemically attached or bonded to a neutron absorbing element or compound. The carbon based fullerene molecule in this case can be chemically bonded to a neutron absorbing molecule, either inside (endohedral fullerenes) or outside the fullerene cage. The fullerene molecule may also be made with Boron, such as Boron Fullerene, in which case there is no need for a carbon based fullerene molecule.

In one embodiment, each element may also comprise a sensor array of pixels, P1 315. The pixels in the sensor array of pixels P1 315 converts particles, e.g., products of the interaction between the incident subatomic particles and C1 390 (the converter layer discussed above), to an electrical output that may be converted from analog to a digital signal through a combination of transistors and analog to digital converters at the pixel level or separately. In one embodiment, the sensor array responds to light or charge energy produced in the coating, which is then detected by the sensor pixels. These transistors and analog to digital converters may reside in a control electronics module 310, wherein each element comprises its own control electronics module 310. In one embodiment, sensor array P1 315 may be an off-the-shelf sensor. The sensor, for example, among other things, could be a memristor or an image sensor or a photon detector or a photovoltaic cell. The sensor could also be a type of sensor commonly used in conventional consumer electronic device digital cameras.

In one embodiment, the sensor array of pixels P1 315 is made from any material that can detect charged particles, some examples of which include semiconducting polymers, e.g., Poly(3-hexylthiphene), Poly[[9-(1-octylnonyl)-9H-carbazole-2,7-diyl]-2,5-thiophenediyl-2,1,3-benzothiadiazole-4,7-diyl]-2,5-thiophenediyl] also known as PCDTBT, etc., small organic semiconducting molecules, or inorganic semiconductors such as silicon, Cadmium Telluride, Cadmium Zinc Telluride, etc., or compound semiconductors such as Gallium Nitride, Gallium Indium Arsenide, or liquid state semiconducting materials, or any other material (solid, liquid or gas) that can sense (e.g., by detecting light or charge) products of interaction between C1 and incident subatomic particles, including neutrons.

In one embodiment, C1 390 may also comprise multiple layers of materials that interact with different subatomic particles, including neutrons of different energies or other subatomic particles like gamma rays, or it may be a composite of various materials, each of which interacts with a different subatomic particle, or it may be a combination of the two approaches.

Further, the presence of C1 390 does not preclude the possibility of incident subatomic particles, including neutrons, interacting directly with materials comprising the sensors. For example, in one embodiment, there may be instances where the materials forming the sensor pixel array are themselves sensitive to the incident subatomic particles, such as silicon is sensitive to gamma rays, muons, etc. or Boron used for p-type doping of silicon is sensitive to neutrons. Further, by way of example, a semiconductor such as silicon may be doped with high neutron capture cross section material such as 157Gd. Also, a semiconductor such as PCBM (fullerene derivative [6,6]-phenyl-C61-butyric acid methyl ester) may be modified chemically with neutron capture materials to render the molecules neutron-sensitive.

In one embodiment, the particle detection system may not include a converter layer C1 390 at all. Instead, converter material that would otherwise be used to create the C1 layer 390 is homogeneously intermixed with the sensor material used to create pixel array, P1 315. By way of example, compounds of neutron capturing material may be intermixed with sensor materials such as semiconducting polymers, e.g., P3HT, PCDTBT, etc., small organic semiconducting molecules, or inorganic semiconductors such as Silicon, CdTe, etc. or compound semiconductors such as Gallium Nitride, Gallium Indium Arsenide, or liquid state semiconducting materials. Further, P1 315 may comprise a pixilated or uniform sensory array (or monolithic sensor array) made from semiconducting materials or materials sensitive to the products of the interaction between incident subatomic particles and the reactive materials. Also it may comprise composite materials sensitive to subatomic particles and capable of generating a readable signal.

Dispersing the converter material within the sensor material, however, may require printing technology. Also, special processes would be required to intermix the converter material with the sensor. As discussed above, control electronics module 310 can be used for controlling the operation of the element and transmitting any analog or digital signal generated by the element to the remainder of the system.

In one embodiment, each of the elements E1 320 through En 325, may comprise a lensing apparatus L1 305 for focusing the particles towards the sensor with the intent of improving the instrument's sensitivity. For example, if the particle detection system is set up for detecting neutrons, the neutrons can be lensed using appropriate materials such as glass poly-capillary fibers made from lead-silica glass and used for focusing ultra-cold to fast neutrons. Alternatively, if the particle detection system is set up for detecting X-rays, the X-rays can be lensed using appropriate materials such as microstructured capillary arrays.

The array of elements E1 320 through En 325, in one embodiment, is connected, in serial or parallel configuration, to a slave processing unit 335 (referred to herein as "SPU"). In one embodiment, the slave processing unit 335 can comprise a Field Programmable Gate Array ("FPGA"), a Complex Programmable Logic Device ("CPLD"), a microcontroller, etc. The slave processing unit may also be placed within the elements (internalized) labeled E1 to En thereby minimizing or altogether obviating the need for an external slave processing unit 335. The elements in conjunction with the SPU form a "sensor module" 330.

One or more sensor modules 330 may be placed in a configuration that is optimized to maximize system performance. For example, multiple sensor modules 330 could be configured to operate in parallel so as to increase the sensitivity of the device. Because each of the elements may only be modestly sensitive in detecting incident particles, the overall sensitivity to the particles being detected can be increased by stacking more than one sensor module 330 in parallel.

Each element may be only modestly sensitive in detecting incident particles, but when several of these elements are aggregated in an appropriate architecture, these components act in a concerted fashion to result in a highly sensitive, agile and reliable particle detection instrument. The aggregation of sensors operating in parallel results in higher sensitivity to the particles and resultant imaging as compared to individual elements or an individual module. In one embodiment, the multiple sensor modules can be loaded onto and operate in parallel on a common printed circuit board. In a further embodiment, multiple printed circuit boards, each with at least one sensor module, can be configured to operate and detect particles in parallel to further increase the sensitivity and fidelity of the platform. In one embodiment the multiple sensor modules can all be configured to detect neutrons making the device highly sensitized to neutrons and, accordingly, a highly reliable neutron detection instrument.

Each of the modules can be comprised of multiple elements. In one embodiment, the elements, E1 320 to En 325, can be made as large or small as needed in order, for example, to embed them in confined geometries such as inside the human body for medical applications such as single-photon emission computed tomography ("SPECT"), positron emission tomography ("PET"), etc.

In one embodiment, a subset of the elements E1 320 to En 325 can be configured to detect different particles from the remaining elements by coating them with a different C1 converter layer from the other elements. Accordingly, a single sensor module 330 can be used to detect more than one type of subatomic particle.

Each sensor module 330 is connected to, either wirelessly or through wires, to a system level master processing unit 345 (referred to herein as "MPU") that controls the operation of the SPU 335 on the module and processes the data it receives from the SPU 335. In one embodiment, the SPU 335 in one of the modules may also be able to serve as the MPU 345. An MPU 345, in one embodiment, may be connected to several sensor modules 330, wherein each sensor module 330 is configured to be sensitive to and detect a different subatomic particle. Alternatively, an MPU 345 may be connected to several stacked sensor modules 330 acting in concert to detect the same particle, e.g., neutrons.

In one embodiment, the MPU 345 may be part of a computing system similar to computing system 110 from FIG. 1 described above in detail. Further, the MPU 345 may also comprise a system memory 116 and storage memory 132 and 133 for storing data received from the various sensor modules 330 similar to computing system 110 in FIG. 1. The MPU 345 may send processed data to the display 350 that has a user interface (UI) that can be used to program the entire system. The display 350 may perform a similar function to display device 124 discussed above in relation to FIG. 1.

Further, the data from the MPU 345 may also be relayed wirelessly through wireless module 380 to a host server 370, wherein the host server may perform a similar function to servers 240 and 245 described in relation to FIG. 2. Each of the client devices 210, 220 and 230 in FIG. 2, in fact, may be a discrete computing system comprising a MPU, connected to its own set of SPUs, and reporting the results of a particle detection operation to a host server 240 or 245 through network 250. For example, client devices 210, 220 and 230 may be security devices installed at an airport to screen passengers' baggage for explosive devices. Each of the client devices could then, in turn, report the results of the screening to a centrally located server 240 or 245. The results from all the various screening operations could also be stored in storage devices 260(1)-(L), storage devices 270(1)-(N), storage devices 290(1)-(M), or intelligent storage array 295. In another embodiment, MPU 345 may relay data to host server 370 through a wired connection (not shown) instead of through wireless module 380.

In one embodiment, the data from the various SPUs could simply flow through an MPU and be transmitted to a host machine 360. The host machine, in one embodiment, could be a personal computer or a tablet PC or even a smart phone that may be a computing system similar to computing system 110 from FIG. 1 described above in detail. The host machine in such an embodiment would be connected to the MPU 345 through a communication interface similar to interface 122 described in detail above.

In this embodiment, the host machine 360 would be responsible for processing the data received from the various SPUs instead of the MPU. The MPU would, however, be responsible for controlling the operation of the various SPUs connected to it. The host machine would therefore perform a similar function to computing system 110. The display 350 may then be connected to the host machine 360, wherein a user of the system could program the system using the display connected to the host machine. Alternatively, in one embodiment, the MPU 345 may reside on host machine 360 instead of within the housing 340 of the particle detection system and control the various SPUs from within the host machine 360.

In one embodiment, the particle detection system of FIG. 3 is encapsulated for protection from the element such as temperature, humidity, dust, etc., by placing it inside a housing 340 made from materials such as plastic, metal, etc. The housing 340, in one embodiment, may be designed to restrict the entry of certain subatomic particles, such as photons in the visible range, ultraviolet range, or more energetic photons such as X-rays or gamma rays, etc. For certain applications, such as neutron detection, for example, the housing 340 may contain materials such as high-density polyethylene ("HDPE") that moderate the incident neutron velocity. The design of the housing 340 and the materials used to construct it will vary depending on the application for the particle detection system. For example, if the detector is being used for oil and gas exploration within oceanic waters, the housing 340 will need to be constructed with materials able to withstand extremely high subterraneous temperature and pressure.

Figure 4:
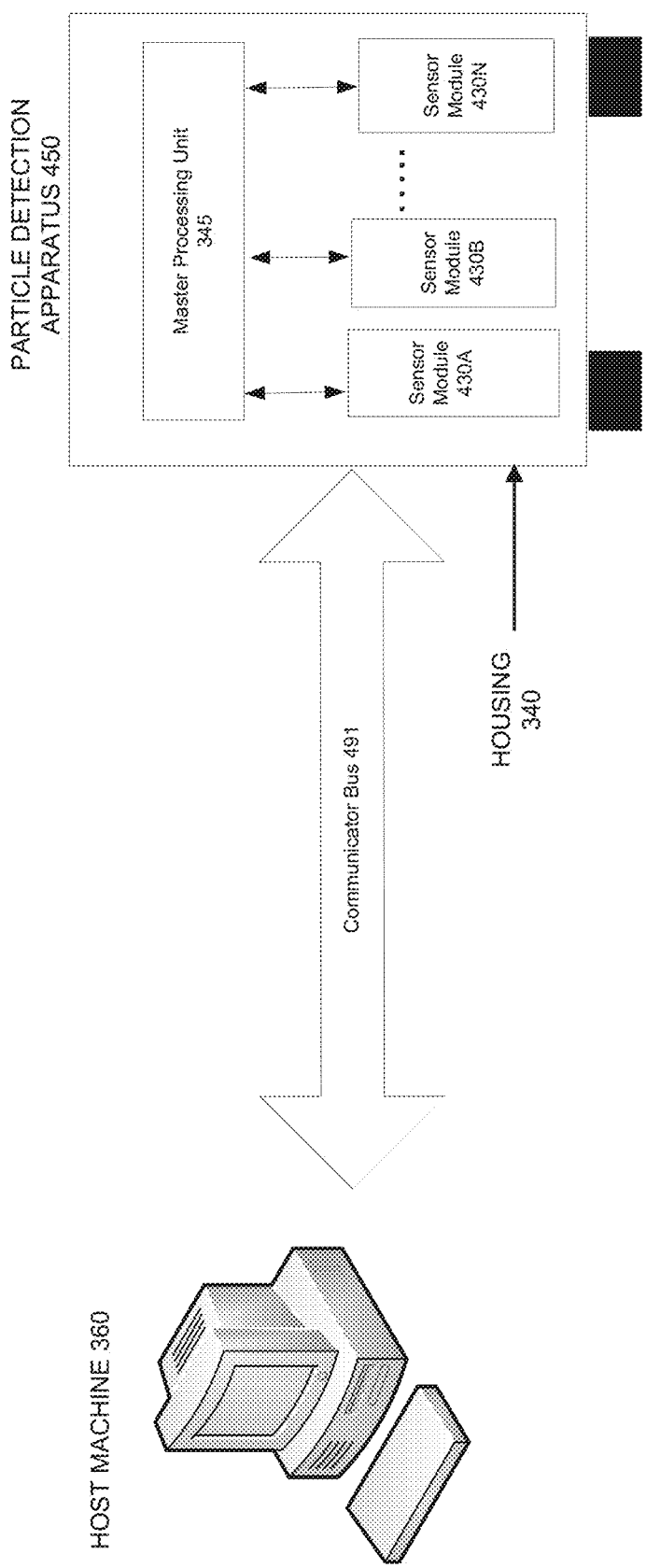
FIG. 4 is a schematic block diagram illustrating a typical hardware configuration for connecting the host machine with the sensor modules in accordance with one embodiment of the present invention.

FIG. 4 is a schematic block diagram illustrating a typical hardware configuration for connecting the host machine with the sensor modules. The embodiment illustrated in FIG. 4 is one wherein the display 350 and UI are connected to or implemented within host machine 360 as described above. The host machine 360 is responsible for processing the data it receives from MPU 345 over communicator bus 491. MPU 345 is responsible for controlling the operation of the various SPUs on sensor modules 430A-430N. Sensor modules 430A-430N perform essentially the same function as sensor module 330 from FIG. 3. Each of the sensor modules 430A-430N shown in FIG. 4 may be configured to detect a different subatomic particle. Alternatively, as discussed above, the sensor modules 430A-430N may be stacked and operating in parallel to reliably detect the same particle, e.g., neutrons. By using a plurality of sensor modules acting in concert, the sensitivity and reliability of the system can be vastly improved.

The sensor modules 430A-430N constitute a module array that can plug directly into board sockets within the particle detection chassis 450. The MPU 345 may be populated on the same board that comprises the sockets for plugging in sensor modules 430A-430N, or one of the SPU's in 430A to 430N may be programmed to serve the function of MPU 345, thereby eliminating the need for a separate MPU 345. Because they plug into board sockets, the sensor modules can be easily inserted and removed from apparatus 450. Further, the placement of the sensor modules 430A-430N can be determined based on the type of particle each sensor module is configured to detect and how sensitive to the particle the user needs the system to be.

Host machine 360 uses communication interface 122, as illustrated in FIG. 1, to communicate with the particle detection apparatus 450 encapsulated within housing 340 over communicator bus 491. The communicator bus 491 provides a high-speed electronic communication channel between the host machine 360 and the particle detection apparatus 450. The communicator bus can also be referred to as a backplane, a module connection enabler, or system bus. Physically, communicator bus 491 is a fast, high-bandwidth duplex connection bus that can be electrical, optical, etc.

Particle detection apparatus 450 can, in one embodiment, also be used in a standalone mode, such as a handheld instrument, backpack instrument etc. In this embodiment, the housing of the apparatus 450 would comprise MPU 345, the display 350, a wireless module 380, and one or more sensor modules 330, so that the user could freely use the particle detector without needing to physically connect to a host machine. The particle detection apparatus 450 can, in another embodiment, be also connected through a wired (such as Ethernet or USB) or wireless (Bluetooth, Wi-Fi) to a computing device such as tablet PC or smart phone. In this embodiment, there will be no need for a display 350 on the detection apparatus. As discussed above, MPU 345 could be part of a computing system similar to computing system 110 illustrated in FIG. 1 with an associated memory and display. Such a system, along with its modules, could serve as a component in an assembly of systems that would be placed at desired locations arbitrarily far from each other to act as agents for detecting subatomic particles over large geographic regions, on land, underground, on water, underwater, or any other location including space. Data gathered from the various agents may be relayed to a central host machine 370 and analyzed to prepare maps of incident particles across any geographic region.

In one embodiment, the module 330 can be programmed to determine the rate of subatomic particles incident on it. Alternatively, the MPU can be programmed to collect information from the SPUs connected to it and determine the rate of various subatomic particles incident on the entire apparatus 450. In another embodiment, particle detection apparatus 450 can be configured to establish the direction of incident particles by placing the modules 430A-430N within it in an appropriate geometric configuration, e.g., around a sphere, or in a stacked parallel configuration. For example, the direction of neutrons can be determined by using a neutron absorbing collimator or neutron absorbing grid of apertures in front of the detector apparatus that will block all neutrons incident on them and will only allow the passage of incident neutrons (that align with and pass) through windows in the grid or collimator.

In yet another embodiment, appropriate design of material used to develop sensor pixel P1 315, such as fully depleted deep CMOS or CCD sensors made from inorganic or organic semiconductors, will allow the system to determine the energy of incident subatomic particles including neutrons and thereby enable spectroscopy.

Further, in one embodiment, the entire system, or each module in the system, or even each element in the system can be tuned to be sensitive to different subatomic particles. For example, module 430A can be configured to be more sensitive to gamma rays while module 430B can be configured to be more sensitive to neutrons. Conversely, the modules can also be configured, in one embodiment, to be insensitive to certain subatomic particles. One method to make the modules insensitive to certain subatomic particles is to coat the converter layer C1 with appropriate blocking layers that reduce sensitivity to certain particles. This chemical tenability is an advantageous feature of the present invention because it gives a user the unique flexibility to configure a system to be sensitive to a select subset of subatomic particles of interest while being insensitive to other particles that the user may not be interested in tracking.

Figure 5A:
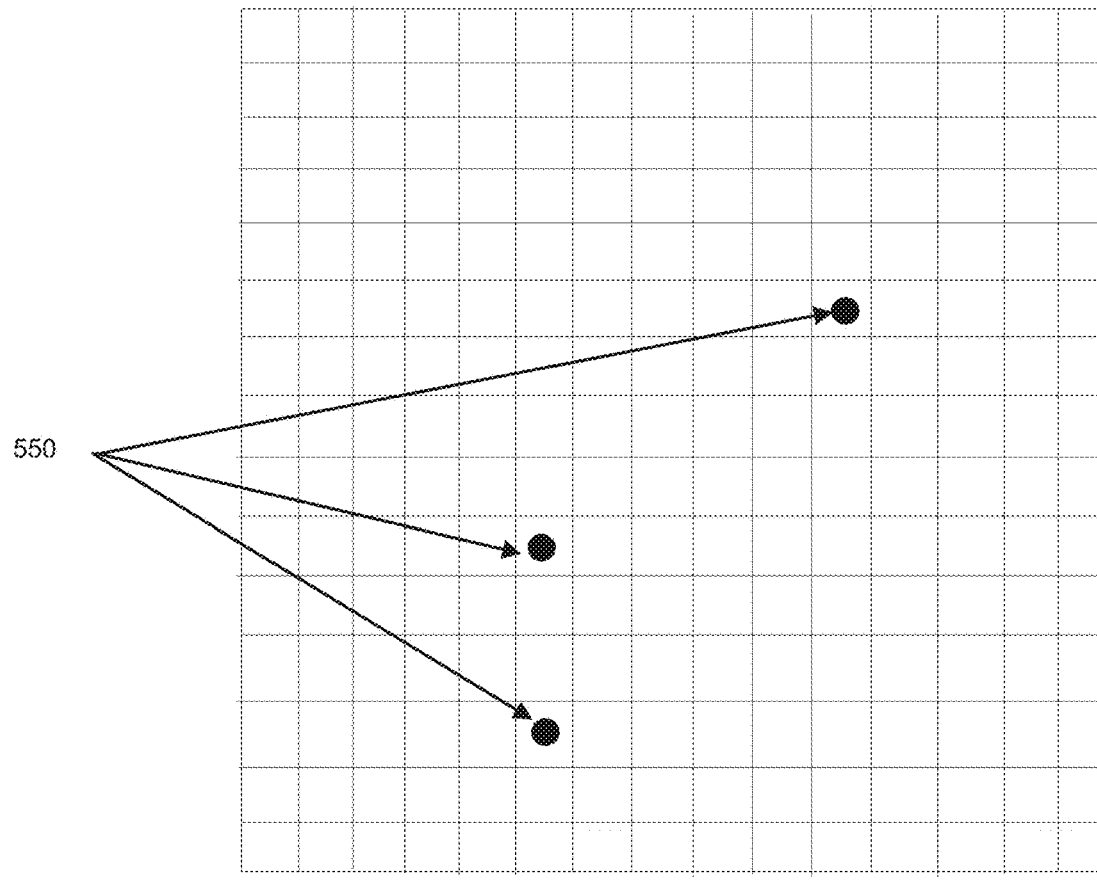
FIG. 5A is an exemplary block diagram of a sensor array of pixels in accordance with one embodiment of the present invention.

In one embodiment, choosing elements E1 320-En 325 that are highly pixelated can significantly increase the granularity of the particle detection device. For example, the more pixels an element can comprise, the easier it is for the system to detect the location and direction a particular particle came from. It also makes it easier to detect the particle's energy. FIG. 5A is an exemplary block diagram of a sensor array of pixels in accordance with one embodiment of the present invention. As seen in FIG. 5A, the higher the number of pixels on pixel array P1 315, the more granular it is and the easier it is to precisely detect the position of particles 550.

Figure 5B:
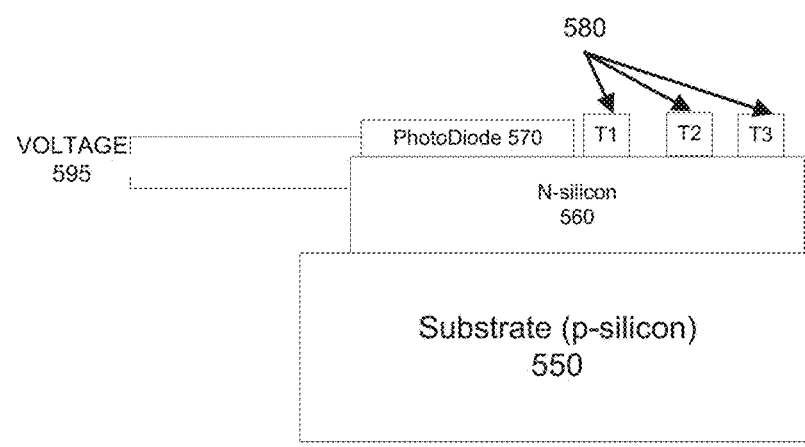
FIG. 5B is an exemplary block diagram illustrating the cross-sectional view for each pixel in accordance with one embodiment of the present invention.

FIG. 5B is an exemplary block diagram illustrating the cross-sectional view for each pixel on the sensor array of pixels in accordance with one embodiment of the present invention. As discussed above, the sensor may be an off-the-shelf component typically found in a conventional digital camera. The electronics for the pixel may be mounted on silicon substrate, comprised of p-silicon 550 and n-silicon 560. The area of the pixel that collects information regarding incident particles, e.g., photons is photo-diode 570. The pixel may also comprise three transistors 580, T1, T2 and T3, that are used to collect the information captured by the photodiode. For example, if subatomic particles or products of the reaction between the incident subatomic particle and the converter layer (390 in FIG. 3) impinge upon photo-diode 570, voltage (or current) 595 is induced through a combination of distortion and ionization of the electron field within the photodiode as well as the photoelectric effect. The energy of individual incident subatomic particles or products of the reaction between a single incident subatomic particle and the converter layer (390 in FIG. 3) impinging on photo-diode 570 dictates how much charge accumulates within the pixels. If several particles become incident during the time when the sensor is in an exposed state, a proportionately larger number of islands of pixels will accumulate charge. The transistors are used to collect information regarding the accumulated charge during a capture cycle and convey this information to an A/D converter within control electronics module 310. Each pixel may report an A/D converted value of between 0 and 1024 based on the intensity of impingement on the pixel.

In certain embodiments, C1 390 may be reactive to more than one type of subatomic particle. For example, materials that react with neutrons may also react with high energy gamma rays. In another example, the converter materials may interact only with neutrons but the sensor materials may interact with a host of other sub-atomic particles including gamma photons, alpha particles, fast electrons etc. In these embodiments, a discrimination process may be run on MPU 345 that is used to discriminate between the different types of particles while minimizing any false positives. Each subatomic particle may be unique with respect to the intensity values they generate or the pattern in which they impinge on the pixels of pixel array P1 315. The discrimination procedure comprises information regarding all the particles' unique "signatures" and uses these to differentiate between particles to ensure that false positives are not generated.

For example, incident neutrons particles interact with the material in C1 or the material of the sensor pixels and produce one type of electric signal and gamma rays produce another type of signal or pattern of islands of pixels in which charge is generated beyond the thermally generated charges. Hence, discriminating between neutrons and non-neutrons becomes much faster and simpler than in proportional tubes or scintillator detection systems that must collect a significant amount of statistical information in order to implement the pulse shape discrimination algorithms for particle discrimination. The proposed system is capable of detecting single neutrons and being able to distinguish them from single non-neutron particles, such as gamma photons.

This ability to discriminate between single neutron and non-neutron particles is enabled by unique digital signatures for each type of particle. The term digital signature here refers to patterns of islands of pixels where charge gets deposited by the incident particles or products of the interaction between the incident particles and the converter layer C1. Therefore, not only can a neutron be distinguished from other non-neutron particles, but also the non-neutron particles can be further distinguished as gamma photons, x-ray photons, alpha particles, fast electrons etc. Furthermore, every radioactive material (or radionuclide) emits a unique family of sub-atomic particles. For example, highly enriched uranium emits neutrons and gamma photons. Since at least some or all of these subatomic particles are detected and discriminated in the proposed system with the help of its discriminating procedure, the source (radionuclide/isotope, etc.) of these particles can be identified by referring to a library of digital signatures or patterns in the system's memory or a memory external to the system.

One application of the novel discrimination procedure of the present invention is in the oil and gas exploration industry. A drill used for oil exploration, for example, could comprise both a source of neutrons and the particle detection system of the present invention. Further, the drill can comprise a source of gamma radiation as well. Both gamma and neutron data collected with the help of the novel discrimination procedure provide vital information regarding the porosity and lithology of rock formations.

Another application of the novel discrimination procedure would be in the homeland security industry. For example, airport security scanners may employ the particle detection system of the present invention to detect SNMs. However, because certain individuals carry radioactivity in their body, they may radiate high energy gamma rays that would result in a false alarm being generated by the scanner if not for the particle discrimination procedure of the present invention. As discussed above, certain materials chosen for C1 may react with both neutrons and high energy gamma rays. Using the unique "digital" signature for the neutrons, gamma rays, and other particles, the discrimination procedure of the present invention prevents the generation of false positives. The unique digital signatures also enable identification and counting of gamma photons, as well as the identification of the source from which the neutrons and other particles originated. One example of this capability is that the discrimination procedure can distinguish between a weapons grade Plutonium source and a non-neutron (and dominantly gamma emitting) source such as $^{137}$Cs or $^{60}$Co or $^{133}$Ba.

Figure 6A:
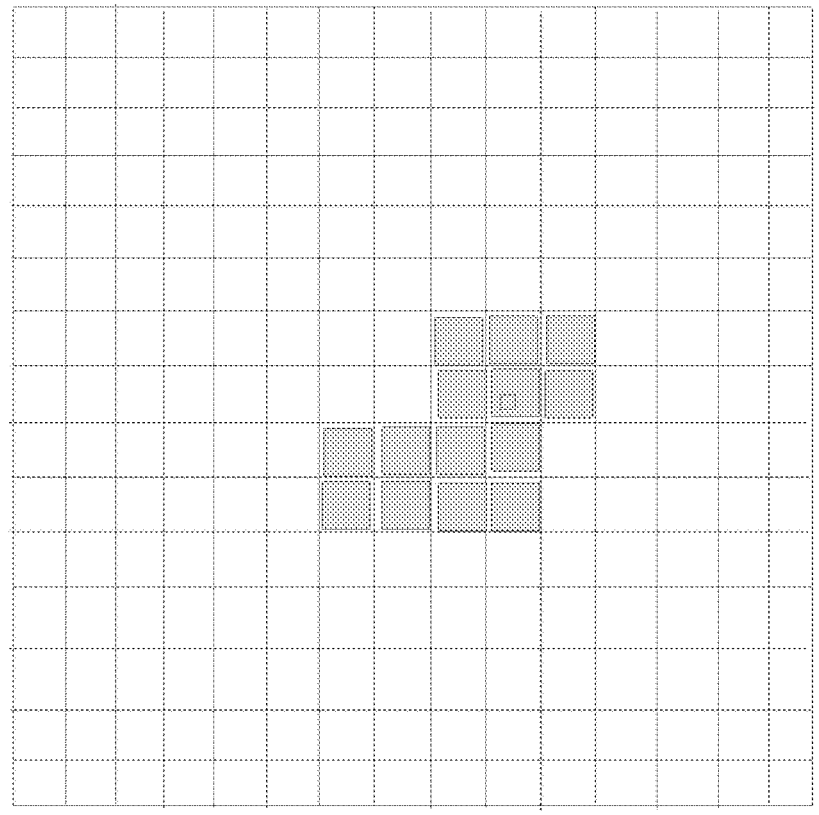
FIGS. 6A and 6B illustrate two exemplary patterns created by two different types of subatomic particles and as detected by a pixel array of sensors in accordance with one embodiment of the invention.
Figure 6B:
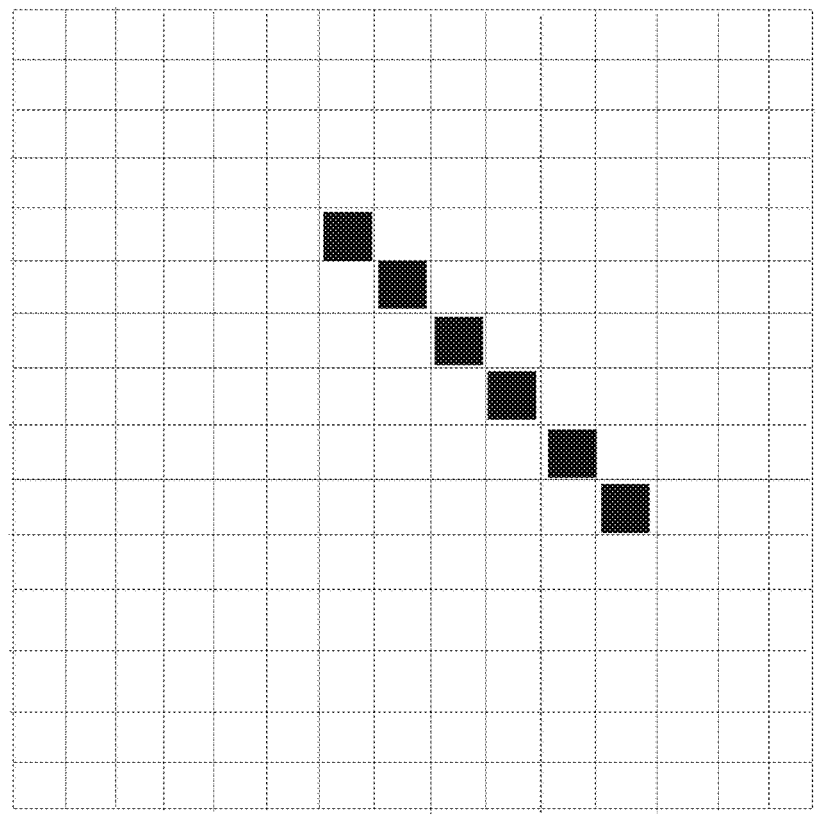

FIGS. 6A and 6B illustrate two exemplary patterns created by two different types of subatomic particles and as detected by a pixel array of sensors in accordance with one embodiment of the invention. FIG. 6A illustrates a pattern created by hypothetical Particle A, while FIG. 6B illustrates a pattern created by hypothetical Particle B. If both Particle A and Particle B are detected by the same sensor P1 315 because converter layer C1 390 reacts with both types of particles, or the converter layer C1 390 interacts with Particle A and the sensor material interacts with Particle B, then a discrimination procedure is required to be able to tell the particles apart so as not to generate false positives. The discrimination procedure will be programmed to recognize that Particle A will create a pattern of islands of pixels of intensity statistically different from Particle B, and further that the pattern will comprise of pixels that are clumped together as opposed to the diagonal or other types of pattern generated by Particle B. Accordingly, the discrimination procedure can use the respective signatures of Particle A and Particle B to distinguish between each other.

The discrimination procedure can, in one embodiment, compare a pattern created by a particle to a library patterns stored in memory 116 of host machine 360 to identify which of the patterns in memory the particle most closely resembles in order to identify the particle.

It is important to note that in one embodiment of the present invention the signature patterns of various different particles can be identified at the same time. For example, the discrimination procedure would be configured to identify both Particle A and Particle B at the same time in the example illustrated in FIGS. 6A and 6B. Further, if other particles were detected in the system, those particles could be identified using their digital signatures at the same time as well.

Figure 9:
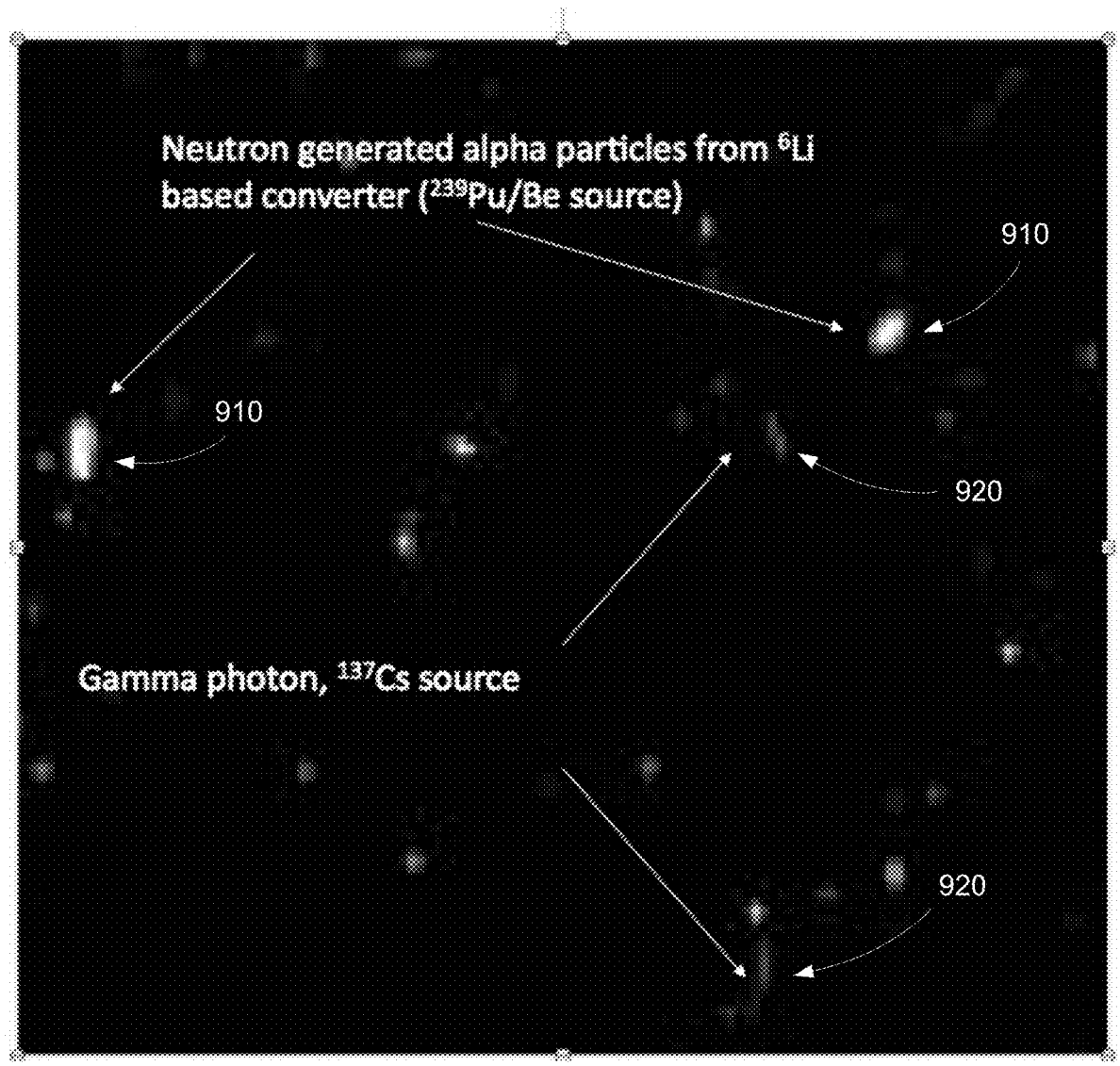
FIG. 9 illustrates exemplary signatures for neutron and gamma particles used to distinguish between the two particles in accordance with one embodiment of the present invention.

FIG. 9 illustrates exemplary signatures for neutron and gamma particles used to distinguish between the two particles in accordance with one embodiment of the present invention. The discrimination procedure discussed above can be configured to detect pattern 910 associated with neutron generated alpha particles and distinguish pattern 910 from pattern 920 associated with gamma photons. Thus, discrimination procedure can identify both neutrons and gamma photons and distinguish them from each other.

In one embodiment, the digital signature can be generated using several stacked sensor modules, e.g., 430A-430N in FIG. 4. In this embodiment, the generated digital signature can be a vector in three dimensional space. The discrimination procedure uses information, e.g., coordinates of sensors, intensity of impingement based on the A/D read-out from the pixels, time of impingement etc. to determine a pattern of impingement in three dimensional space and compares the pattern to the digital signatures stored in memory and performs a statistical match in order to determine the identity of the particle. Performing digital signature comparison in three dimensional space allows for increased reliability in the system. For example, certain particles with higher energy may leave a pattern of higher intensity on the surface modules as opposed to modules deeper within the stack. Or, for example, particles such as neutrons and gamma photons with higher momentum may leave a pattern of higher intensity on modules deeper within the stack but only a trail of lower intensity on the surface modules. Thus, analyzing the intensity of the reaction of the particles with the sensors at different layers of the module stack allows for increased fidelity and accuracy.

Furthermore, in one embodiment of the present invention the noise generated and accumulated within the pixels due to thermal or any other reason, and especially during the time interval of exposure, can be eliminated. The methods for reducing or completely eliminating such noise may include: (a) timely resetting of individual pixels or aggregates of pixels or entire rows and columns of pixels within the pixels; (b) optimization of exposure, readout and reset time cycles so that pixels are reset as often as is required; (c) changing the temperature of operation of the sensors, such as cooling them down.

In one embodiment, the discrimination procedure may use patterns created by charge building up in the pixels of the underlying sensor. For example, the neutrons may interact with the converter layer and undergo a nuclear reaction. For example, if the converter material contains $^{157}$Gadolinium, the reaction will be $^{157}Gd+n=^{158}Gd^*=>^{158}Gd+gamma+x-rays+IC\ e-+ACK\ e-$. In one embodiment, the products of this reaction will enter the sensor and create a build up of charge in the pixel that they interact with first. The high energy of these reaction products will cause secondary ionization within the pixel that will lead to enhanced charge build-up within the pixel. Furthermore, the high kinetic energy of these reaction products will also cause them to scatter on to neighboring pixels and a track of built-up charges will be left within the sensor. The discrimination procedure within the instrument examines these tracks and determines the form of the particle. Hence, if the discrimination procedure in the processing unit of the instrument (or module) determines that a gamma-ray and/or an x-ray and/or an IC electron and/or an ACK electron were found in the sensor, it will be concluded that a neutron interacted with the converter layer and the neutron count tracked by the MPU is incremented by one.

Similarly, by way of another example, if the converter layer contains $^{10}$Boron and the incident neutron interacts with $^{10}$Boron, the following reaction will follow: $^{10}B+n\rightarrow\ ^{7}Li+Alpha$. These reaction products will travel in nearly mutually opposite direction and one of them will interact with the sensor, thereby leaving a unique build-up of charge. For instance, alpha particles have a very high rate of loss of energy within semiconductors and solids in general. Consequently, the build-up of charge in pixels is found to be uniquely concentrated to a few pixels only. The discrimination procedure within the processing unit is able to interpret the "signature" of alpha particles (or $^{7}$Li) uniquely and discriminate this signature against any other radiation that might be incident on the instrument, such as gamma rays. As a result, the instrument is able to discriminate neutrons from any other sub-atomic particle.

The present invention is highly scalable because not only does it use relatively cost effective off-the-shelf components that may be chemically tuned using appropriate converter layers or converter materials blended with sensor materials, but also users have the ability to incorporate as many sensor modules within an apparatus as needed. Further, because the parts of the present invention are readily available and low cost, they are relatively easy to replace. Accordingly, if a sensor module gets damaged, it will typically be less troublesome to replace it than to fix it.

Further, another advantage of the present invention is that the housing 340 of the particle detection system is flexible and can be configured in ways specifically customized for several different applications. For example, the housing may be chosen in a way so that the pixel arrays can be stacked or tiled side by side along a wall of a cargo container, and used to detect radiation in containers being shipped. In particular, for example, in the case of neutron detection, there is great flexibility in how the pixel arrays are arranged because, with some very limited exceptions, neutrons can penetrate most matter until they make contact with a material that they interact with. Also, as discussed above, particle detection apparatus 450 can be configured to establish the direction of incident particles by placing the modules 430A-430N within it in an appropriate geometric configuration, such as around a sphere. In this case, the housing 340 would be spherical. Alternatively, in other embodiments, the system can be designed to fit in a hand held device or a backpack device.

In yet other embodiments, the modules 330 and any other printed circuit boards ("PCBs") within the housing 340 may be constructed using flexible materials, so that the system can be imbedded in clothing and other areas where using rigid materials would not be pragmatic. Further, using flexible materials allows the surface area of the detector to increase, thereby, increasing the sensitivity of the system. This advantageously allows the present invention to be utilized for various different applications using the same system design.

In one embodiment, the MPU 345 processes the data from the various SPUs it is connected to and performs all the calculations necessary to determine if a particular particle has been detected. The MPU 345 can use the information from the pixel arrays of the elements E1 320 through En 325 to determine precisely the coordinates of the pixels that tested positive for the particle. The MPU 345 may create a vector of information for each pixel comprising the coordinate of the pixel and the element and sensor module it is located within.

Figure 7:
FIG. 7 illustrates an exemplary information vector created for each pixel by the MPU in accordance with one embodiment of the present invention.

FIG. 7 illustrates an exemplary information vector created for each pixel by the MPU in accordance with one embodiment of the present invention. The information vector 700 may comprise information in discrete fields regarding the pixel number or (x,y) coordinate 710, information regarding the element or sensor number 720, and information regarding module number 730 on which pixel 710 and element 720 reside. Also, the vector may comprise information regarding the intensity value 740 read out from the pixel and a timestamp 750. This vector of information can either be stored in memory for further analysis or passed on to display 350 for a user to visually analyze the data or passed along to a computing device (such as a tablet PC or smart phone) attached to the detector box through a wired or wireless connection. Alternatively, the information may be relayed to a remote location through wireless module 380. The MPU 345 may also compare the vectors received from a pixel array to the various signatures of different subatomic particles stored in memory to determine or confirm the identity of the particle.

Further, the MPU 345 can be programmed to flag an alarm for the user of the system if more than a critical threshold number of particles are detected over a certain period of time and over a certain area. For example, in one embodiment, when the detection instrument is rendered as a handheld instrument homeland security applications, the MPU 345 may be programmed to flag an alarm on the display 350 if more neutrons are detected per unit volume of the instrument than the background.

Figure 8:
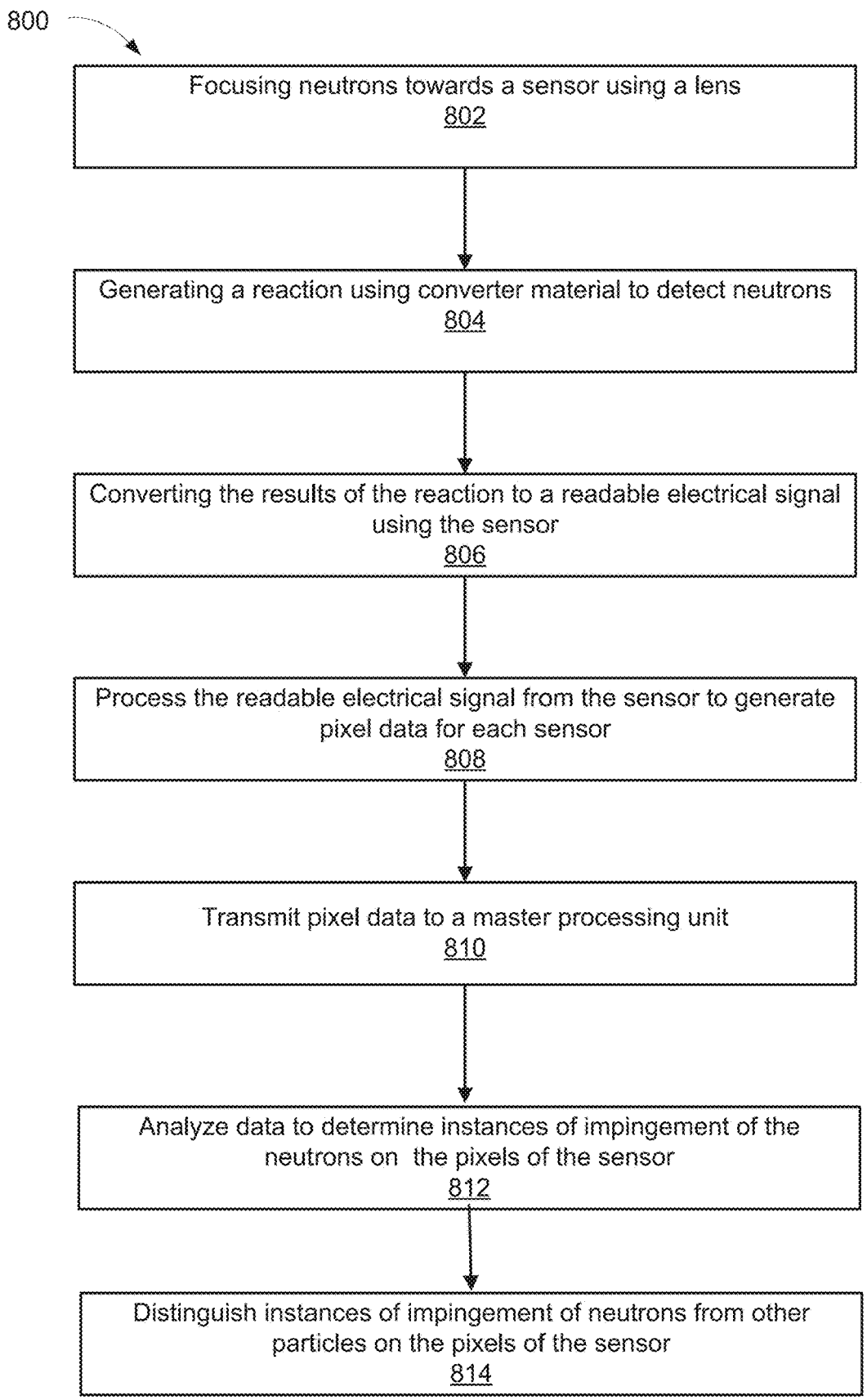
FIG. 8 depicts a flowchart of an exemplary computer implemented process of detecting subatomic particles, according to an embodiment of the present invention.

FIG. 8 depicts a flowchart 800 of an exemplary computer controlled process of detecting subatomic particles, according to an embodiment of the present invention. The invention, however, is not limited to the description provided by flowchart 800. Rather, it will be apparent to persons skilled in the relevant art(s) from the teachings provided herein that other functional flows are within the scope and spirit of the present invention. Flowchart 800 will be described with continued reference to exemplary embodiments described above, though the method is not limited to those embodiments.

At step 802, neutrons, or other subatomic particles, may be lensed towards a sensor E1 320 by using a lensing apparatus L1 305. Focusing the neutrons towards the sensor improves the instrument's sensitivity as discussed above.

At step 804, a reaction is generated when the neutrons, or other subatomic particles, come into contact with converter layer, C1 390. The converter layer can interact with the incident neutrons to generate a reaction, the results of which are then converted by a sensor array of pixels, P1 315, to a readable electrical signal at step 806 using control electronics module 310. As discussed above, in one embodiment, converter layer C1 may comprise multiple layers of materials that interact with different subatomic particles, including neutrons, or it may be a composite of materials, each of which interact with a different subatomic particle. Further, in one embodiment, instead of being a discrete layer, the C1 layer may be intermixed with the sensory array P1 315 itself.

At step 808, SPU 335 processes the signal from the various elements, E1 320 to En 325, to generate pixel data for each sensor. While each element E1 320 to En 325 individually may have modest sensitivity for detecting the incident subatomic particles, the elements in aggregate result in a highly sensitive level of detection.

At step 810, the pixel data is transmitted to MPU 345. The MPU 345 controls the various SPUs connected to it, collects the data from the SPUs, and analyzes the data at step 812 to determine the impingement of any neutrons on the pixels of sensor 315. At step 814, the MPU 345 runs the discrimination procedure used to discriminate between the different types of particles without generating any false positives. For example, the MPU 345 may be programmed to discriminate neutrons from other particles such as high energy gamma rays may be coincident with the neutrons.

Physical Structure for the Tunable Sensor

Figure 10:
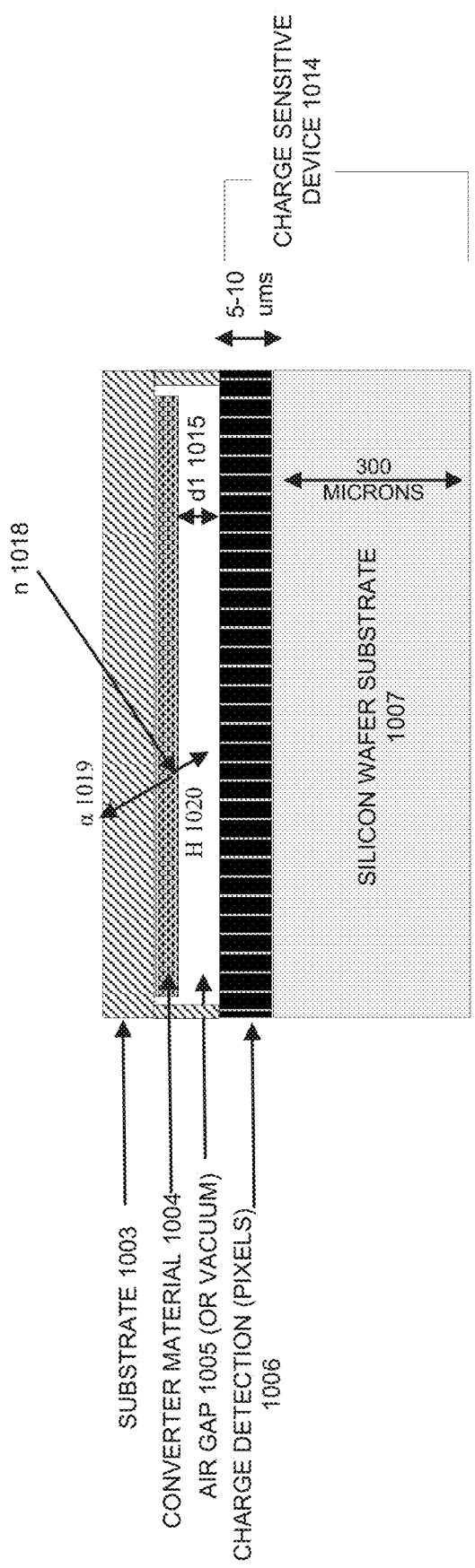
FIG. 10 illustrates the physical architecture of a sensor in accordance with an embodiment of the present invention.

FIG. 10 illustrates the physical architecture of a sensor in accordance with an embodiment of the present invention. FIG. 10 illustrates a cross-sectional view of a typical sensor module 330 (discussed in connection with FIG. 3). The sensor illustrated in FIG. 10 can either be a CMOS sensor or any charge detection device, e.g., a pin diode.

As discussed previously, neutrons are particles with no detectable amount of charge. In order to detect them, a sensor must interact with them in a manner that generates a detectable signal. For most neutron detectors, this signal tends to be charge. Hence, neutron detectors are almost always neutron-induced charged particle detectors.

Further, as mentioned above, historically, detectors for neutrons have been largely analog sensors comprising a gas filled tube with a neutron sensitive coating on its inner walls, or some type of scintillator material that generates photons when neutrons interact with it. These photons are then detected by an underlying sensor typically after photo-multiplication.

Embodiments of the present invention are considered solid state neutron detectors that do not rely on scintillation principles and, therefore, operate differently. Embodiments of the present invention instead rely on converter-on-semiconductor technology. Converter-on-semiconductor technology utilizes a neutron reactive layer that (1) absorbs the neutrons, (2) causes a nuclear reaction to produce ionizing reaction products where (3) the ionizing reaction products create paths of ionized electrons and holes through the semiconductor that (4) are extracted and measured by an applied voltage between an anode and a cathode. Embodiments of the present invention are superior to prior art methods of detecting neutrons because semiconductors are very conductive and, therefore, the sensors can operate at a lower applied voltage, e.g., 5V-25V. Further, the neutron reactive material is denser, allowing for more efficient capture of ionizing radiation. Hence, the detector can be made much thinner without sacrificing detection efficiency.

In embodiments of the present invention, for example, a neutron sensitive layer 1004 that serves as a trap for neutrons is placed in close proximity to a charge sensitive device 1006. It should be noted that while the discussion herein is focused towards neutrons, as explained above, embodiments of the present invention can be used to detect other types of particles, e.g., by changing the converter material. Neutrons interacting with this layer 1004 produce charged particles such as alpha particles and triton particles that, depending on their energy, have a certain spatial range they can travel before they lose all their energy. The rate at which they lose energy in a medium, also called –dE/dx, is highly nonlinear in that these particles lose energy at a higher rate with respect to distance as they slow down and become less energetic.

As shown in FIG. 10, a typical sensor for detecting particles, e.g., neutron, gamma, alpha, beta, etc. will comprise a thin film of neutron converting layer 1004 and an underlying charge sensitive semiconductor device 1014. The charge sensitive device 1014 which, as discussed above, typically comprises a semiconductor based CMOS device (such as a silicon CMOS sensor, bulk hetero junction polymer diode, or organic semi-conductor-based CMOS sensor), PIN diode, or a photovoltaic device. The pixels 1006 that detect charge on the charge sensitive device 1014 are typically mounted on a silicon wafer substrate 1007. In other words, the charge detection layer 1006 comprises multiple sensing elements or pixels that are mounted on a substrate 1007. In one embodiment, the charge detection layer is between 5 and 300 microns in width. As discussed in connection with FIG. 3, each sensing elements E1 320 to En 325 comprises a pixel. In one embodiment, there is an air gap 1005, e.g., 10-200 um, between the converter material 1004 and the charge detection layer 1006 as seen in FIG. 10. In one embodiment, the gap 1005 may also be a vacuum (and not necessarily filled with air).

Figure 13:
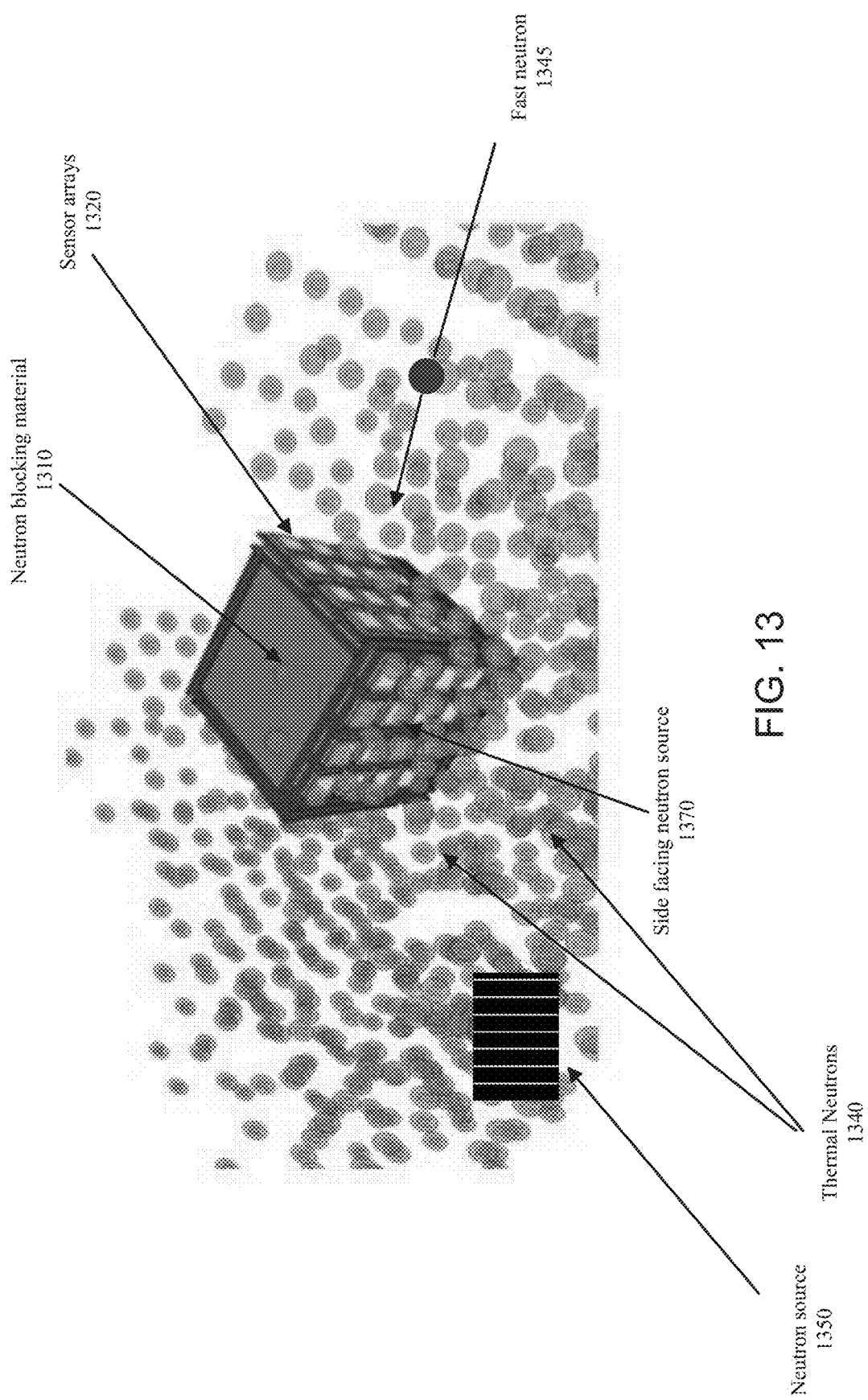
FIG. 13 illustrates the manner in which the sensing elements can be configured in a cubical formation in accordance with an embodiment of the present invention.

In one embodiment, the neutron converting layer 1004 is a film that may be coated on a substrate 1003 such as glass or plastic or silicon or any other material that does not interact strongly with neutrons. The substrate 1003 can also be carbon fiber, polyethylene, cadmium, high density polyethylene, certain types of metal like steel, aluminum, cadmium, etc. The purpose of the substrate can be to protect the underlying sensor and to filter out certain types of particles. Each type of substrate has its own properties. For example, a cadmium substrate will block out fast neutrons. A lead substrate will block out a significant amount of gamma particles. A plastic substrate may slow down neutron particles and can be used for moderating neutrons. The substrate may also be used for filtering and conditioning of particles. It should be noted that while the embodiment in FIG. 13 is optimized for detecting thermal neutrons, embodiments of the present invention may be optimized to detect any type of particle.

In one embodiment, if the surface of the substrate 1003 chosen is smooth enough, another substrate film can be layered on top of the substrate (not shown in FIG. 13) in order to filter or condition different types of particles from the primary substrate.

In one embodiment, the converter layer coating may also be made directly on the surface of the charge detection device as discussed previously. In other words, the coating may be directly applied to the charge detection layer 1006 without the air gap 1005.

In one embodiment, thermal neutron sensitivity depends on the converter layer thickness. Thick converter layers capture more neutrons than thinner layers. Thicker layers can be subject to reaction product loss, however, if they are too thick. Ideal thickness can range from 3 to 7 microns for orthogonal front irradiation of $^{10}B$ and 25-35 microns for orthogonal front irradiation of $^6Li$. However, $^{10}B$ films can be anywhere between 1 to 10 microns while $^6Li$ films can be anywhere between 10 to 200 microns.

The converter material coating 1004 is typically in the form of a thin film. The coated substrate is placed on top of the charge detection device with the coating facing the charge detection device (e.g., CMOS sensor, PIN diode, etc.). Typically, there is an air gap between the top surface of the thin film coating 1004 and the bare surface of the charge-sensitive device 1006. This air gap can be tuned to change the sensitivity of the neutron-detecting sensor. In a different embodiment, as indicated previously, the device can also have the neutron sensitive thin film 1004 deposited directly on top of the charge sensitive surface of the underlying semiconductor device.

It should be noted that the neutron convertor material 1004 together with the charge-sensitive semiconductor device 1006 comprises the neutron sensitive component of the neutron sensor system of the present invention (hereinafter referred to as the "neutron sensing elements").

The neutron sensing elements can be of various kinds. As explained above, the charge sensitive device 1014, for instance, can be a silicon CMOS sensor of the kind used in off-the-shelf digital cameras. These CMOS sensors are designed with several small pixels that serve as individual detectors of charge within the sensing element. The charge detection layer 1006 in FIG. 10 comprises the pixels.

Neutrons incident on the conversion layer 1004 produce charged particles and other reaction products when they interact with the material of the conversion layer. These charged particles make their way into the charge sensitive CMOS device 1014 through the bulk of the conversion layer 1004, any air gap 1005 if present, and finally through any layers of other passivating coatings on top of the CMOS device. By size, these particles are much smaller than the pixel. Their charge interacts with the electron cloud in the pixel resulting in the dislodging of electrons and creation of holes within the silicon lattice. These electrons and holes are the charge carriers that get detected within the pixel as signal. Because reaction products from the neutron-conversion layer have a certain energy when they are created, they lose their kinetic energy gradually within the charge sensitive device resulting in a finite length scale over which dislodged charge carriers are localized.

As mentioned previously, C1, the converter material 1004, which is a layer of reactive neutron-capturing materials can comprise $^{157}Gadolinium$ (also known as "native Gadolinium" which is a mixture of several isotopes including $^{157}Gadolinium$), $^{10}Boron$ (also known as native Boron), $^6Lithium$ (also known as native Lithium), etc. These converter layers may be in pure elemental form or in compound form or be a mixture of elements and compounds of neutron absorbing isotopes of elements in any combination. For example, the converter layer could be a compound of $^6Lithium$, e.g., $^6Li$—X, where X stands for any halide or iodide, e.g., Fluoride, Chloride, Carbonate, etc. Or the material could be a compound of $^{10}B$, e.g., $^{10}B$—X, where X stands for carbide or boric acid. $^{157}Gadolinium$ may be either in its natural state or oxidized.

The material can be of amorphous, semi-crystalline or crystalline form. They can be deposited in the form of a thin film using a variety of methods including chemical vapor deposition (CVD) and liquid state or solution state or sol-gel processing. Multiple layers of coatings with different materials being sensitive to different kinds of incident particles can be deposited using a combination of methods.

Neutrons, e.g., neutron 1018 interacting with the C1 layer 1004 produce charged particles such as alpha particles (α particles), e.g., particle 1019 and triton ($^3H$) particles, e.g., particle 1020 that, depending on their energy, have a certain spatial range they can travel before they lose all their energy.

The air gap 1005 serves as an attenuator for the charged particle. In other words, as the charged particle moves through this air gap, it loses energy gradually. The charge sensitive portion of the charge detection device (e.g., charge detection layer 1006) needs to be placed at a location relative to the converter layer 1004 so that the charged particle loses most of its energy inside of the charge sensitive layer 1006. The gap distance d1 1015 is therefore set so as to obtain the maximum signal within the charge detection device. In one embodiment, the range for d1 can be between 10 to 200 microns. Further, the typical range for the charge detection layer is between 5 to 10 microns and the depth of the silicon wafer substrate is approximately 300 microns.

In an exemplary embodiment, when a neutron 1018 enters the sensor, it first passes through the substrate 1003. Typically, the substrate will be chosen so that it does not block the particle of interest, e.g., neutrons in the present case. The substrate may be chosen so that it blocks other type of particles, e.g., gamma rays, but it will typically be transparent to the particle of interest. For example, a substrate made of sheet metal or lead would be adequate to block gamma particles.

The neutron particle 1018 interacts with the converter material 1004 to create a creation. For example, if the converter material is ⁶Lithium, the following exemplary reaction may take place:

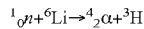

In other words, the neutron 1018 interacts with the C1 layer 1004 to produce charged particles such as alpha particle 1019 and triton (or tritium) particle ($^3$H) 1020. It should be noted that the charge of the produced particles allows the particles to be detected by the detection layer 1006. The charged particles will typically dissipate in opposing directions in response to the reaction between the neutron and the conversion layer. In other words, the alpha particle may travel in the opposite direction to the triton particle after the reaction takes place. Nevertheless, the charge detection layer 1006 will detect the charge from at least one of the charged particles, which in turn allows the sensor to flag the presence of the neutron 1018. It should also be noted that in order for detection to take place, the conversion layer 1004 will typically face the charge detection layer 1006, so that the byproducts of the reaction can be detected at layer 1006 easily.

When charged particles, e.g., alpha, triton, etc. are created following a reaction with the converter material 1004, they typically travel extremely fast initially. But they start to lose energy at an exponential rate. Typically, when traveling, the charged particles have a certain distance they are able to penetrate into the silicon substrate 1007. For example, a charged particle may get 50 microns deep into the silicon substrate 1007 before losing all of its energy if the converter material was deposited directly onto the pixels. Accordingly, in order to ensure that the charged particle deposits most of its energy in the charge detection region 1006, which is the most sensitive part of the sensor, the air gap is added to the design of the sensor. The air gap ensures that the charged particle loses some, but not all, of its energy prior to making contact with the charge detection layer 1006. If the converter material 1004 is deposited directly onto the charge detecting device 1014, most of the charged particles would likely penetrate too deeply into the substrate to be detected. In one embodiment, the gap distance d1 1015 is optimized so that the charged particles deposit the maximum amount of energy in the charge detection region 1006.

High Spatial Resolution Debris Mapping Application

Embodiments of the present invention can be used to perform identification and high spatial resolution mapping of nuclear fuel debris in or around damaged nuclear reactors. For example, the core of a damaged nuclear reactor that overheats may melt and core debris may leak from the reactor's pressure vessels (RPVs) that contain the fuel rods. Subsequently, the core debris may relocate into the containment vessels that are stabilized by the flow of cooling water. It would be important in such circumstances to make use of a flexible detector capable of withstanding extreme conditions that can be used to identify and create a map of the fuel debris within the containment vessels without being destroyed.

Figure 11:
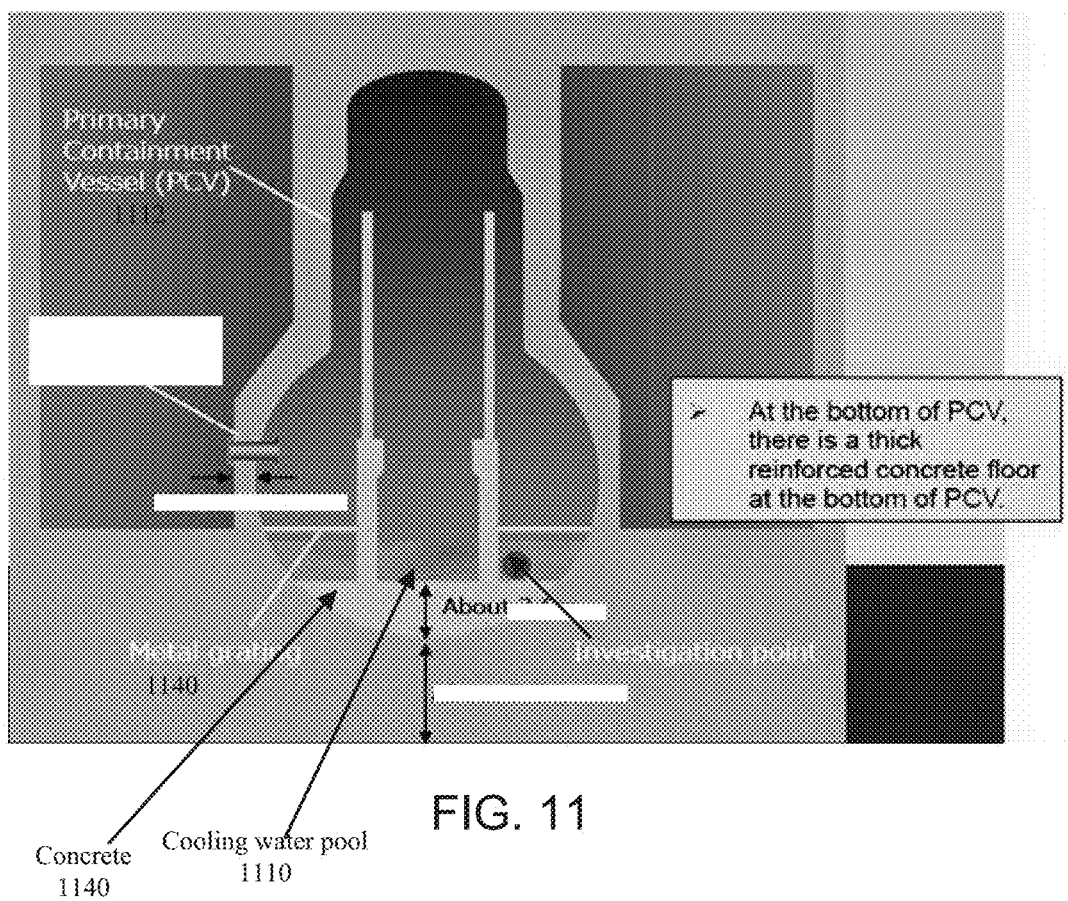
FIG. 11 is an exemplary diagram of a cross-section of a nuclear primary containment vessel (PCV) of a reactor that may contain nuclear sediment resulting from a nuclear accident.

FIG. 11 is an exemplary diagram of a cross-section of a nuclear primary containment vessel (PCV) of a reactor that may contain nuclear sediment resulting from a nuclear accident. The primary containment vessel 1112 comprises a thick reinforced concrete floor 1140 at the bottom of the PCV. It further comprises a cooling water pool 1110 that may contain some of the nuclear debris.

Simply detecting gamma radiation within the PCV does not help identify fuel debris or the location of the debris with any certainty because inside the damaged reactor units, nearly everything emits some amount of gamma. Factors further complicating identification of fuel debris are melted fuel mixing, unknown geometric constraints of the debris field, and background activation of non-fissile material. If a gamma detector within the damaged reactor units records high levels at a certain location, there is no certainty this gamma is emanating from the debris.

Spontaneous fission neutrons emitted from the core debris, if accurately detected, however, can characterize debris distribution. The challenge is that the neutron flux is low compared to the high gamma background from deposited fission products (e.g., radioactive Cesium-137). This requires detecting a low proportion of neutrons in a potentially high gamma background environment. The high energy environment is also fatal to most sensor equipment.

Embodiments of the present invention advantageously provide a sensor system that combines the ability to discriminate low neutron flux under high gamma backgrounds and robust enough to survive and function within an extreme energy environment. Embodiments of the present invention are sensitive to ionizing radiation via direct detection in the semiconductor and to neutrons via a neutron converter layer, e.g., layer 1004 in FIG. 10. Discrimination between gamma and neutron counts occur in 2D 60 frames per sec (fps) videos via pixel intensity and 2D shape, contextually performed by proprietary machine learning software.

Embodiments of the present invention can be used for several potential applications in the context of fuel debris detection and spatial mapping. For example, the sensor system of the present invention can be used to map core debris in the PCV, RPV and suppression chamber of a nuclear reactor. During debris removal, the detector can be used to sort fissile from non-fissile material. Further, the detector can be used for re-criticality monitoring.

In one embodiment of the present invention, a self-propelled robot equipped with a detector (comprising multiple sensors) can be programmed to enter the PCV and take measurements of gamma dose and neutron flux at various points on the metal grating 1140 and below the metal grating 1140 of the PCV 1112. The neutron sensor of the present invention is able to remain usable in at least a 1,000 Gy/hr environment and while receiving exposure up to a cumulative radiation dose of 1,000 Gy. By comparison the background radiation of gamma under ordinary conditions on Earth is $10^{-4}$ Gy. Using embodiments of the present invention, the robot is able to create a high spatial resolution debris map of the PCV and identify the location of potentially harmful radiation sources (using triangulating techniques discussed further below).

In one embodiment, the detector is installed into the self-propelled investigation robot using a cylindrical case. Further, the detector configuration and cabling is advantageously customizable so that detector performance can be optimized in accordance with the size requirement for other applications such as criticality monitoring. Additionally, the neutron sensor is environmentally adaptable which is advantageous for extreme environments such as nuclear reactors. The sensor is able to perform accurate readings in a high humidity environment and under water. In one embodiment, the neutron sensor is also remotely operable so that the sensors can be controlled even when placed in extreme environments.

In one embodiment, a detector with multiple sensors can include a camera for imaging in the visible range using an LED system for illumination at high resolution without sacrificing lifetime.

Triangulating a Source Location for Neutron Particles

Typically, there is a need in many applications to know whether a particular location in space is emitting radiation (such as neutrons and gamma particles) due the presence of an object that might have materials undergoing fission or some other nuclear process. For example, in the debris mapping application described above, there is a critical need in the case of a damaged nuclear reactor to identify all possible sources of radiation in order to determine if the areas need to be evacuated or cleaned up. The sensing elements, e.g., SPUs of the present invention can be configured geometrically in various different ways to scan an area in order to locate for sources of radiation.

For example, the sensing elements or SPUs can be arranged around a cube, cuboid, sphere, icosahedron, etc. Each of these configurations is reminiscent of a compound "eye" that is scanning some or all directions looking for neutrons and other subatomic particles.

Figure 12:
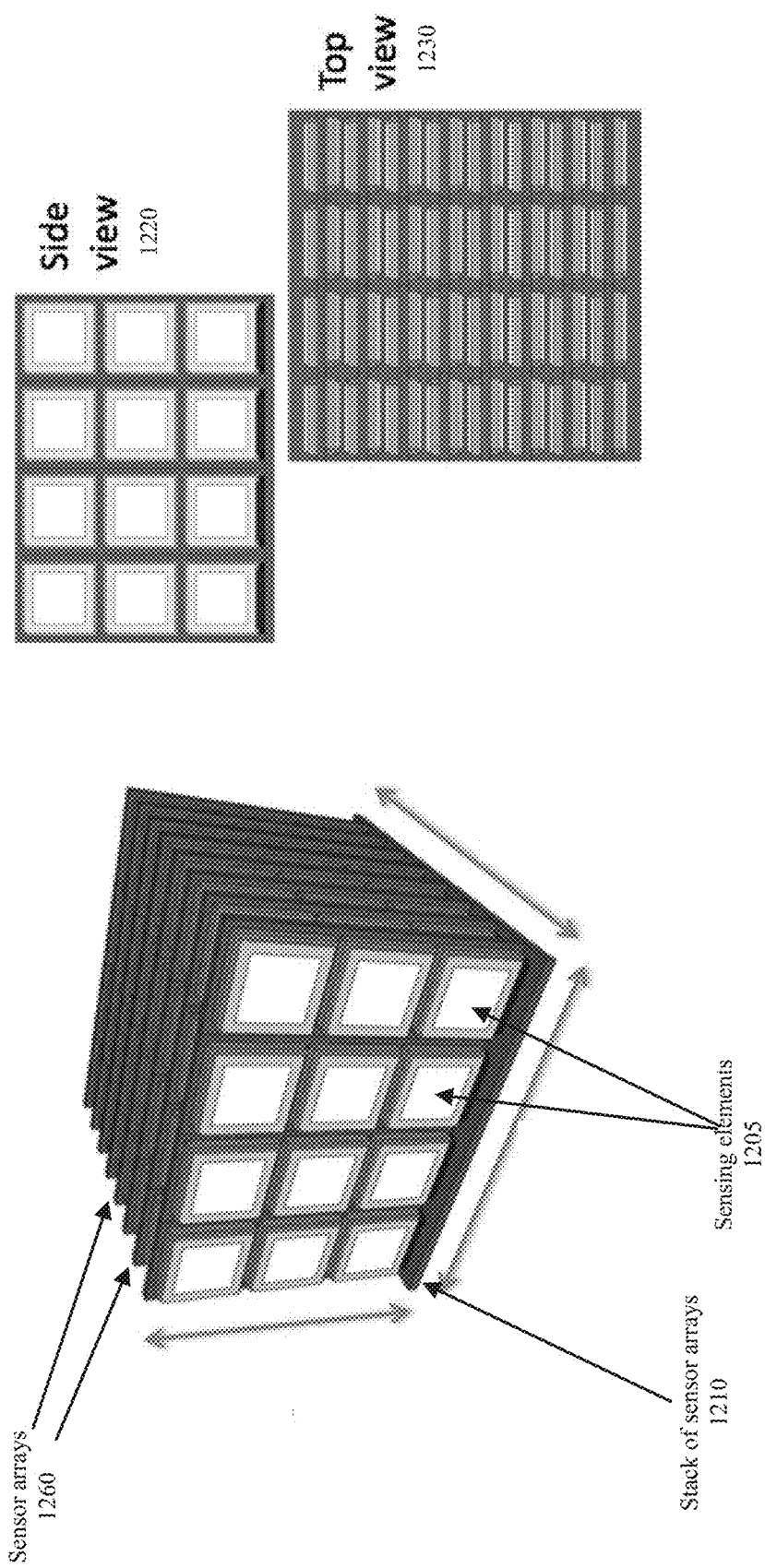
FIG. 12 illustrates the manner in which the sensing elements can be configured in a stack formation in accordance with an embodiment of the present invention.

FIG. 12 illustrates the manner in which the sensing elements can be configured in a stack formation in accordance with an embodiment of the present invention. In one embodiment, the sensing elements 1205 placed into an array can also be stacked in a stack formation 1210 to improve the detection efficiency. One or more sensor modules may be placed in a configuration that is optimized to maximize system performance. For example, multiple sensor modules 1205 could be configured to operate in parallel so as to increase the sensitivity of the device. Because each of the elements may only be modestly sensitive in detecting incident particles, the overall sensitivity to the particles can be increased by stacking more than one sensor module 1205 in parallel. FIG. 12 also illustrates a side view 1220 of a sensor array and a top view 1230 of the stacked sensor modules looking down on the stacked arrays.

In one exemplary embodiment, each of the sensor arrays 1260 can have a small form factor and can be designed to pack in a large number of sensors. For example, in the arrays shown in FIG. 12, each sensor can be 1 cm×1 cm in size. Each sensor array can be 4 cm in height and 6 cm in width. Furthermore, the arrays can be stacked 6 cm deep in order to form a stack of arrays that is designed for a 10 cm×10 cm scan area. It should be noted, however, that the sensors, the arrays or the stack are not limited to any particular size and can be of any size or shape. The stacked sensor array embodiment is most sensitive to particles that originate from a source that faces the sensor arrays.

FIG. 13 illustrates the manner in which the sensing elements can be configured in a cubical formation in accordance with an embodiment of the present invention. As mentioned above, the chips can be arranged into an array on a board. These boards can be of any size. Each chip within the board works independently. As shown in FIG. 13, the sensor arrays can be arranged in a cubical form with CMOS chips on sensor boards along each face of the cube. This allow multi-directional sensitivity. Further, the sensor arrays on each side of the cube can be stacked so as to include multiple arrays parallel to each other in the cube orientation to increase sensitivity. Neutrons incident on each face are detected on that face alone. The sensor chips form the building block for generating high resolution 3D maps of debris that can, for example, be used in the application with damaged nuclear reactors discussed above.

In one embodiment, the configuration, such as the one shown in FIG. 13, also include a neutron blocking material that would reduce "cross talk" amongst the sensors within the configuration. For instance, a neutron blocking material 1310 such as natural or $^{10}$B enriched Boron in its elemental form or in compound form such as carbide, nitride or embedded in plastic (such as HDPE) would block neutrons. In different embodiments with different particles of interest besides neutrons, the blocking material may be chosen accordingly to block such particles.

As shown in FIG. 13, the sensor boards 1320 are easily arranged around a cube of neutron blocking material 1310. Neutron blocking material 1310 is opaque to neutrons. With this configuration, neutrons incident on one face of the cube are detected on that face alone. This is because in planar sensing elements, the detection sensitivity varies significantly with angle relative to the radiation source. It is maximum when the sensing elements are face-to-face with the radiation source. When the sensing elements are at 90 degrees to the source, the sensitivity is significantly lower. For example, as shown in FIG. 13, the side 1370 of the cube facing the neutron source 1350 will be the most sensitive to the neutrons and will likely detect the most number of neutrons.

Neutrons that do not get detected on one face make their way into the neutron blocking material 1310 where they get absorbed. In other words, these "undetected" neutrons never make it to the boards arranged on any of the other faces of the cube. This reduces cross-talk between the different sensor arrays and ensures that a clear determination can be made with respect to the direction of the radiation source. Further, it allows a cleaner mapping of the particles that can be created for display to a user.

As mentioned above, neutrons incident on one face of the cube will largely be detected by the sensing elements on that face. Since the sensing elements can be pixelated, with each pixel serving as a detection element, the angle between a sensing element and the source also creates a gradient of detection within the pixels. Within the same sensing element (e.g., the same SPU), the pixels closest to the source will likely detect more neutrons than the pixels farther away. By using the counts and profiles of neutrons detected on each side of the cube, it becomes possible to determine the location of the source by triangulating the results from all the elements on different sides of the cube. As shown in FIG. 13, when the information from the multiple sensors is processed, a 3D spatial map of the neutrons would typically indicate that based on the map, the most neutrons were detected on side 1370 of the cubical sensor. Accordingly, it can be deduced that the neutron source 1350 is directly across from side 1370 of the cube. Furthermore, the analysis can be conducted down to the sensor level. For example, certain sensors on side 1370 may detect more neutrons than other sensors on side 1370. Using the readings from each of the sensors on each side of the cube independently allows an engineer analyzing the data from the sensors to further triangulate the source of the radiation.

The neutron blocker 1310 in the core of this cube serves to block neutrons incident on one side of the cube from reaching the other sides of the cube. This allows for better angular and spatial resolution.

In some embodiments, neutron directional information may also be obtained from the neutron itself, e.g., where the neutron is a fast neutron such as fast neutron 1345. In other words, the type of neutron detected may also provide some directionality information.

Certain radioactive sources, e.g., Plutonium-239 emit an entire spectrum of neutrons. For instance, Plutonium-239 can emit slow neutrons, thermal neutrons, moderate neutrons and fast neutrons.

Thermal neutrons 1340 or hot neutrons are typically slow moving, e.g., traveling at less than 2.5 km/s. Thermal neutrons travel slowly in cloud-like formations with other thermal neutrons, do not contain any directional information, and are typically detected by the converter material. To detect thermal neutrons, the counts of thermal neutrons detected on each side of the cube (based on the reaction with the converter material on each sensor) are used and the location of the neutron source is determined by triangulating the results from all the sensing elements on different sides of the cube as discussed above.

However, detecting fast neutrons that travel at speeds over 10,000 km/s is more complex. Fast neutrons provide an added advantage over thermal neutrons in that because of their speed, they are also carrying directional information. This directional information, for instance, can be used to determine the source of the neutrons. However, fast neutrons typically cannot be detected by the converter material, which makes their detection more challenging.

In one embodiment, the fast neutrons, e.g., fast neutron 1345 can interact directly with the CMOS sensor itself rather than the coating 1004. In other words, the fast neutrons interact directly with the charge detection layer 1006. Interacting directly with the silicon making up the charge detection layer, the fast neutrons leave a signature behind on the silicon that allows a discrimination procedure to determine the direction of the fast neutron. The fast neutron will typically interact with the silicon by destroying one or more silicon atoms it comes in contact with. Further, the fast neutrons upon contact with the silicon release highly charged particles that leave a trail of charge behind on the silicon from which the directional information can be deduced. The directional information can then be used to ascertain the source of the neutrons.

In one embodiment, in order to detect fast neutrons the same way as thermal neutrons, the substrate 1003 can be designed with plastic or similar material. Plastic contains hydrogen, which slows down a fast neutron and turns it into a thermal neutron. Thereafter, the converter material 1004 can detect the fast neutron, which has lost all its energy after passing through the plastic substrate, in the same way as a thermal neutron.

In one embodiment, if there is a high proportion of fast neutrons in the environment, the converter material 1004 for one or more sensors in the detector can be designed with Cadmium. Cadmium has the rare property of being able to interact with fast neutrons.

Figure 14:
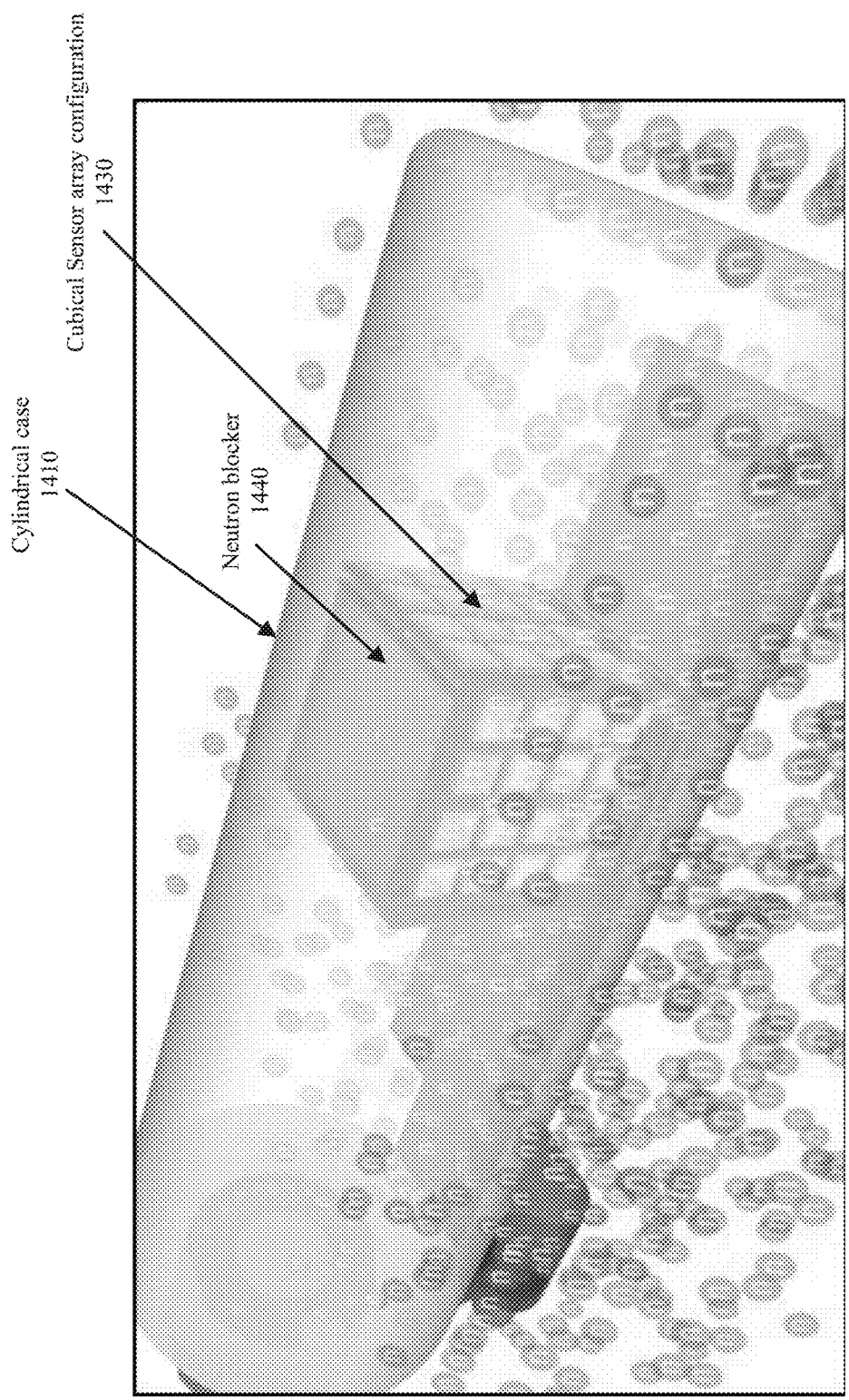
FIG. 14 illustrates the manner in which a sensor cubes can be made to fit within a cylindrical sensor head in accordance with an embodiment of the present invention.

FIG. 14 illustrates the manner in which a sensor cubes can be made to fit within a cylindrical sensor head in accordance with an embodiment of the present invention. As noted above, in order to install a detector into the self-propelled investigation robot to be used for surveying a damaged nuclear reactor, a cylindrical case can be used. It should be noted that the sensor head may be a different shape other than cylindrical as well. The cylindrical case 1410 can house at least one cubical sensor 1430 in this embodiment. As shown in FIG. 14, the sensors are arranged in a cube with a neutron blocker 1440 in the middle of the cube which allows each face of the cube to be directionally sensitive.

Figure 15:
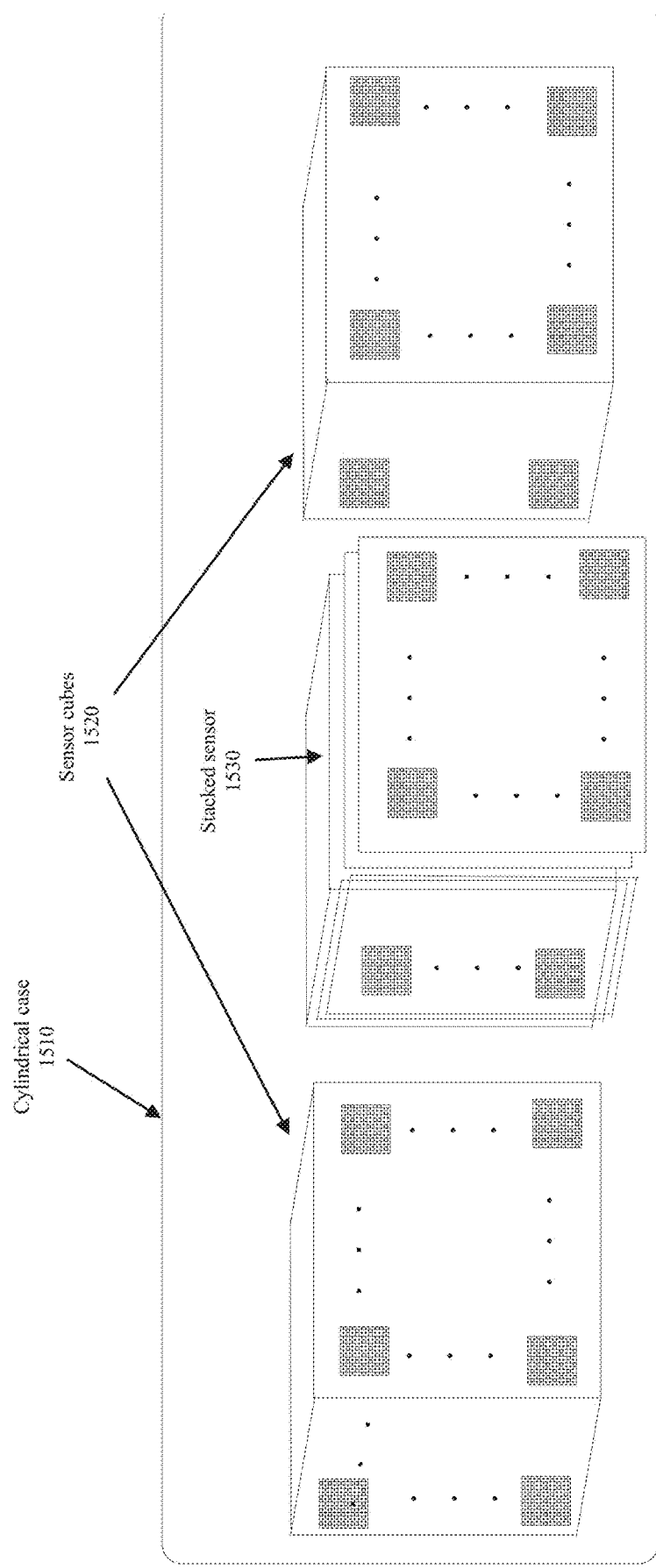
FIG. 15 illustrates the manner in which multiple sensor cubes can be configured to fit within a cylindrical sensor head in accordance with an embodiment of the present invention.

FIG. 15 illustrates the manner in which multiple sensor cubes can be configured to fit within a cylindrical sensor head in accordance with an embodiment of the present invention. The CMOS chip cubes 1520 form the basis for 3D mapping of debris. Further, a stacked cube 1530, can also be used for added sensitivity. In one embodiment, measurements can be made of the neutron counts on each chip of each board on each face of the cube. Because the cylindrical sensor head 1510 allows for both roll and pitch motion, the detector can effectively detect a volume of space multiple times since the cylindrical sensor head can rotate the equivalent of 360 degrees. Each time the sensor head is moved, the cubes 1520 inside will get oriented slightly differently providing new information in the form of point cloud data. Subsequently, the measured neutrons are reconstructed using techniques similar to tomography to generate an accurate and high-resolution 3D map of debris.

In a typical embodiment, a cubical sensor configuration allows debris scan of 10 cm×10 cm area effectively to generate a map with low spatial uncertainty. Spatial resolution of better than 10 cm can be achieved in circumstances where the detector can get close to the debris. In one embodiment, by making the cubes 1520 smaller than 10 cm, 3D maps of spatial resolution less than 10 cm can also be generated.

The CMOS chips used in embodiments of the present invention offer enormous flexibility in design and range of options for configuration. For instance, the boards can easily be stacked to improve sensitivity along each face of the cube. Stacked sensor 1530, for example, illustrates a cubical sensor where multiple boards have been stacked along each face of the cube to improve sensitivity.

In one embodiment, collimation can be included along with a stacked set of boards or with a cubical configuration to further improve directional accuracy. The chips can even be arranged around a sphere to create a "compound eye."

Figure 16B:
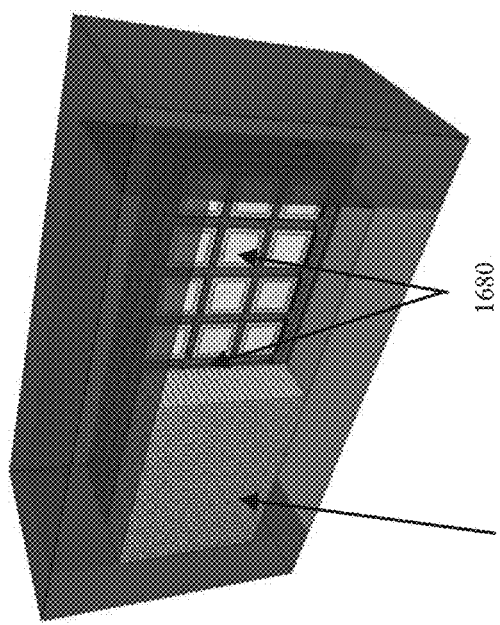
FIG. 16B illustrates a collimated configuration that can be used to improve directional accuracy in accordance with an embodiment of the present invention.
Figure 16A:
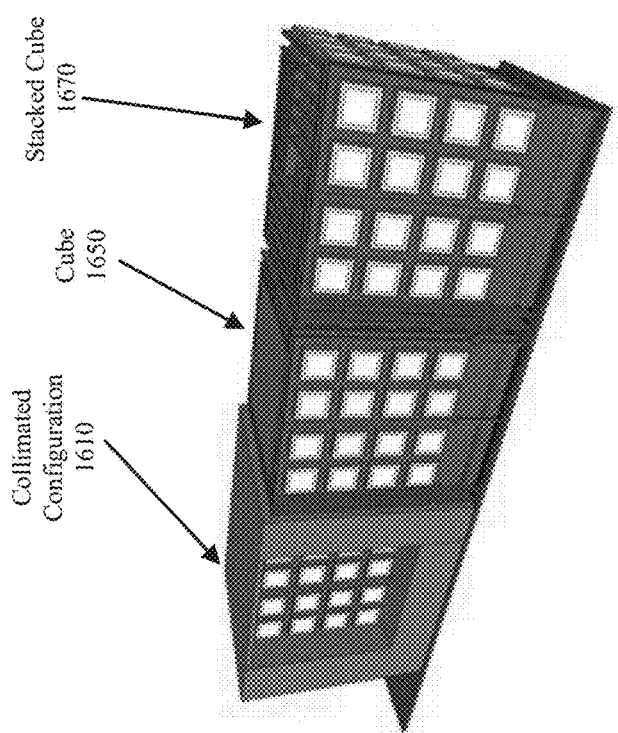
FIG. 16A illustrates the various configurations that sensors can be placed in to maximize sensitivity in accordance with embodiments of the present invention.

FIG. 16A illustrates the various configurations that sensors can be placed in to maximize sensitivity in accordance with embodiments of the present invention. For example, a collimated configuration 1610 can be used. Alternatively, the sensor arrays can be configured in a cube shaped configuration 1650. In one embodiment, as discussed above, to increase sensitivity, the sensor arrays can be stacked on each face of the cube to create a stacked cube configuration 1670.

FIG. 16B illustrates a collimated configuration that can be used to improve directional accuracy in accordance with an embodiment of the present invention. As shown in FIG. 16B a collimator 1690 can be used around a stacked set of sensory arrays 1680 to improve directional accuracy.

Figure 17:
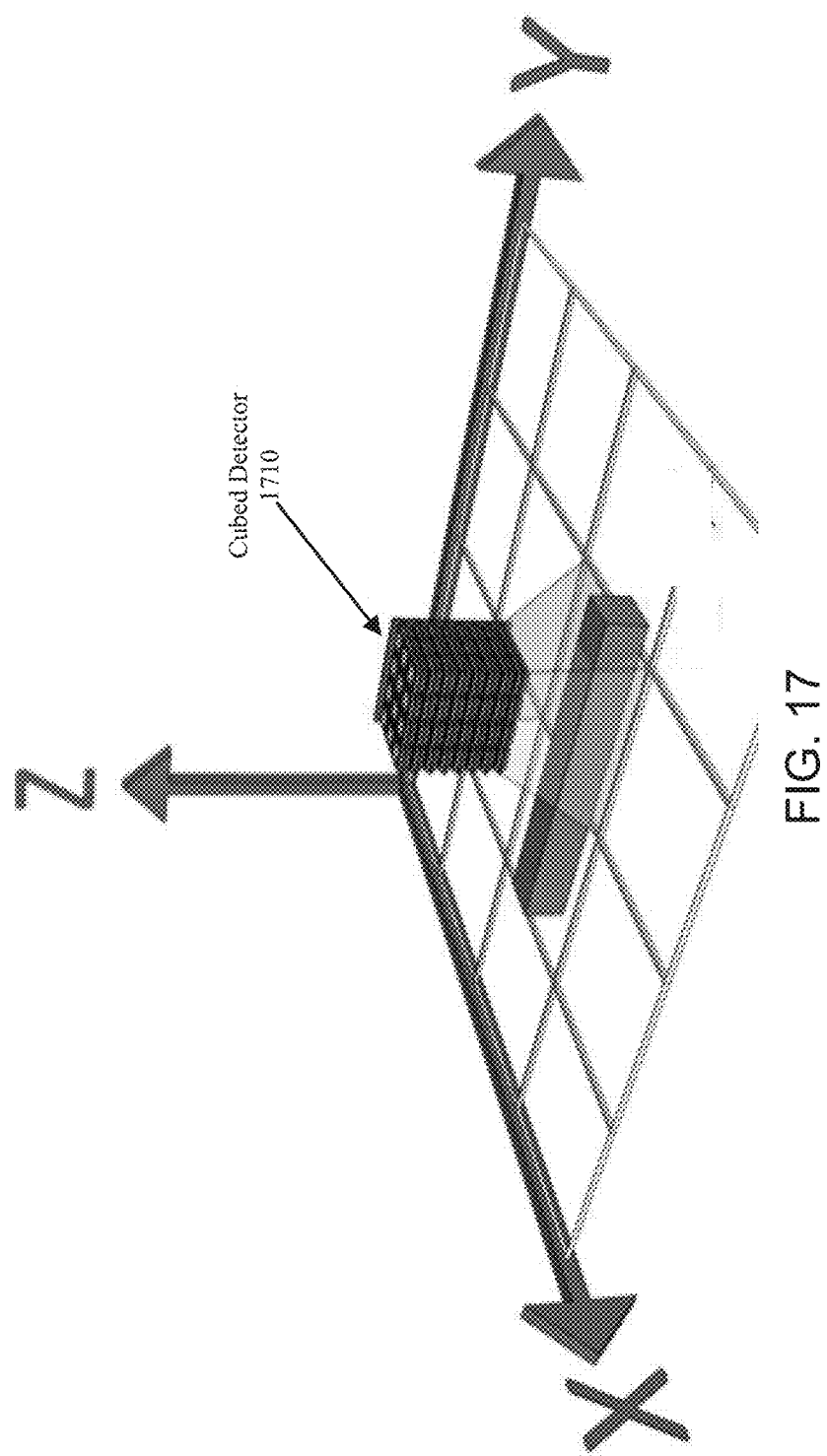
FIG. 17 illustrates a detector configured in the shape of a cube that is used to generate a debris map in accordance with an embodiment of the present invention.

FIG. 17 illustrates a detector configured in the shape of a cube and how that is used to generate a debris map in accordance with an embodiment of the present invention. The cubed sensor 1710 comprises a scalable design that can be used to generate a debris map with low spatial uncertainty. In one embodiment, the design can be used to perform a debris scan of an area of 10 cm×10 cm effectively, but a spatial resolution better than 10 cm can be achieved where the detector can get close to the debris.

Figure 18:
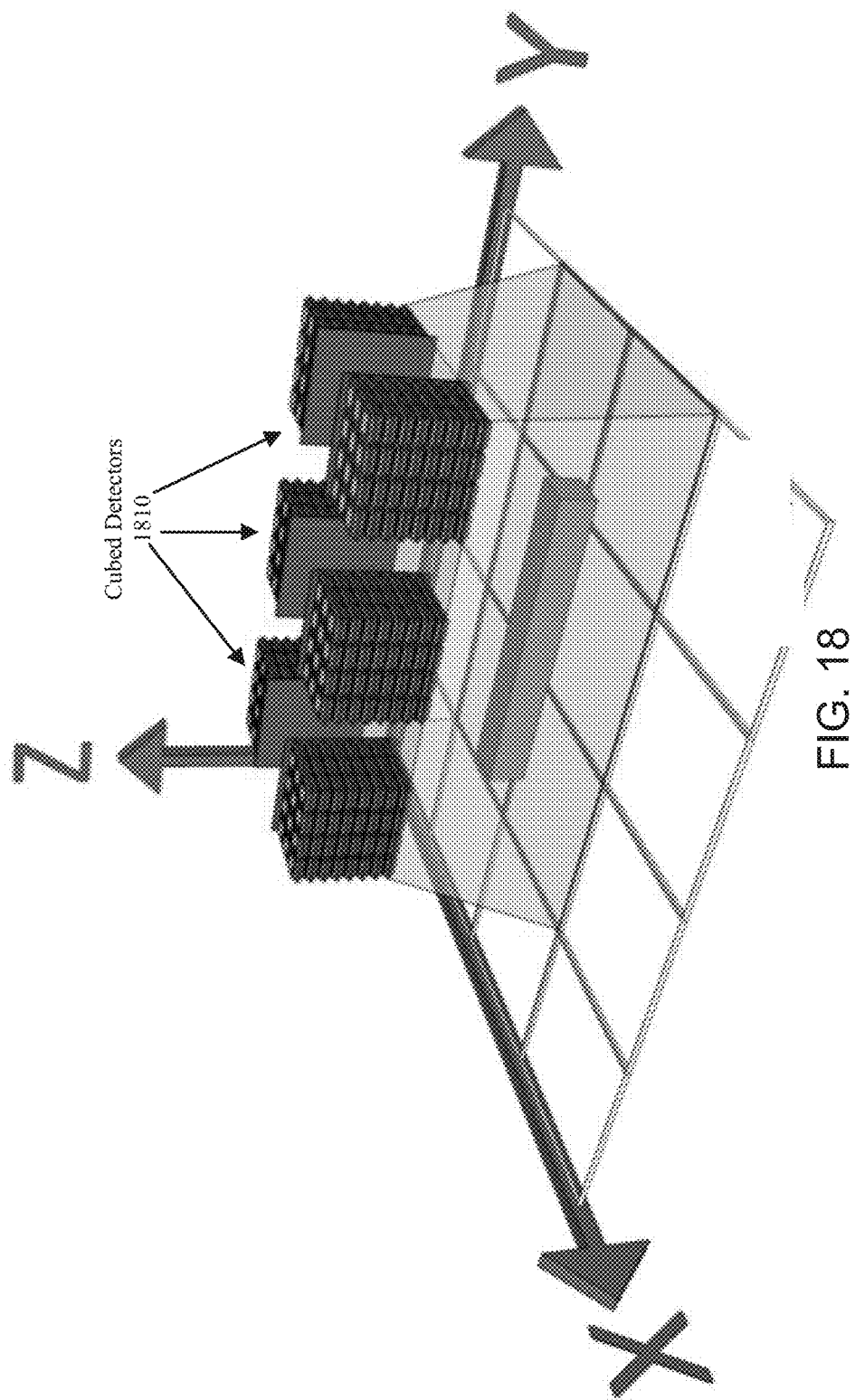
FIG. 18 illustrates the manner in which multiple cubed sensors can be used to enable more efficient debris mapping in accordance with an embodiment of the present invention.

FIG. 18 illustrates the manner in which multiple cubed sensors can be used to enable more efficient debris mapping in accordance with an embodiment of the present invention. In one embodiment, several cubed sensors 1810 can be used to perform rapid scanning of the area under investigation. The ability to use multiple detector modules to perform rapid scanning advantageously enables flexibility of operation and faster results.

FIG. 19A illustrates a cylindrical configuration that enables multiple sensors to be stacked to increase sensitivity in accordance with an embodiment of the present invention. As discussed above, in a nuclear reactor, for example, the robot unit may be equipped with a cylindrical case that has the ability to hold multiple sensor modules 1940 which enables rapid scanning and also provides enhanced sensitivity to particles of interest. Further, the cylindrical configuration would leave space 1980 in the cylinder for cabling and connections.

Figures 19B, 19C:
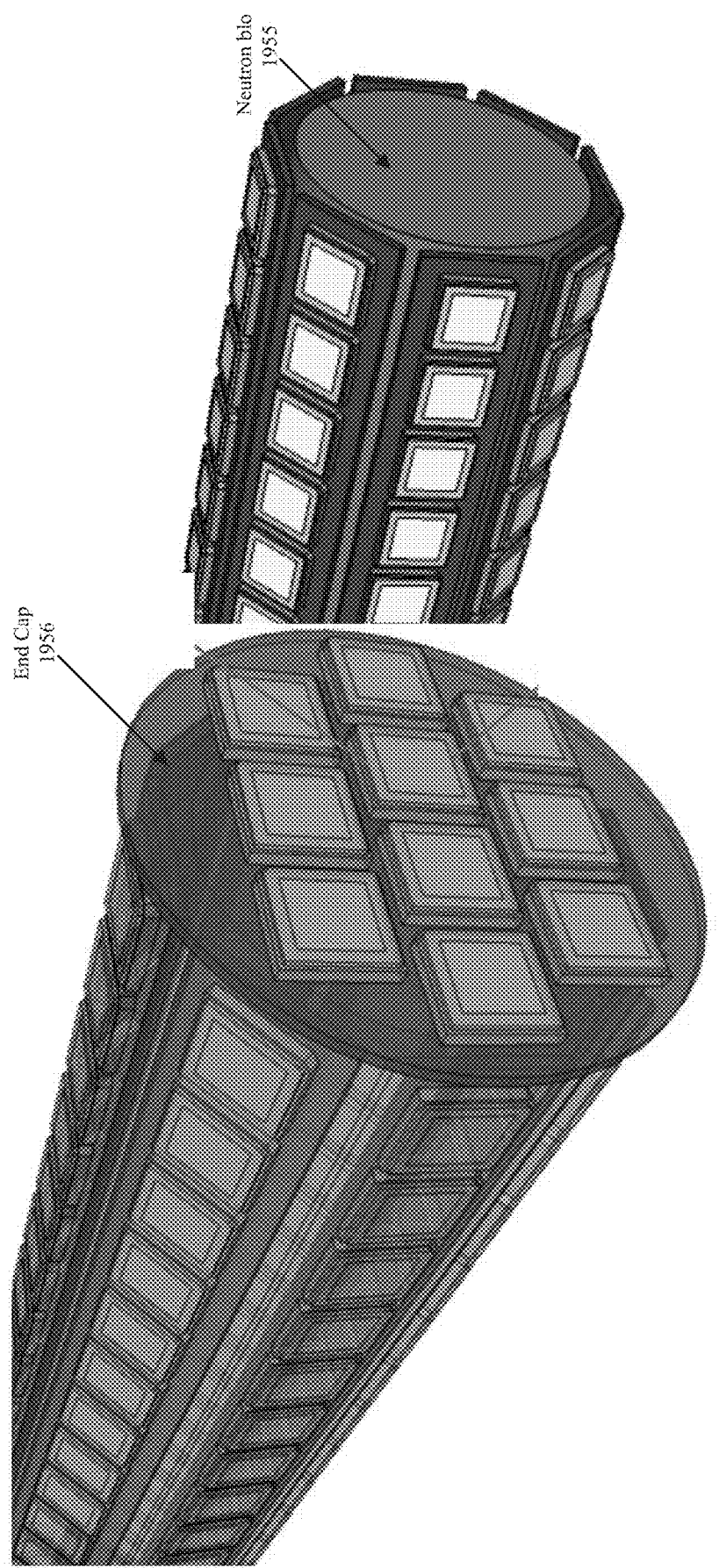
FIG. 19B illustrates another type of cylindrical configuration that enables multiple sensors to be stacked to increase sensitivity in accordance with an embodiment of the present invention.
FIG. 19C illustrates a type of cylindrical configuration that uses a neutron block to increase directional sensitivity in accordance with an embodiment of the present invention.

FIG. 19B illustrates another type of cylindrical configuration that enables multiple sensors to be stacked to increase sensitivity in accordance with an embodiment of the present invention. In the configuration of FIG. 19B, the sensors are arranged around a cylinder (in other words, the sensors are not only limited to being in a cubical or stacked configuration). The sensor shown in FIG. 19B comprises an end cap 1956 to enable the sensor to be used in different modes, e.g., side-facing, end-facing, etc.

FIG. 19C illustrates a type of cylindrical configuration that uses a neutron block to increase directional sensitivity in accordance with an embodiment of the present invention. The neutron blocker 1955 allows the tool to be directionally sensitive and turns the detector into a "compound eye" for neutrons. In one embodiment, the sensors could be stacked around the cylinder with more layers of sensors. For instance, the sensor shown in FIG. 19C may, in one embodiment, have sensors on both sides of the printed circuit board, one side facing outward, while while the other side is facing the neutron blocking core 1955.

Figure 20:
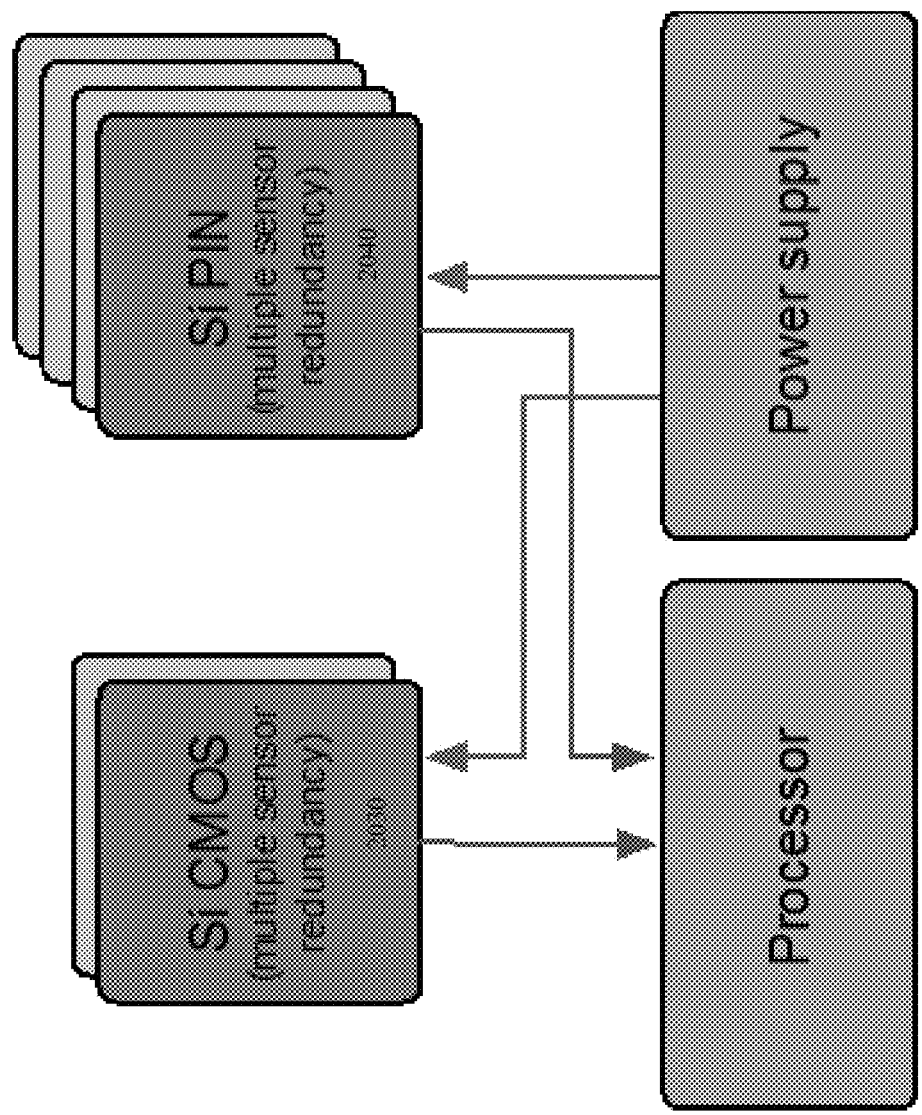
FIG. 20 illustrates the manner in which CMOS device sensors and PIN diode sensors can be combined in the same detector system in accordance with embodiments of the present invention.

FIG. 20 illustrates the manner in which CMOS device sensors and PIN diode sensors can be combined in the same detector system in accordance with embodiments of the present invention.

As noted above, the charge sensitive device 1014 typically comprises a semi-conductor based CMOS device (such as a silicon CMOS sensor, or organic semi-conductor-based CMOS sensor), PIN diode, or a photovoltaic device.

In one embodiment where multiple sensors are used to increase sensitivity, both Silicon CMOS sensors 2030 and Silicon PIN diode sensors 2040 may be used in parallel. The sensors are packaged together, connected by cable (of customizable length) to a power supply and data processing systems. Enhanced sensitivity and accuracy of neutron detection is achieved by cross-validation amongst sensors of different types.

Embodiments of the present invention use multiple sensors, multiple PIN diodes 2040 and multiple CMOS sensors 2030 because sensor redundancy boosts survivability and reliability and sensor cross-validation boosts measurement accuracy. Embodiments of the present invention combine silicon-based CMOS and PIN diode technologies. The CMOS sensor is a highly accurate digital neutron and gamma detector. Modular CMOS components can be easily integrated into small- to large-sized detectors based on requirements. CMOS sensors are less radiation tolerant than PIN due to smaller feature size, and have a lower active area due to package-to-volume ratio.

The silicon PIN diode, on the other hand, is more radiation tolerant than CMOS due to larger fabricated feature size. The PIN diode has high timing resolution and a higher active area package-to-volume ratio. Further, the PIN diodes lead to increased neutron counting efficiency because of the large sensitive area of a PIN chip especially under limited space availability. Its modular components can be easily integrated into small to large sized detectors based on applications requirements. However, PIN diodes tend to be less accurate than CMOS in neutron/gamma discrimination at low neutron/high gamma dose rate (and energy) background, as they utilize only pulse discrimination and not pulse discrimination combined with 2D spatial recognition (as will be discussed below).

When both CMOS sensors and PIN diode sensors are used together, the combined sensor attributes overcome the disadvantages of each individual type of sensor, and achieve fast and accurate detection in a range of neutron detection environments. Further building redundancies into the system using multiple CMOS and PIN diode sensors is critical for applications such as debris mapping because the adverse environmental conditions are almost certain to cause a certain degree of sensor failure. Therefore, some debris mapping applications may require as many as 256 redundant sensors. Moreover, in conditions where the signal is really faint, all the sensors can be turned on in order to boost sensitivity.

Transmission of Information from Sensors to the Command and Control Equipment

In adverse environments, especially where extremes of temperature, moisture and radiation are present individually or in some combination, it is often desirable to minimize or completely eliminate components of the sensor unit that might get damaged. The extent to which a component is likely to get damaged is typically proportional to the density of transistors within the device. For instance, FPGAs, CPUs and GPUs are more likely to get damaged in such environments than CMOS image sensors or commonly available CMOS based data serializers. In other words, if the sensor being used is from a common off-the-shelf camera, the additional electronics in the camera are much more likely to get damaged than the sensor itself. Accordingly, it is beneficial, if embodiments of the present invention are being used in adverse environments, to separate the sensor from the additional electronics using robust cabling or other methods in order to increase the lifetime of the sensor.

In one embodiment, in order to address the problem of the electronic components being more sensitive than the sensor, a long distance may be put between the sensitive and the relatively hardier components using cabling. The long distance potentially may help to get out of high radiation environments, for example. In this manner, the sensitive components can be placed at a location where the environment is less adverse resulting in higher system reliability and longer lifetime. However, spatial separation of such components also requires that data from the sensors now be transmitted over the distance of the separation. Also, spatial considerations often demand that data be moved over cables that are relatively thin and easy to manage. For example, in FIG. 19, since multiple sensor modules 1940 are stacked together and each sensor may potentially require its own cable, the cables need to be thin and flexible enough to fit into space 1980.

In one embodiment, each of the sensors (e.g. SPU) on an array may transmit their results to an MPU (e.g. MPU 345 in FIG. 3), which coordinates the results from the various sensors and transmits them over a single cable. The MPU, in one embodiment, can be co-located with the sensors. As discussed above, the MPU can simply be another sensor or SPU that is programmed to control the various other sensors and collect data coming from the sensors. Also, co-located with the sensors is a data serializer that can withstand extreme environments. The data serializer can serialize the information from the sensors (or MPU) and send them over long distances to the command and control modules as will be discussed in relation to FIG. 21A below.

FIG. 21A is a logical diagram that illustrates the manner in which data is transmitted from the sensors to the command and control equipment in accordance with an embodiment of the present invention.

In one embodiment, where the command and control modules need to be located at a safe and potentially long distance from the sensors, data generated at the sensors 2110A-2110D can be serialized using data serializers that operate in MHz to GHz frequencies. Serializing the data allows the thickness of the cables to be minimized. The data cables need to be thin because there may be potentially several hundred sensors placed in the detection area and the cables needed to transport the data will usually need to be designed to be able to fit into tight and confining geometries. Data can be communicated over the cables using, for example, low-voltage differential signaling (LVDS). Options for data transmission over thin cables 2198 include twisted pair cables, coaxial cables, optical fibers etc. In one embodiment, if the geometry is such that extremely thin data cables are required, and data must be moved over long distances in excess of 100 meters, data can be formatted into Internet Protocol and moved. This way, data can be communicated worldwide and directly moved to the cloud for processing. In a different embodiment, data communication can take place over WiFi or Sonar channels and the cables can be eliminated completely.

As noted above, the SPU 335 or MPU 345 (not shown in FIG. 21, but co-located with the sensor modules 2110A-2110D) can comprise FPGAs or other logic devices. The FPGA in an MPU, in one embodiment, can multiplex the signals from the various SPUs and attach a timestamp and ID number to the sensor information. The command and control module can then use the timestamp and ID information to determine which of the sensors is communicating (in the case where a single command and control module controls a number of sensors). In a different embodiment, each of the SPUs can also attach a timestamp and ID number to the information from the various sensing elements and transmit the information to the respective command and control module.

In one embodiment, in instances where the command and control module can be co-located with the sensors (e.g., in less extreme environments) and the data does not need to be serialized, information from each of the sensors can be packetized by the SPU or MPU and header information can be attached to each of the packets comprising sensor information, date, time, etc. before transmitting to the command and control module.

In a different embodiment, the sensor information can be directly communicated over transmission lines, where each sensor may communicate at a different frequency. The information is then synthesized and aggregated by the command and control modules. In yet another embodiment, each of the sensors is connected to its own respective command and control module using its own associated cable, which obviates the need to aggregate or multiplex the information.

In one embodiment, special protective shielding material is required for the cables especially in cases where long distances need to be covered through adverse environments. Effects of adverse environment include degradation of cable material and noise induced by environmental factors such as temperature and radiation. For example, lead or tungsten shielding can protect the cable from intense gamma ray environments, and also result in reduced noise from fast electrons produced by such gamma rays being incident on the conductor part of the cable. In high neutron environments, the cable must be protected from neutrons by using materials such as Boron, Gadolinium and Lithium.

In one embodiment, because of space constraints the thickness of each of the cables cannot be more than 3 mm in diameter. In one embodiment, both optical fibers and copper wire cables can be used to meet the system requirements effectively.

Both the medium used to transmit the signal and the protocol used to communicate need to maximize transmission speeds. This is because the information transmitted by the sensors needs to collected and analyzed in real time.

It should be noted that while FIG. 21A is illustrated with four sensor modules and associated command and control modules 2120A-2120D, there is no limit to the number of sensors or command modules that can operate in parallel.

Each sensor module 2110A-2110D, in one embodiment, is coupled to a respective command and control module 2120A-2120D. The command and control module controls the sensor. In one embodiment, there can be a single command and control module that controls all the sensors. In a different embodiment, each command and control module can control a subset of the sensors. In the embodiment shown in FIG. 13, each command and control module is associated with a respective sensor. Having a discrete command and control module builds redundancies into the system so that if one or more of the command and control modules fail, the detector does not go completely off-line. Each command and control module comprises firmware that can be programmed to control the sensors, e.g., control when to turn sensors on or off, to command the sensors to transmit their data or stop transmitting data, etc. Further, the command and control modules can comprise registers to store the data incoming from the sensors.

In one embodiment, the command and control modules can be incorporated with the sensors, where the adversity of the environment is not a factor. In other words, in circumstances where the sensors do not need to be separated out from the sensitive electronics controlling the sensors, the command and control modules can be co-located with the sensors.

As noted above in connection with FIG. 3, in one embodiment, the data from the various sensors (or SPUs) could simply flow through an MPU. The MPU can be programmed to control a group of SPUs or sensors. In one embodiment, an MPU (not shown in FIG. 21) that controls the sensors (2110A-2110D) could collect the information from the sensors and transmit it to the associated command and control modules. The command and control module may be entirely separate from the MPU, e.g., a computer or server stack connected to the MPU. Alternatively, it could have some components in the MPU (e.g., an FPGA, Microprocessor, etc.) and some components outside the MPU (e.g. a computer or server stack). In a different embodiment, the SPUs or sensors can be programmed to communicate directly with the respective command and control modules without the use of an MPU.

In the nuclear reactor example discussed above, the sensors 2110A-2110D could reside in the cylindrical casing fitted into the robot sent into the PCV, while the command and control modules could be situated at a safe distance from the reactor. The distances, therefore, that the cables have to communicate would typically be around or above 60 meters. The sensors would be connected to the command and control modules using thin cablings, e.g., twisted pair cables, coaxial cables, optical fibers, etc. The thin cabling is important because if several sensors are used, then several cables need to pass through confined and narrow geometries.

In one embodiment, each of the command and control modules is programmed with sensor information including the type of particle the sensor is optimized to detect. For example, sensor 2110A may be optimized to detect neutrons while sensor 2110B may be optimized for the detection of alpha particles.

As stated above, certain utility related applications require sensing of alpha, neutron, gamma and beta particles at the same time. Sensors 2110A-2110D may all be placed in a single detector with each sensor inside the detector optimized to detect a different type of particle. The associated command and control modules would be programmed with information regarding the type of particle the respective sensor module is designed to detect.

If one of the sensors is partitioned with different types of coatings across the sensor, then the corresponding command and control module would have to be programmed with that information as well.

In one embodiment, each command and control module is connected to a respective computer (e.g. computer 2130A-2130D). Alternatively, command, control and compute can all be part of the same computing module. In other words, each computer (e.g., computers 2130A-2130D) can be integrated with a respective command and control module. Furthermore, there can be a single computer rack dedicated to each sensor with the respective command, control and compute modules mounted on the rack. In one embodiment, all the compute modules 2130A-2130D can be part of a single master computer that controls all the connected command and control modules.

In one embodiment, the command and control modules are programmed to receive the serialized data over twisted pair or coaxial cables from the CMOS sensors in the detector system and convert the serialized data into a sequence of bitmap images at the rate of 60 frames/second. In other words, the command and control modules perform the data formatting for the information received from the CMOS sensors and convert them into bitmap images. It should be noted that while the discussion herein focuses on bitmap images, the command and control module may convert the sensor data into images of any format, e.g., jpeg, raw, png, etc.

These bitmap images can thereafter be analyzed by a discrimination procedure executing on the compute modules 2130A-2130D to detect the presence of various types of particles, e.g., gamma, neutrons, etc. In one embodiment, computer modules 2130A-2130D executes particle discrimination procedures that can analyze the bitmap images to detect the presence of particles.

The signals from the command, and control modules are analyzed in real-time by the compute modules 2130A-2130D and sent out to display 2150 (which is similar to display 350 discussed in connection with FIG. 3). The information collected from the CMOS sensors is displayed in 2D 60 fps videos and proprietary machine learning software running on compute modules 2130A-2130D is used to discriminate between gamma and neutron counts.

For example, artificial intelligence algorithms discriminate neutron particle counts in a gamma particle background. Data processing is conducted in real-time and accurate discrimination in a high radiation environment is achieved through artificial intelligence (AI) algorithms for accurate discrimination of neutron and gamma particles at a software level (as will be discussed further below).

In one embodiment, the command, control and compute modules are all programmed in firmware on GPUs. Each sensor is typically transmitting 1 MB of information per second and approximately 2 TB of data in 8 hours. Accordingly, high-speed GPUs are needed to manage the high volume of data being transmitted. As noted above, the data analysis and data storage electronics associated with the command, control and compute modules are located farther away from the sensors to ensure reliability of the circuits and to protect them from adverse conditions.

Figure 21B:
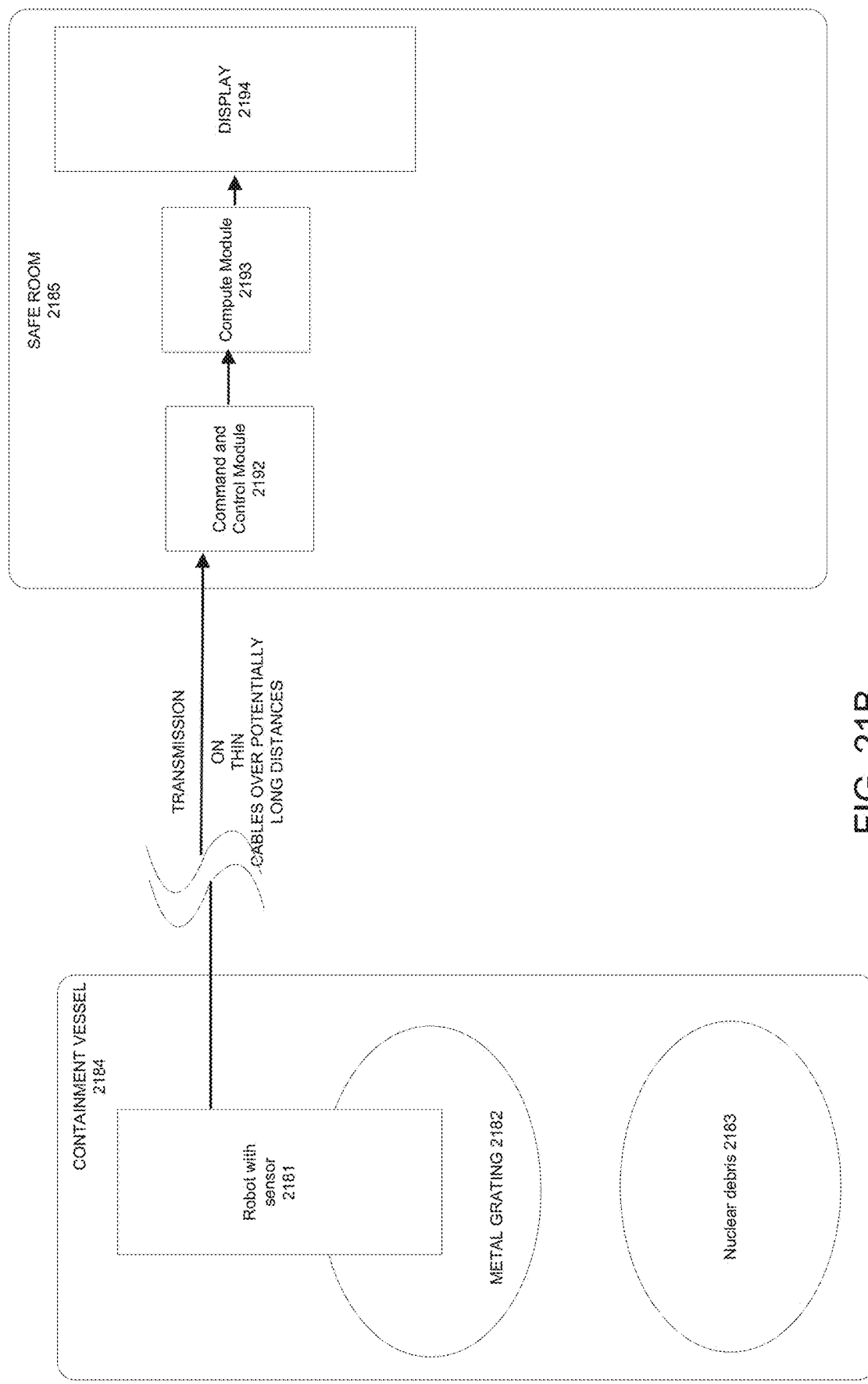
FIG. 21B is a logical diagram that illustrates the manner in which data is transmitted from a robot in a nuclear primary containment vessel (PCV) of a reactor to a safe room with the command and control equipment in accordance with an embodiment of the present invention.

FIG. 21B is a logical diagram that illustrates the manner in which data is transmitted from a robot in a nuclear primary containment vessel (PCV) of a reactor to a safe room with the command and control equipment in accordance with an embodiment of the present invention.

As noted above, embodiments of the present invention advantageously provide a sensor system that combines the ability to discriminate low neutron flux under high gamma backgrounds. Embodiments of the present invention can be used for several potential applications in the context of fuel debris detection. For example, the sensor system of the present invention can be used to map core debris in the PCV (e.g., containment vessel 2184 shown in FIG. 21B), RPV and suppression chamber of a nuclear reactor. During debris removal, the detector can be used to sort fissile from non-fissile material. Further, the detector can be used for re-criticality monitoring.

As shown in FIG. 21B, in one embodiment of the present invention, a self-propelled robot 2181 equipped with a detector (comprising multiple sensors) can be programmed to enter the PCV 2184 and take measurements of gamma dose and neutron flux at various points on the metal grating 2182 (similar to metal grating 1140 shown in FIG. 11) and below the metal grating 2182 of the PCV. The neutron sensor of the present invention is able to remain usable in at least a 1,000 Gy/hr environment and while receiving exposure up to a cumulative radiation dose of 1,000 Gy. Using embodiments of the present invention, the robot is able to create a high spatial resolution debris map of the PCV 2184 and identify the location of potentially harmful radiation source, e.g., nuclear debris 2183.

In one embodiment, the detector is installed into the self-propelled investigation robot 2184 using a cylindrical case. In one embodiment, the neutron sensor is also remotely operable, as in the case of robot 2181, so that the sensors can be controlled even when placed in extreme environments, e.g., containment vessel 2184.

FIG. 21B provides an example of a scenario where the command and control modules need to be located at a distance from the sensors. Data generated at the sensor or sensor (equipping into robot 2181) can be serialized using data serializers that operate in MHz to GHz frequencies. Serializing the data allows the thickness of the cables to be minimized and for several cables to fit into confined geometries (in the event that robot 2181 is equipped with several sensors). As noted above, options for data transmission include twisted pair cables, coaxial cables, optical fibers etc. In one embodiment, if the geometry is such that extremely thin data cables are required, and data must be moved over long distances in excess of 100 meters, data can be formatted into Internet Protocol and moved.

In the scenario illustrated in FIG. 21B, the sensor and data extraction logic are separated out from the sensitive electronics (as also discussed in connection with FIG. 21A). Accordingly, the command and control module 2192, the compute module 2193 and the display 2194 are all located at a safe room 2185 at a considerable distance from the containment vessel. Safe room may be several hundred meters away from the containment vessel and be safe for human entry. It should be noted that while FIG. 21B is illustrated with a single sensor module, a single command and control module 2193 and a single compute module 2193, there is no limit to the number of sensors, or command, control and compute modules that can operate in parallel.

Figure 22:
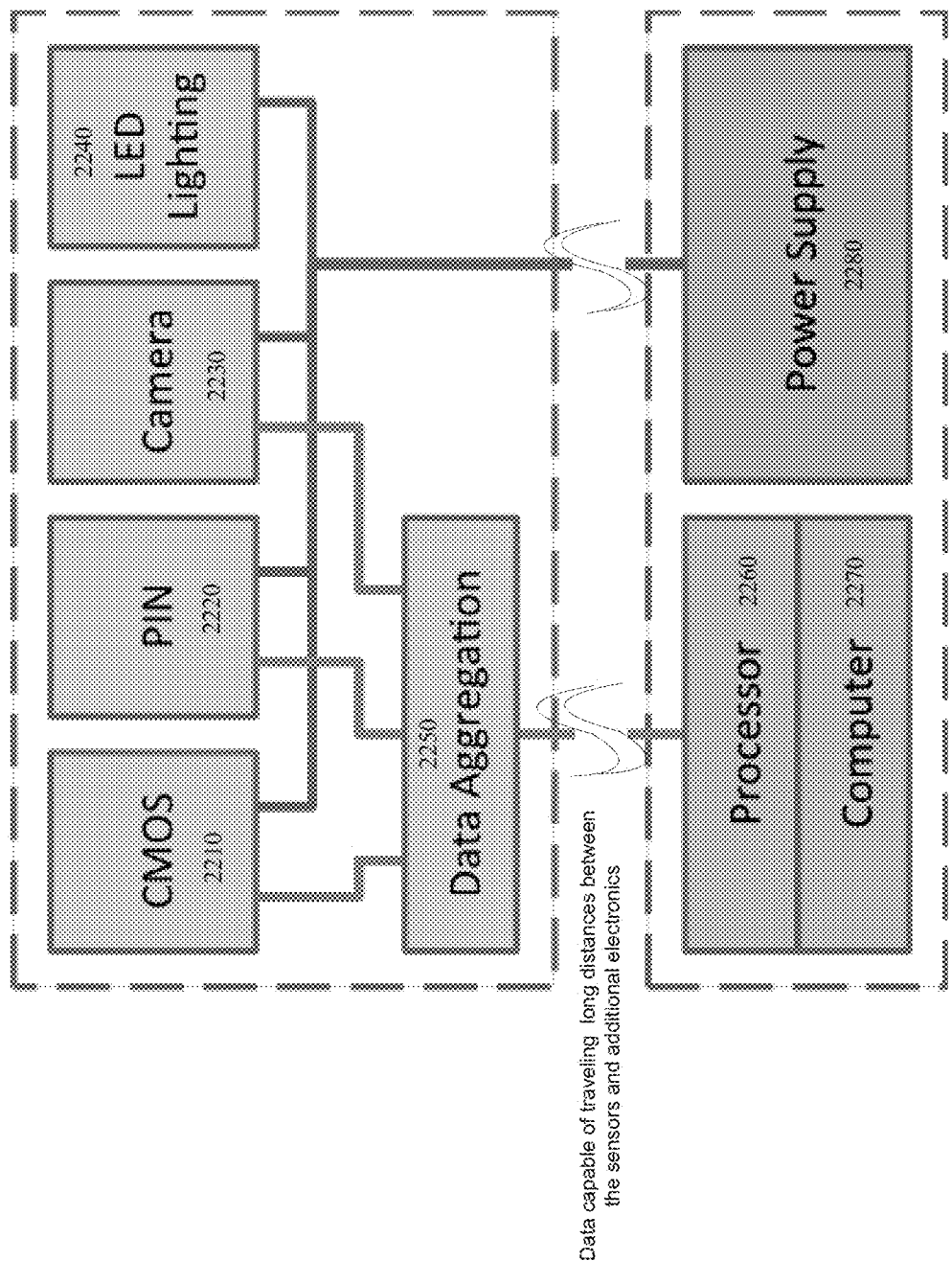
FIG. 22 illustrates the manner in which the sensor for the detector is separated from the additional electronics in accordance with an embodiment of the present invention.

FIG. 22 illustrates the manner in which the sensor for the detector is separated from the additional electronics in accordance with an embodiment of the present invention. As shown in FIG. 22, the CMOS sensors 2210, PIN sensors 2220, the camera 2230, and LED lighting 2240 modules will typically be more durable and capable of withstanding extreme environments. Accordingly, they can be separated out from the processor 2260, the computer 2270 and the power supply 2280. In one embodiment, the data aggregation module, e.g., the MPU 2250 can be co-located with the CMOS and PIN sensors. For example, in an instance, where one of the SPUs is programmed to be the MPU or data aggregator module, it can be co-located with the other sensor modules. In one embodiment, the data aggregation module 2250 may also be a data serializer that serializes the data to be transmitted to the command and control modules. As noted above, it is beneficial, if embodiments of the present invention are being used in adverse environments, to separate the sensors and camera from the additional electronics using robust cabling or other methods.

Use of Multiple Sensors to Ensure Reliability

In one embodiment, each of the sensors can be independently controlled using the command and control modules (and associated MPUs). Individual control over each of the sensors allows significant flexibility in the detection system. When the signal is faint, all the sensors can be turned on. Alternatively, if the detector is in proximity to fuel debris, for example, and the signal levels are high, then all but one sensor can be turned off. In one embodiment, the command and control module may be programmed with the logic to determine the number of sensors that can be turned off in a high signal environment without sacrificing the integrity of the detection process. In other words, the command and control module may have a threshold number of particles or a threshold level of signal that it needs to be able to detect before it can turn off additional sensors. Similarly, if the signal level falls below a certain threshold, the command and control module may be programmed to turn on additional sensors to increase intensity/sensitivity.

In one embodiment, the sensing elements may be turned off or disabled because they are not performing as required or otherwise have degraded. One way to do this is to run a sensing element check that includes a signal check using a pattern generator. A signal is sent to the sensor from an associated command and control module asking it to send a pattern back. Based on the deviation of this pattern from what is expected, the command, control and compute modules can determine the extent of damage and overall sensing element performance. If the damage is over a certain threshold, the sensor is turned off. Because the system has multiple redundant sensors, this typically does not effect the overall performance of the detector.

In one embodiment, the pattern transmitted to each of the sensors to determine its health is a chessboard pattern. In other words, every alternate pixel is stimulated. The pattern is then read out using the command and control module. If a significant deviation from a chessboard pattern is received, the command and control module can determine that the sensor is not functioning optimally.

The command and control modules are programmed with the logic to automatically address sensor failure. The command and control modules, for example, are programmed to seamlessly take the failing sensors off-line and queue up the sensors that are still operational.

In one application, for example, in an extreme operating environment out of a 1000 sensors, more than 50% may be guaranteed to fail. In such circumstances, the command and control module may be programmed to turn only a certain amount of sensors on at a time. It has been determined that the sensors that are not operational have a greater lifetime than operational sensors. For example, the command and control module may turn on 100 sensors to start with. In adverse conditions, the sensors that are on are more likely to fail. Accordingly, when those sensors fail, the command and control module may have multiplexing logic to turn on the next 100 sensors and deactivate the failed sensors and continue in this fashion during the mission period of the sensor.

As noted above, pixels degrade in extreme environments. Contributing factors include temperature, radiation, humidity etc. In one embodiment, the command and control modules or the compute modules are configured to automatically correct for degrading pixels. In other words, degraded pixels may be characterized to determine how their electrical characteristics change in response to extreme environments. This characterization then enables command and control modules (or compute modules) to correct for degraded pixels in real time, which allows the sensors to run continually despite being exposed to extreme environments.

Figure 32:
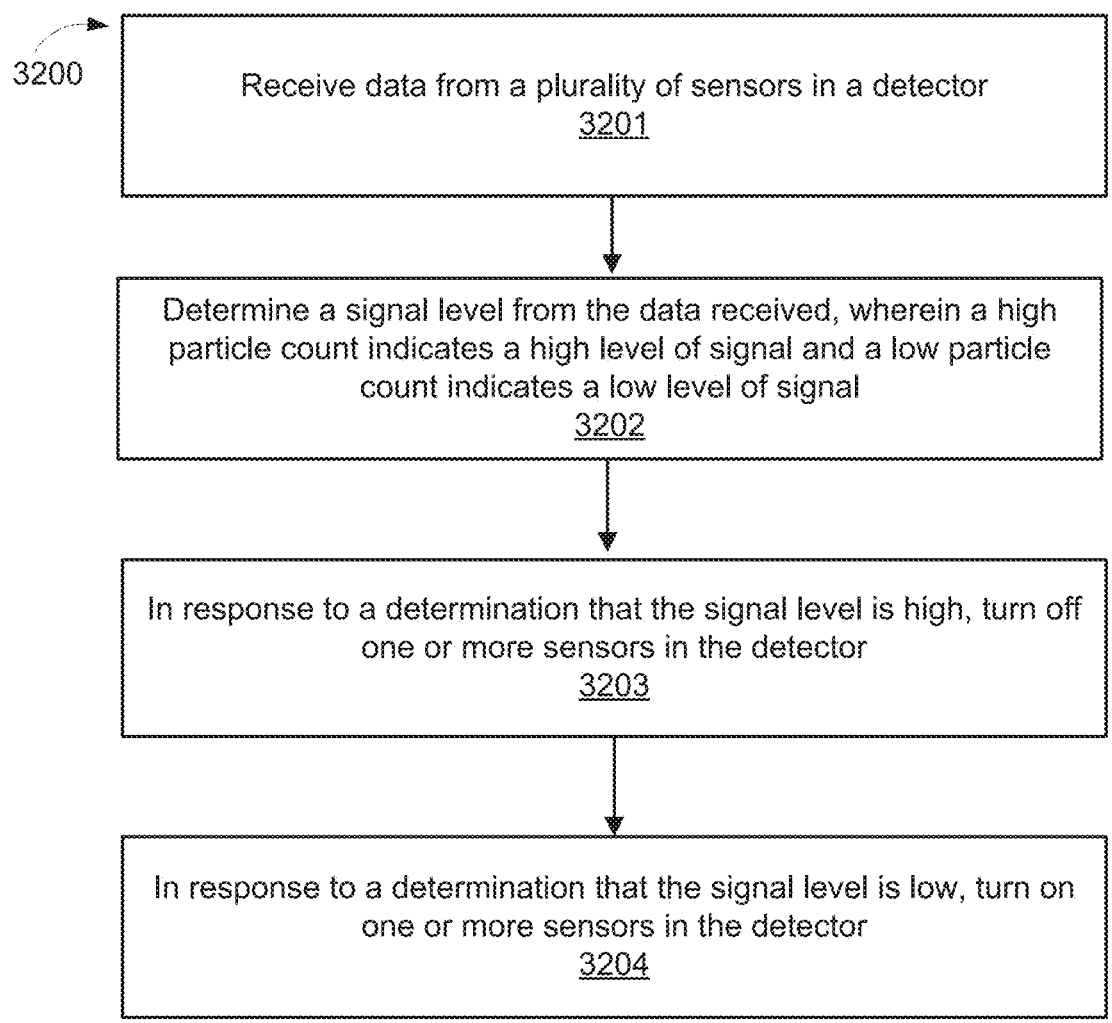
FIG. 32 depicts a flowchart of an exemplary computer implemented process for independently controlling sensors in order to ensure reliability in accordance with an embodiment of the present invention.
Figure 34:
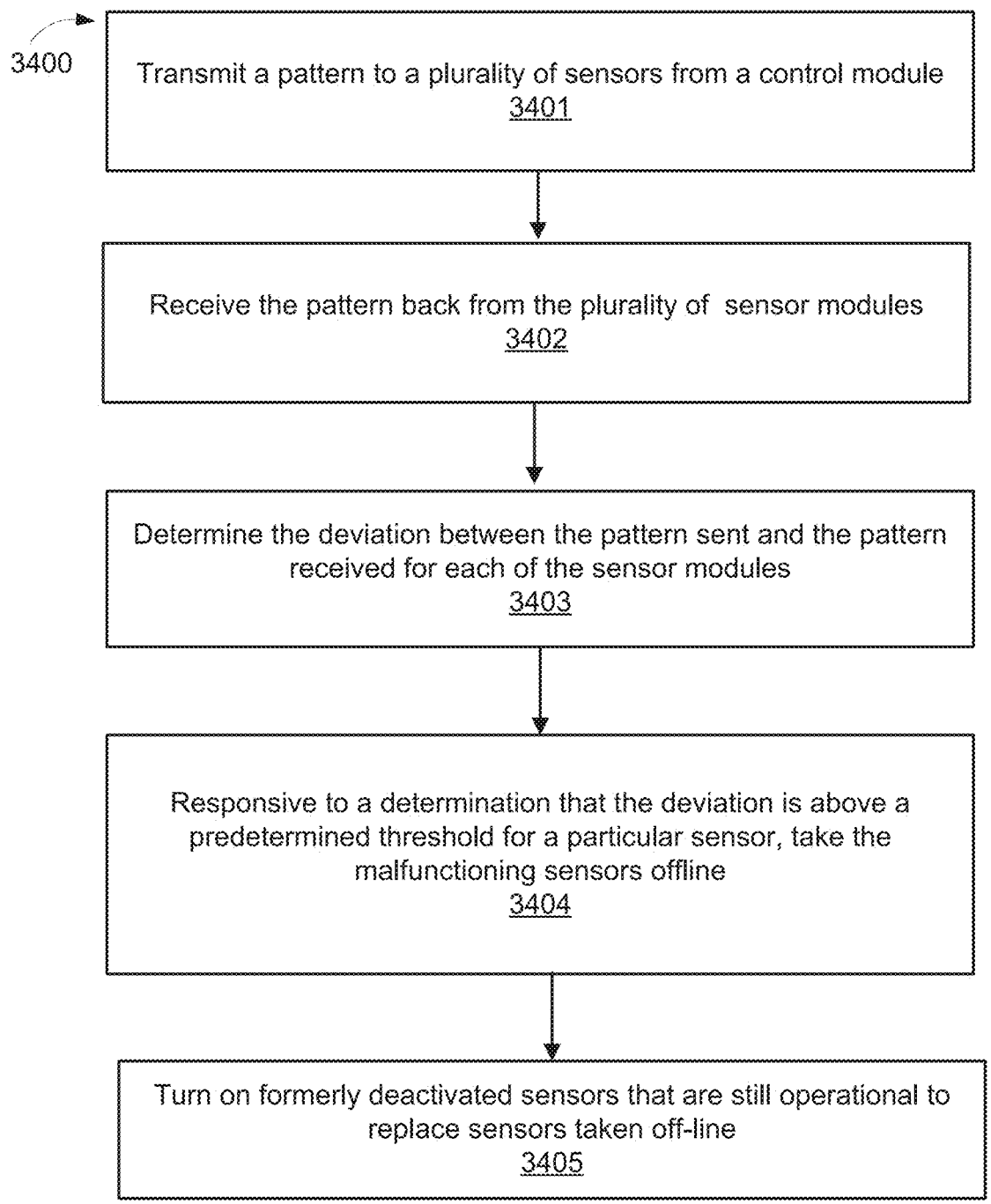
FIG. 34 depicts a flowchart of an exemplary computer implemented process for disabling sensors that are not functioning in order to ensure reliability of the detector and increase an operational life of a detector in accordance with an embodiment of the present invention.

FIGS. 32 and 34 discussed further below provide further discussion regarding the manner in which sensors can be independently controlled to ensure reliability.

Power Conservation and Heat Management

Typically, the sensors will be operating in extreme environments. This is exacerbated by the fact that CMOS sensors heat up easily. Further, CMOS sensors get noisier as the temperature rises. Individual control of the sensors and redundancy allows a user to selectively turn off selective sensors, which allows for dramatic heat dissipation. In one embodiment, the sensors can be cycled through on and off cycles to prevent heat from building up. For example, sensor 2110A and 2110B can be turned on while sensor 2110C and 2110D is turned off and vice versa. Further, the command and control module associated with each sensor may keep track of the sensor and its operating temperature, in one embodiment. If the command and control module senses the temperature exceed an acceptable threshold, it may automatically turn off the sensor.

Further, individual control over the sensors also enhances power conservation. As noted previously, when the signal is faint in a low particle environment, all the sensors can be turned on. Alternatively, if the signal levels are high in a high particle environment, then all but one or a few sensors can be turned off. This allows the system to efficiently conserve heat and energy while increasing sensor life.

In one embodiment, the sensors are configured in order to allow partial shutdown. In other words, the sensors are equipped with a mode that allows them to be partially shut down but still operate in a low power mode. For example, in the low power mode, the CMOS sensors consumes $1/1000^{th}$ of the maximum operating power of the CMOS. Because sensor typically utilize significant time and power to power up from an off state, enabling a partial shut down mode allows the sensors that are not needed to be partially shut down instead of completely turning off. These sensors can then be easily brought back online without requiring them to go through a sensor initialization process.

Figure 35:
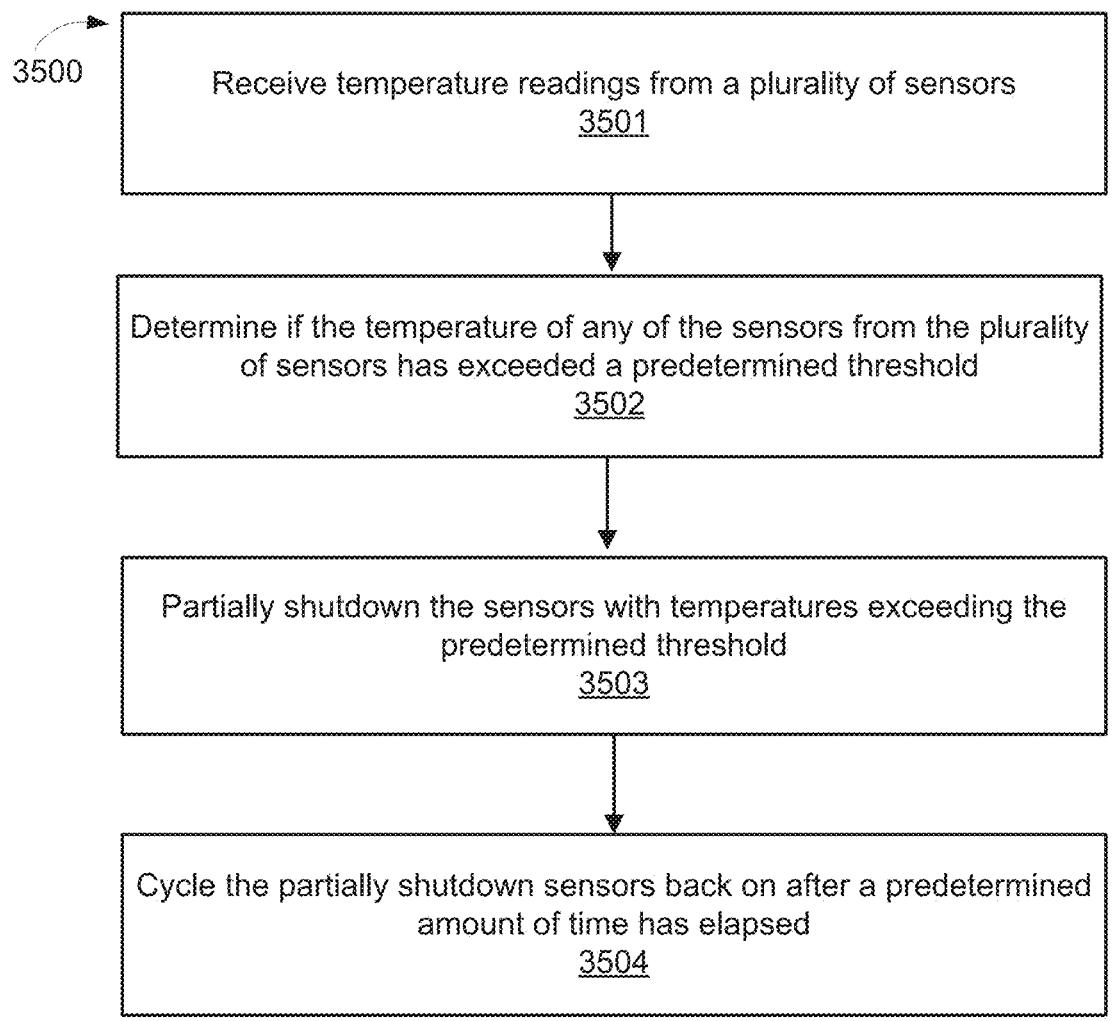
FIG. 35 depicts a flowchart of an exemplary computer implemented process for conserving power and managing heat in a tunable detector system in accordance with an embodiment of the present invention.

FIG. 35 discussed further below contains further discussion regarding an exemplary process for conserving power and managing heat in a tunable detector system.

Pattern Recognition and Software Extraction

As mentioned previously, in some embodiments, a discrimination process can be executed (e.g., on the compute modules 2130A-2130D) to discriminate between the different types of particles while minimizing any false positives. Each subatomic particle may be unique with respect to the intensity values they generate or the pattern in which they impinge on the pixels of pixel array P1 315. The discrimination procedure may comprise information regarding all the particles' unique "signatures" and uses these to differentiate between particles to ensure that false positives are not generated. The ionizing radiation-dependent signatures are the basis for the particle discrimination algorithms that are run on the computer modules 2130A-2130D.

For example, neutrons are observed to deposit more energy than the gamma background (grey, black) resulting in a higher amplitude (white) pulse. Embodiments of the present invention comprise image processing procedures (e.g., within compute modules 2130A-2130D) that use an amplitude and shape discrimination library to discriminate and identify and count neutrons using artificial intelligence digital pattern recognition software.

As mentioned previously, embodiments of the present invention can combine the durability and low time-to-detect of the PIN diode with the superior particle discrimination of the CMOS image sensor.

Figure 23A:
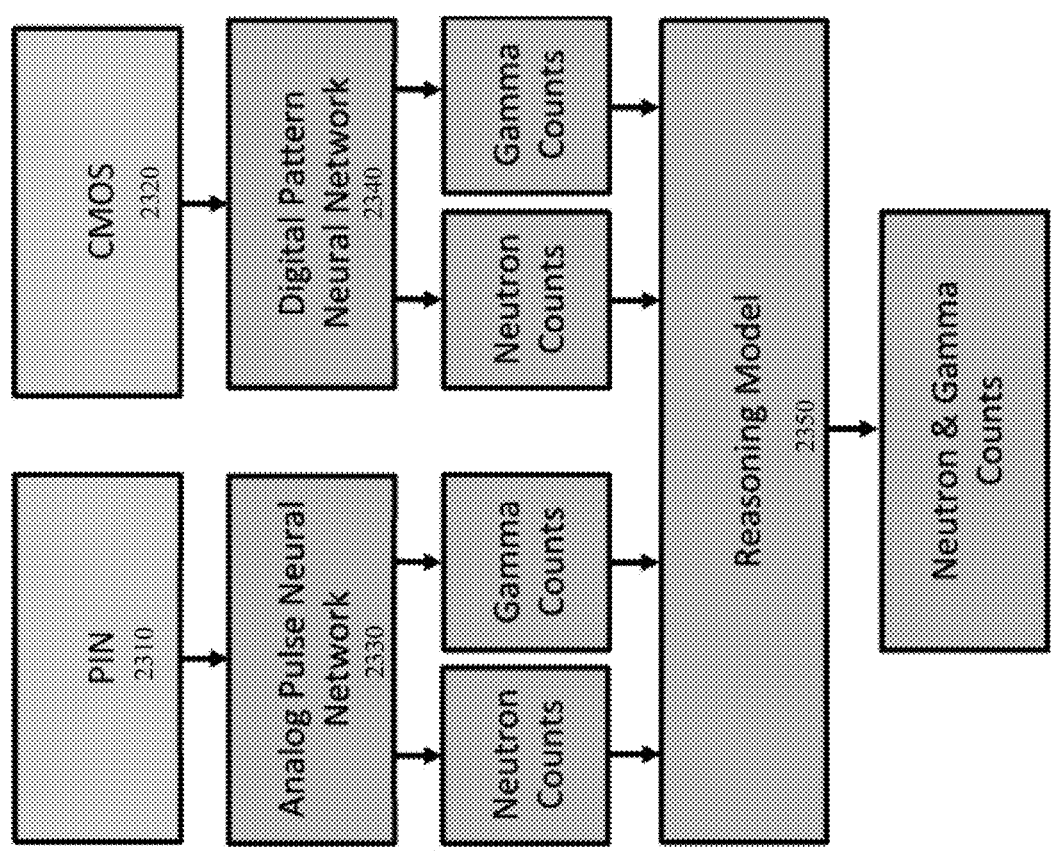
FIG. 23A illustrates the sensor-level measurement flow diagram and the manner in which neutron and gamma counts are output from the individual sensors and processed in accordance with an embodiment of the present invention.

FIG. 23A illustrates the sensor-level measurement flow diagram and the manner in which neutron and gamma counts are output from the individual sensors and processed in accordance with an embodiment of the present invention.

In one embodiment, sensor information from the PIN diode sensors is analyzed using an analog pulse neural network 2230 while sensor information from the CMOS sensors 2320 are analyzed using a digital pattern neural network 2340. Neutron and gamma counts are determined in real time and output from both types of neural networks and passed through a reasoning module 2350 (which may be programmed onto compute modules 2130A-2130D) to determine total neutron and gamma counts. The reasoning model 2350 also outputs the statistical certainty of the measurements of neutron and gamma counts in real time.

Figure 23B:
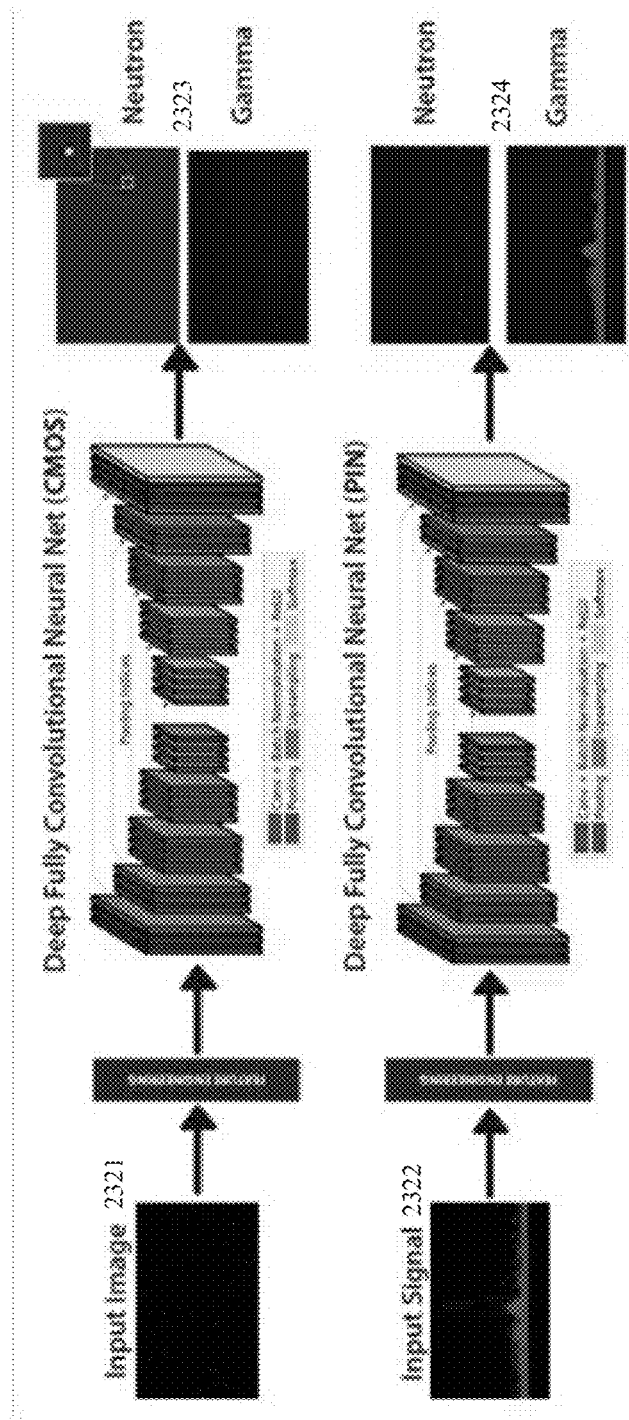
FIG. 23B illustrates is a flow diagram illustrating the manner in which sensor information is processed and outputted by the two different types of neural networks in accordance with an embodiment of the present invention.

FIG. 23B illustrates is a flow diagram illustrating the manner in which sensor information is processed and outputted by the two different types of neural networks in accordance with an embodiment of the present invention. Embodiments of the present invention comprise a neural net that is used to distinguish gamma and neutron signals in CMOS images 2321 and PIN diode voltage signals 2322. In one embodiment, artificial intelligence (AI) algorithms such as Deep Fully Convolutional Neural Network (CNN) architectures can be used for CMOS and PIN diode sensor data processing. The neural net is pre-trained with known and experimental data generated during sensor testing and characterization. This training process provides a trained model for fast real-time neutron and gamma classification via pattern recognition. The PIN Diode input signal 2322 and the CMOS images 2321 are deconvolved to separate high intensity neutron signals from the low intensity gamma backgrounds. The PIN Diode input signal 2322 is deconvolved to produce output 2324 from the analog pulse neural network 2330 while the CMOS input image 2321 is deconvolved to produce output 2323 from the digital pattern neural network 2340.

For CMOS images, the digital pattern neural network 2340 is programmed to apply the artificial intelligence procedures, e.g., Deep CNN, etc. to the CMOS images 2321 (inputted at 60 fps from the command and control modules) and identify neutrons using the AI procedures that have been trained to recognize neutron patterns in the CMOS images. The AI procedures can, for example, be programmed to output the CMOS images on a display identifying the neutrons. Similarly, the analog pulse neural network 2330 is programmed to apply the artificial intelligence procedures, e.g., Deep CNN, etc. to the pulses generated by the PIN diode to determine the neutron and gamma counts.

Figure 24A:
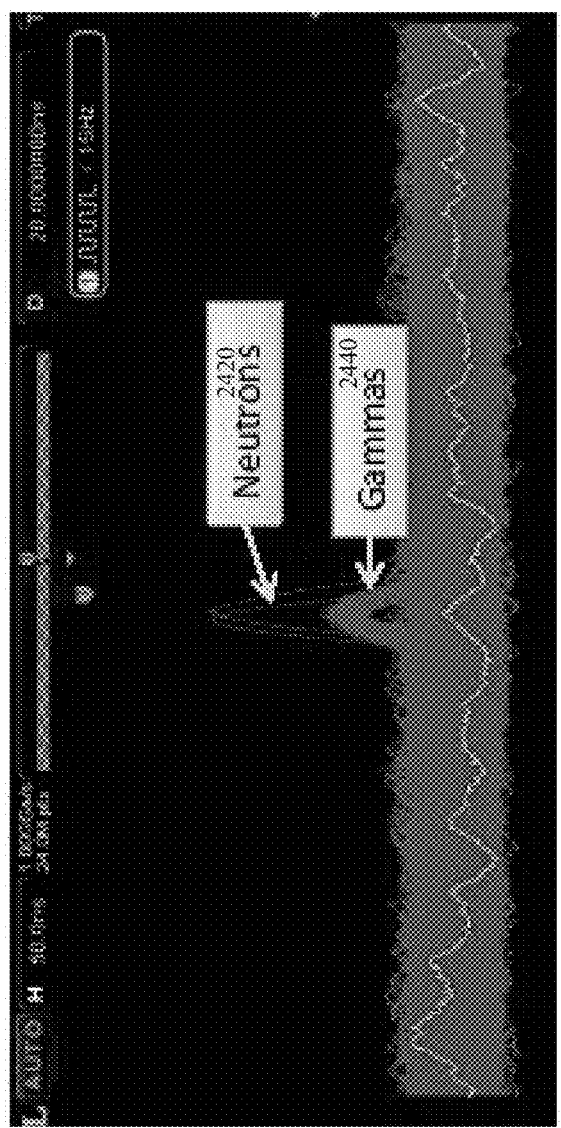
FIG. 24A illustrates an exemplary output of a PIN diode from which neutrons can be identified using the analog pulse neural network in accordance with an embodiment of the present invention.
Figure 24A:
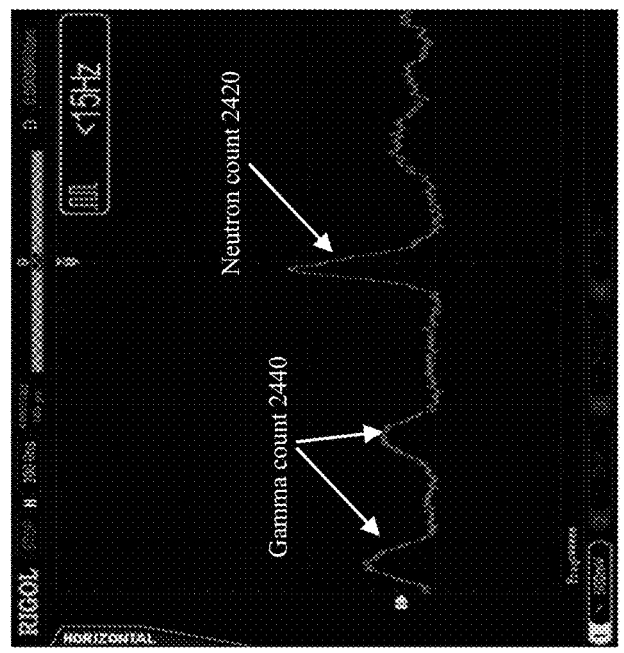

FIG. 24A illustrates an exemplary output of a PIN diode from which neutrons can be identified using the analog pulse neural network in accordance with an embodiment of the present invention. Neutrons absorbed in the converter layer of a PIN diode creates ionizing radiation. A fraction of the ionizing radiation (energy release by the nuclear reaction, alpha and beta particles, and gamma photons) incident on the sensor is absorbed in the semiconductor active layer. Detection in the PIN diode occurs in the active pixel area of a PIN diode. A PIN diode is a single photodiode.

An amplifier boosts the signal out of the diode by several orders of magnitude. The signal out of the diode, dependent on amplitude and time, is initially sorted with an analog discriminator, then fed into an analog-to-digital (ADC) converter. Readout of the PIN diode results in a series of time and amplitude dependent pulses. As shown in both of the images in FIG. 24A, typically, gamma photons will produce a wider and shorter pulse 2440 than the pulse 2420 generated by neutron particles. The pulse height is determined by the amount of energy deposited by each particle and, typically, neutrons will deposit more energy than gamma particles. Once the amplified pulses pass through the analog discriminator and ADC, the software executing on the command, control and compute modules saves and then processes the raw pulse data to finally discriminate pulses resulting from neutron absorption from pulses resulting from gamma absorption. The resulting pulse height information can also be used to determine a neutron and gamma count. Further, once the gamma and neutron counts are sorted using the analog pulse neural network 2330, the raw data is saved and input into the reasoning model 2350 for real-time, accurate particle counting.

In one embodiment, instead of using an analog pulse neural network to identify the raw pulses from the PIN diode sensors, a digital pattern neural network may be programmed to convert the images of the pulses (obtained from an oscilloscope or otherwise) in FIG. 24A to bitmap images and train an artificial intelligence algorithm, e.g., Deep CNN to identify and differentiate neutron related pulses 2420 from gamma related pulses 2440 directly from the bitmap images. For example, the command, control and compute modules associated with a PIN diode can be programmed to analyze bitmap (or jpeg, png, raw, etc.) images of the neutron and gamma pulses generated by PIN diode sensors and identify neutrons directly from the bitmap image.

Figure 24B:
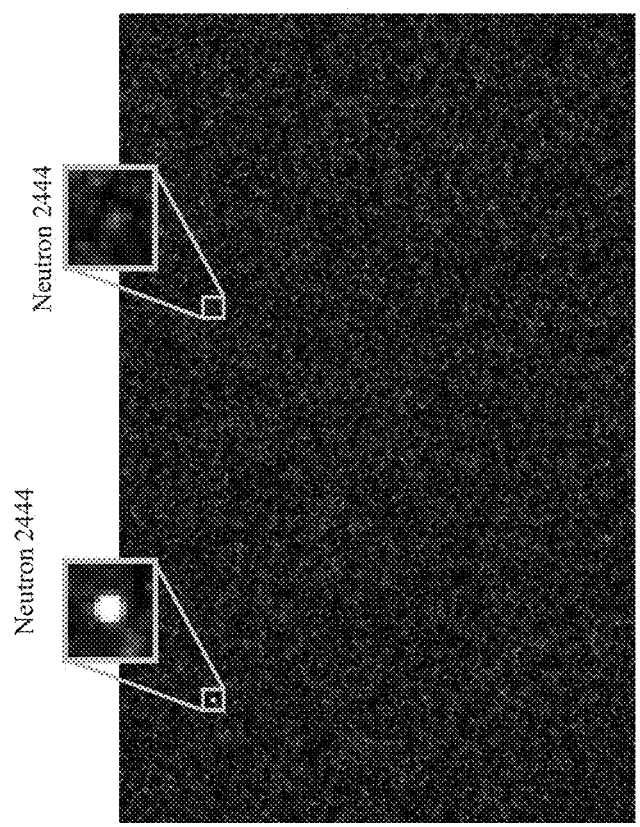
FIG. 24B illustrates an exemplary output of a CMOS sensor from which neutrons can be identified using digital pattern neural network that analyzes sensor information from CMOS sensors in accordance with an embodiment of the present invention.

FIG. 24B illustrates an exemplary output of a CMOS sensor from which neutrons can be identified using digital pattern neural network that analyzes sensor information from CMOS sensors in accordance with an embodiment of the present invention. As mentioned above, neutrons are observed to deposit more energy than the gamma background resulting in a higher amplitude (white) pulse. The image processing software running on the compute modules 2130A-2130D uses an amplitude and shape discrimination library to discriminate, identify and count neutrons 2444 from bitmap images generated by 60 fps by CMOS sensors using artificial-intelligence digital pattern recognition software.

In one embodiment, CMOS pixel-level data is read out and rendered into bitmap images similar to the one shown in FIG. 24B using the digital pattern neural network 2340. In high gamma background conditions, readout rate may be increased to reduce pileup. Neutron and gamma counts are input into the reasoning model 2350 for real-time accurate particle counting.

As stated previously, raw data from the CMOS-based radiation sensor comes in the form of a series of images at about 60 frames per second. Images contain 360,960 pixels of size 6.0 um×6.0 um. In an embodiment, each pixel records data in a range from 0-255.

Figure 25A:
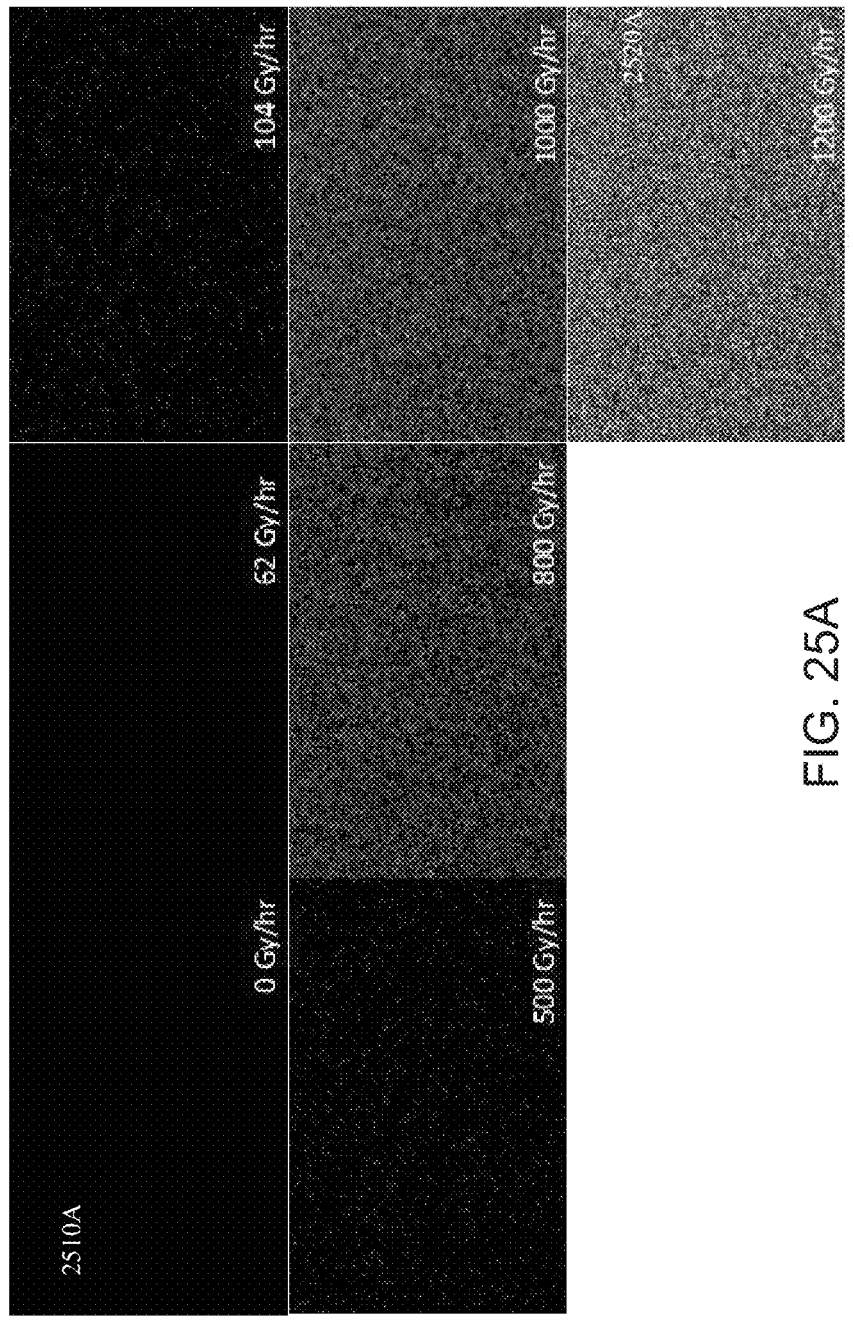
FIG. 25A illustrates representative frames from CMOS radiation sensors in response to varying levels of gamma radiation in accordance with an embodiment of the present invention.

FIG. 25A illustrates representative frames from CMOS radiation sensors in response to varying levels of gamma radiation in accordance with an embodiment of the present invention. In an environment with no radiation sources present (0 Gy/hr), the CMOS-based radiation sensors record a background pixel response of 7-8. Accordingly, frame 2510A appears black. As the gamma dose rate increases (from 0 Gy/hr to 1200 Gy/hr in image 2520A), the overall response rises. Frames appear lighter.

Figure 25B:
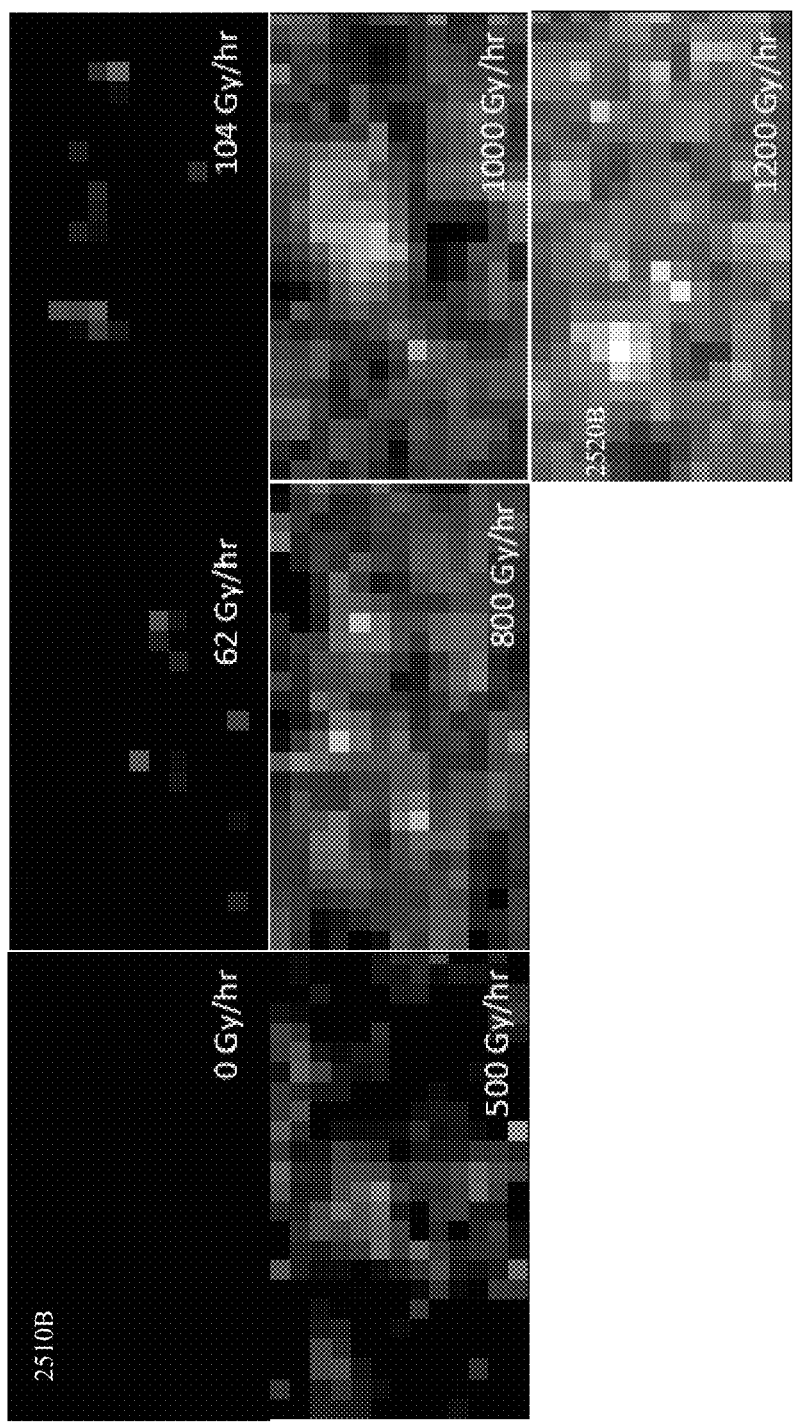
FIG. 25B illustrates representative frames at the pixel level from CMOS radiation sensors in response to varying levels of gamma radiation in accordance with an embodiment of the present invention.

FIG. 25B illustrates representative frames at the pixel level from CMOS radiation sensors in response to varying levels of gamma radiation in accordance with an embodiment of the present invention. FIG. 25B illustrates the same frames from FIG. 25A at the pixel level. Similar to FIG. 25A, frame 2510B at 0 Gy/hr appears to be black while frame 2510B at 1200 Gy/hr appears lighter with a higher degree of background interference.

Figure 25C:
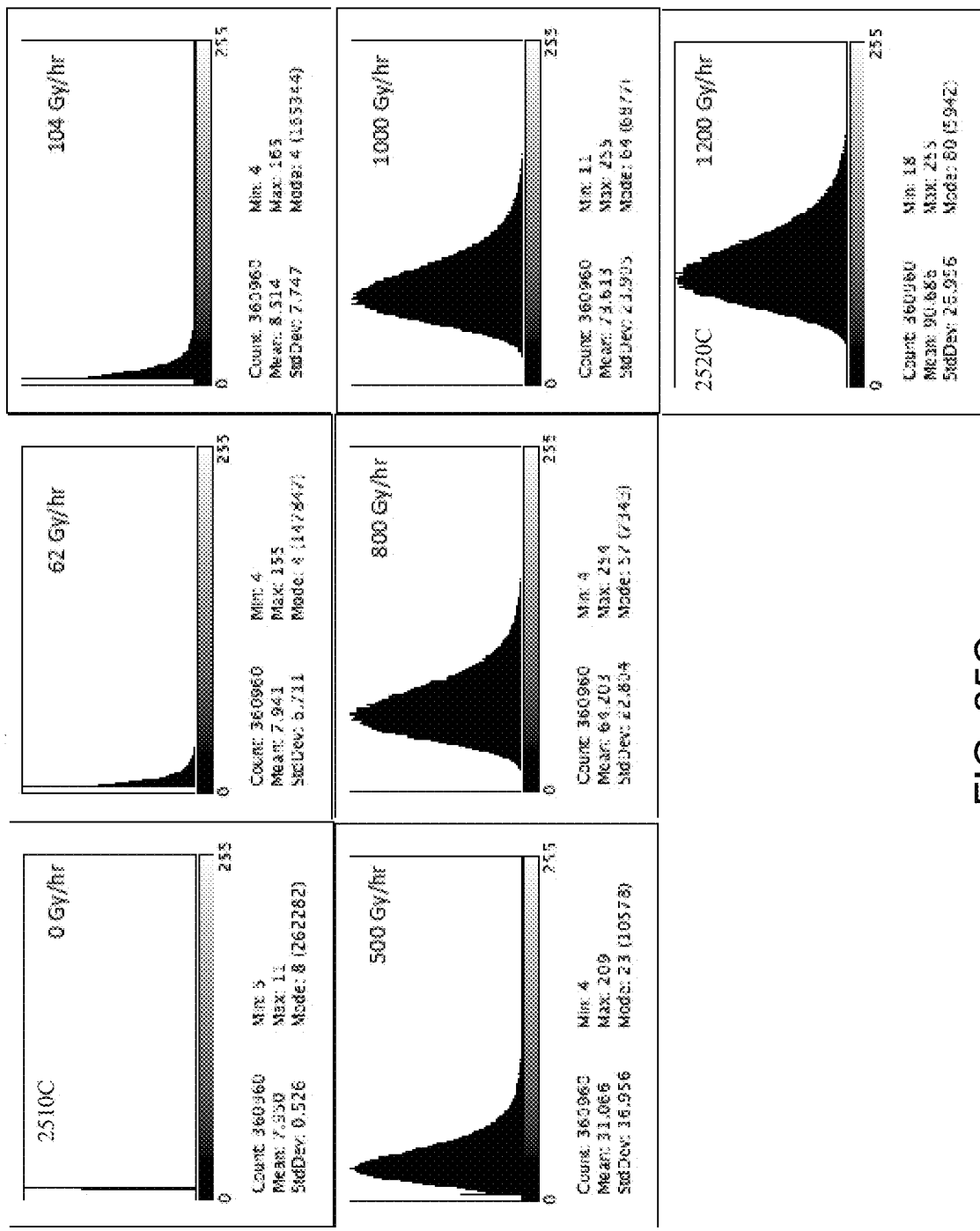
FIG. 25C illustrates histograms of the representative images from FIGS. 25A and 25B in accordance with an embodiment of the present invention.

FIG. 25C illustrates histograms of the representative images from FIGS. 25A and 25B in accordance with an embodiment of the present invention. As seen in the histograms corresponding to the images of FIGS. 25A and 25B, the mean response increases as dose rate increases from 7.95 at 0 Gy/hr to 90.7 at 1,200 Gy/hr. Also, it is observed from the histograms that the standard deviation appears to change significantly at a low dose rate. For example, standard deviation of images at 0 Gy/hr is less than 1 and increases by an order of magnitude at 62 Gy/hr (6.711).

In order to train artificial intelligence algorithms, e.g., Deep CNN to recognize neutron counts from images with varying levels of gamma radiation, first the neutron patterns need to be established based on pre-existing knowledge of the symmetry of neutron patterns and physics underlying neutron behavior. Further, the neutrons need to be labeled in the training images based on these patterns.

Figure 26A:
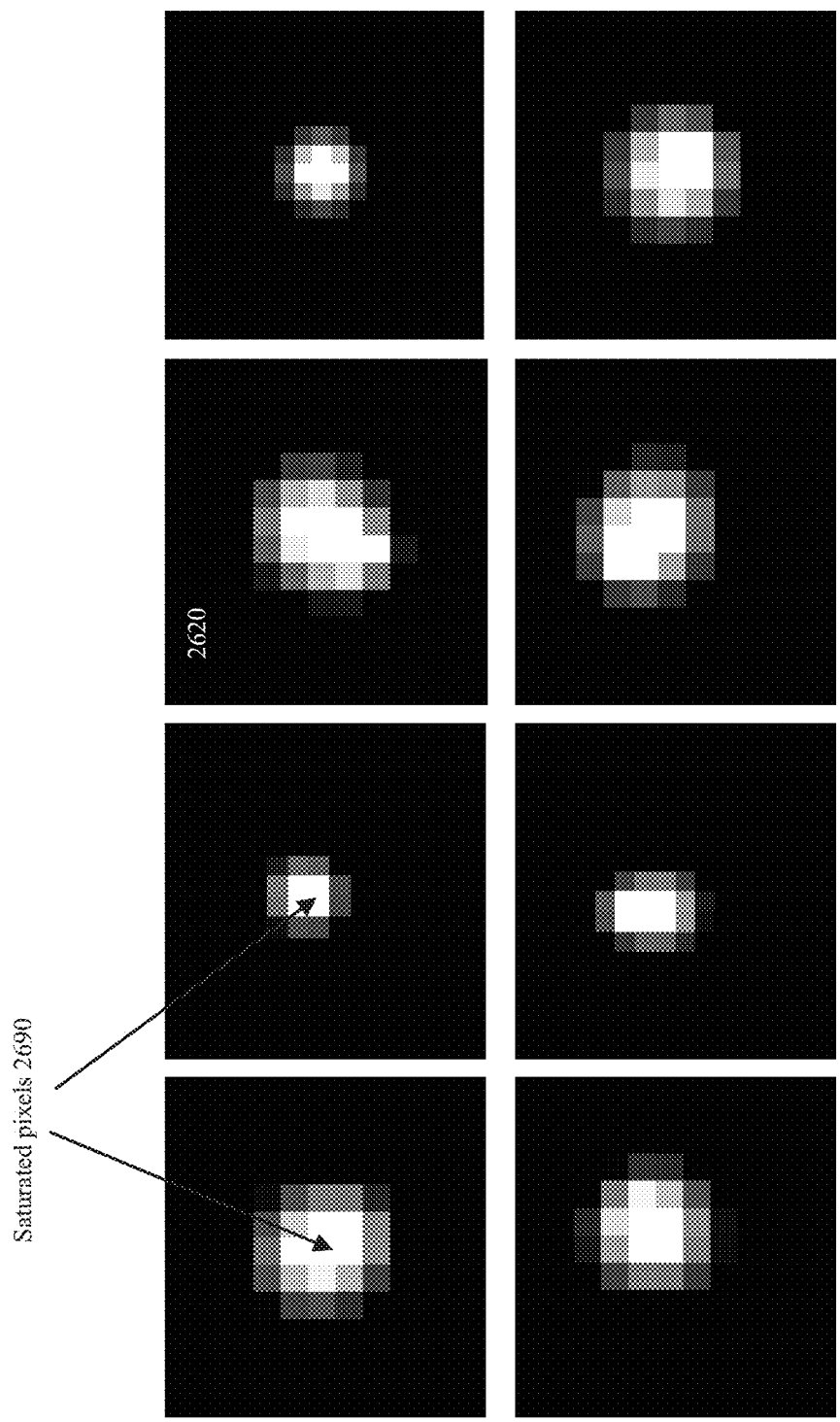
FIG. 26A illustrates a collection of eight bright neutron counts with a background gamma radiation of 0 Gy/hr in accordance with an embodiment of the present invention.

FIG. 26A illustrates a collection of eight bright neutron counts with a background gamma radiation of 0 Gy/hr in accordance with an embodiment of the present invention. The images in FIG. 26 may be a series of training images that are inputted into artificial intelligence software to train it to recognize neutrons from images with varying levels of gamma radiation. The qualitative similarities in the patterns between the neutron counts is observable from the eight images in FIG. 26. For example, all the counts comprise a bright and symmetric pattern characterized by some degree of radial symmetry, saturated center pixels, and gradually decreasing pixel intensity from the center. Each count appears to contain at least 4 saturated pixels 2690, where the saturated pixel intensity equals 255. For example, the count in frame 2620 comprises at least 6 saturated pixels.

Figure 26B:
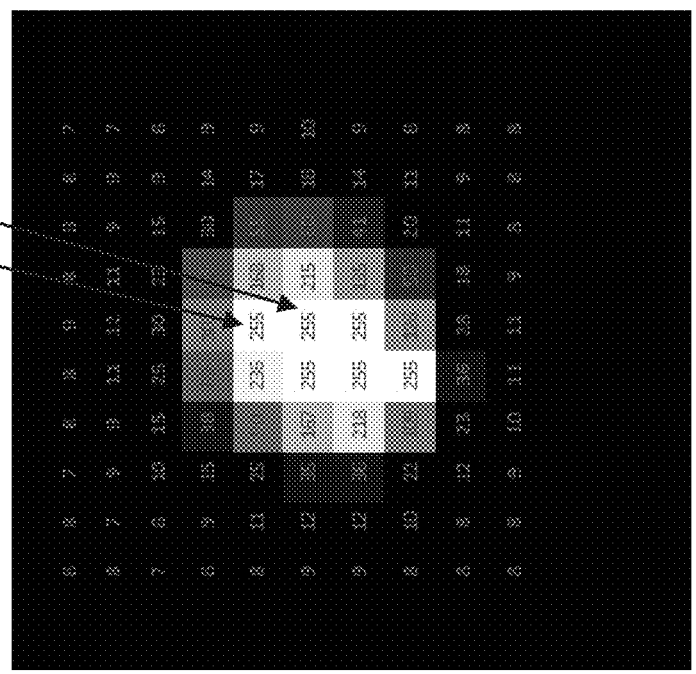
FIG. 26B illustrates a magnified view of a count comprising at least 4 saturated pixels.

FIG. 26B illustrates a magnified view of a count comprising at least 4 saturated pixels. FIG. 26B illustrates the count in frame 2620 with the pixel intensity values overlaid. As seen in FIG. 26B, the count in frame 2620 comprises at least 6 saturated pixels 2690.

Counts with saturated pixels are easy to identify by eye and because the counts deposit a large amount of energy into the CMOS pixels in an identifiable pattern, they are also identifiable by software even in the presence of significant amounts of gamma radiation.

Once the neutrons have been labeled in training images based on the patterns, the deep learning artificial neural network, e.g, Deep CNN can be trained to recognize these patterns. Other types of artificial intelligence algorithms that can be trained to recognize neutrons in images include for example ReLu CNN, Cascaded CNN, Support Vector Machine, Random Forest, XG Boost, LSTM of various kinds, Recurrent Neural Networks, Convolution Deep Neural Networks, and Bayesian Deep Neural Networks. Ater the deep learning software is trained, the software can be tested on a new set of images where neutrons have been previously been identified. In other words, the deep learning software is tested on images where the number and location of the neutrons is known. If the accuracy is acceptable, then new images may be fed to the artificial neural networks. Otherwise, training is conducted with more images. In one embodiment, if the deep learning software flags false positives, it can be re-trained to recognize the patterns that result in false positives and refrain from flagging them in the future.

Figure 27A:
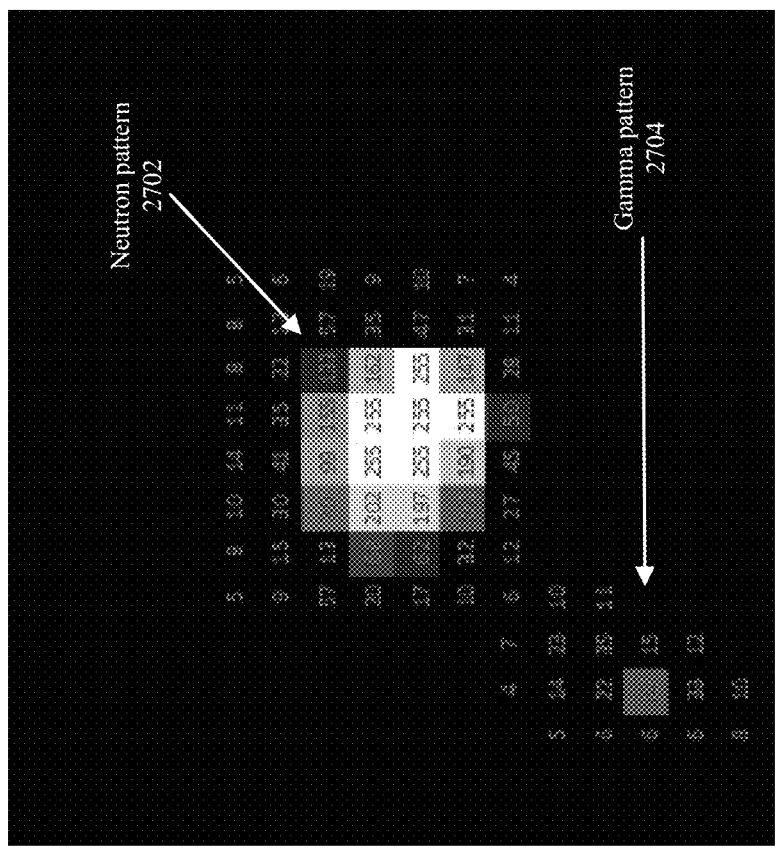
FIG. 27A illustrates a first pixel level image with neutron and gamma signatures in the same image in accordance with an embodiment of the present invention.

FIG. 27A illustrates a first pixel level image with neutron and gamma signatures in the same image in accordance with an embodiment of the present invention. In one embodiment, the detector of the present invention detects gamma radiation and neutrons within a single frame. Neutron and gamma signatures are easily discriminated due to a wide difference in physical interactions. Neutron signatures deposit a significant amount of energy into the CMOS pixels and retain their distinct size and shape patterns even as gamma interactions increase the ambient image brightness.

The image in FIG. 27A contains a relatively low level of background gamma radiation, approximately, 62 Gy/hr. Accordingly, the neutron pattern 2702 is easily distinguishable The image in FIG. 27 is an example of neutron detection in an environment with neutron flux and gamma radiation present. The image contains one bright neutron count and a distinct signature of a gamma photon 2704.

As mentioned previously, neutrons interact with the converter layer adjacent to the CMOS pixel. Reaction between the neutron and converter layer produce an alpha particle and triton, ionizing particles which have a finite interaction probability with silicon. Gamma photons interact directly with silicon via Compton scattering, depositing some fraction of their energy into the crystal lattice. Change in voltage as a result of the presence of charge in the CMOS active-pixel is measured.

It should be noted that embodiments of the present invention may also be used to detect gamma photons using, e.g., the CMOS sensors. As noted, the gamma photons interact with the silicon and illuminate pixels as shown in FIG. 27A with a distinct gamma signature 2704.

Neutron counts in the image of FIG. 27A are readily identifiable because they comprises a characteristic bright and symmetric pattern with some degree of radial symmetry, saturated center pixels, and gradually decreasing pixel intensity from the center. Further, as compared with the pixel intensity of the neighboring gamma photon 2704, the maximum pixel intensity of the neutron count is much higher. For example, in FIG. 27A, the maximum pixel intensity deposited by the gamma photon scattering interaction is 87, with a total of 200-300 pixel intensity for the six brightest pixels in the gamma track. By comparison, the maximum pixel intensity for the neutron count is 255 (saturation) with the bright pixels summing up to more than 3000.

In one embodiment, the command and control module can be programmed to recognize damaged pixels within a sensor. Damaged sensors can be detected because they will typically be stuck at high intensity values for prolonged periods. For example, a damaged pixel may provide a consistent reading of 255 for several consecutive frames. The command and control module can be programmed to turn off certain pixels selectively within the sensor. In other words, at the software level, the command and control module can be programmed to recognize that certain pixels are damaged and to ignore the output from those pixels.

Figure 27B:
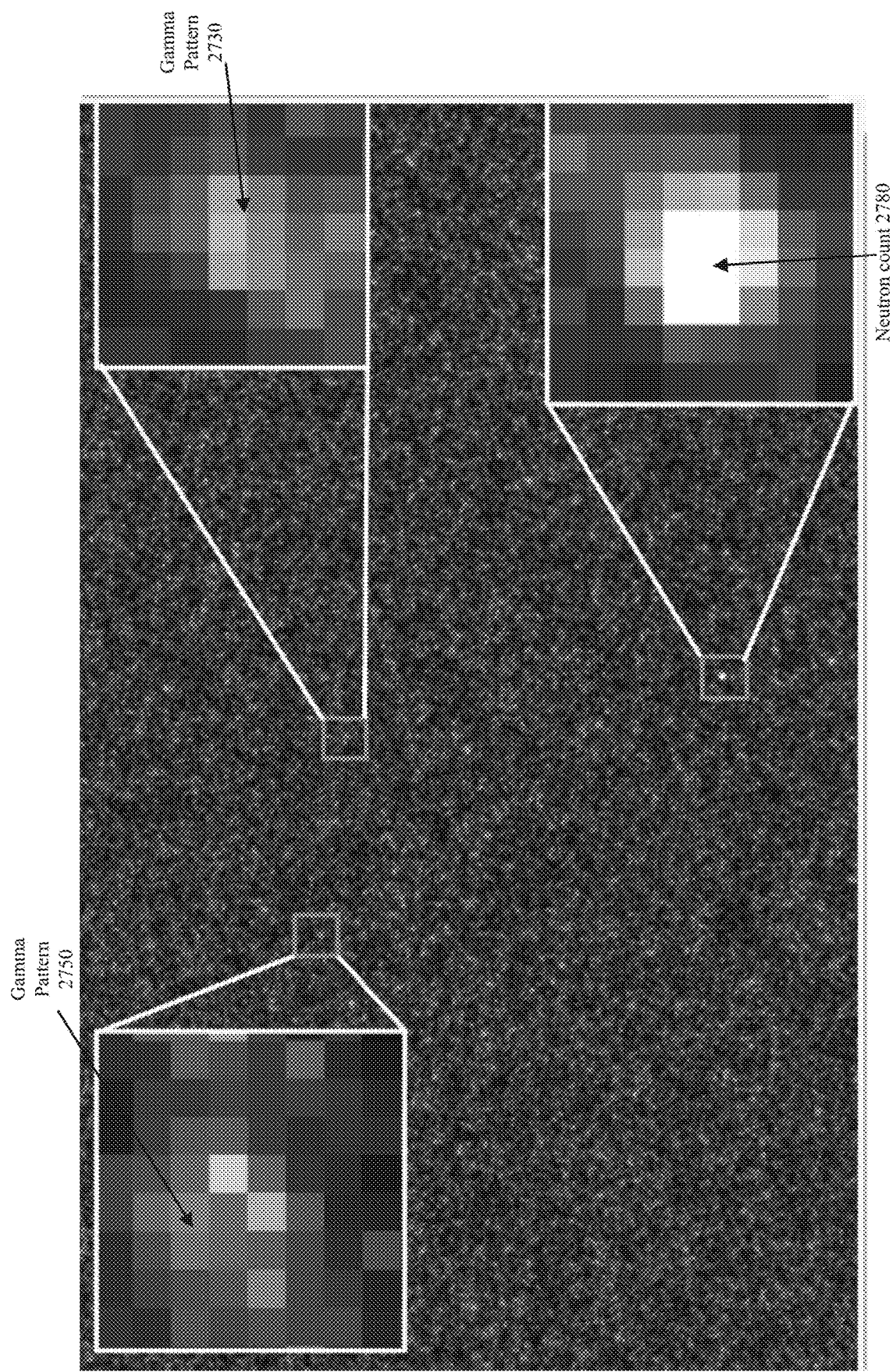
FIG. 27B illustrates a second pixel level image with neutron and gamma signatures in the same image in accordance with an embodiment of the present invention.

FIG. 27B illustrates a second pixel level image with neutron and gamma signatures in the same image in accordance with an embodiment of the present invention. As seen in FIG. 27B, the neutron count 2780 is readily identifiable because it comprises a characteristic bright and symmetric pattern with some degree of radial symmetry, saturated center pixels, and gradually decreasing pixel intensity from the center. Meanwhile, the gamma patterns 2750 and 2730 can be easily distinguished from the neutron pattern because the gamma patterns are dimmer, have much lower cumulative pixel intensity, do not contain any saturated pixels, and the patterns do not tend to be symmetric. Asymmetric patterns generally tend to be not related to neutrons. Because of the stark differences in features between the gamma and neutron patterns at the pixel level, the deep learning software can be easily trained to distinguish between the two types of pattern.

Figure 28:
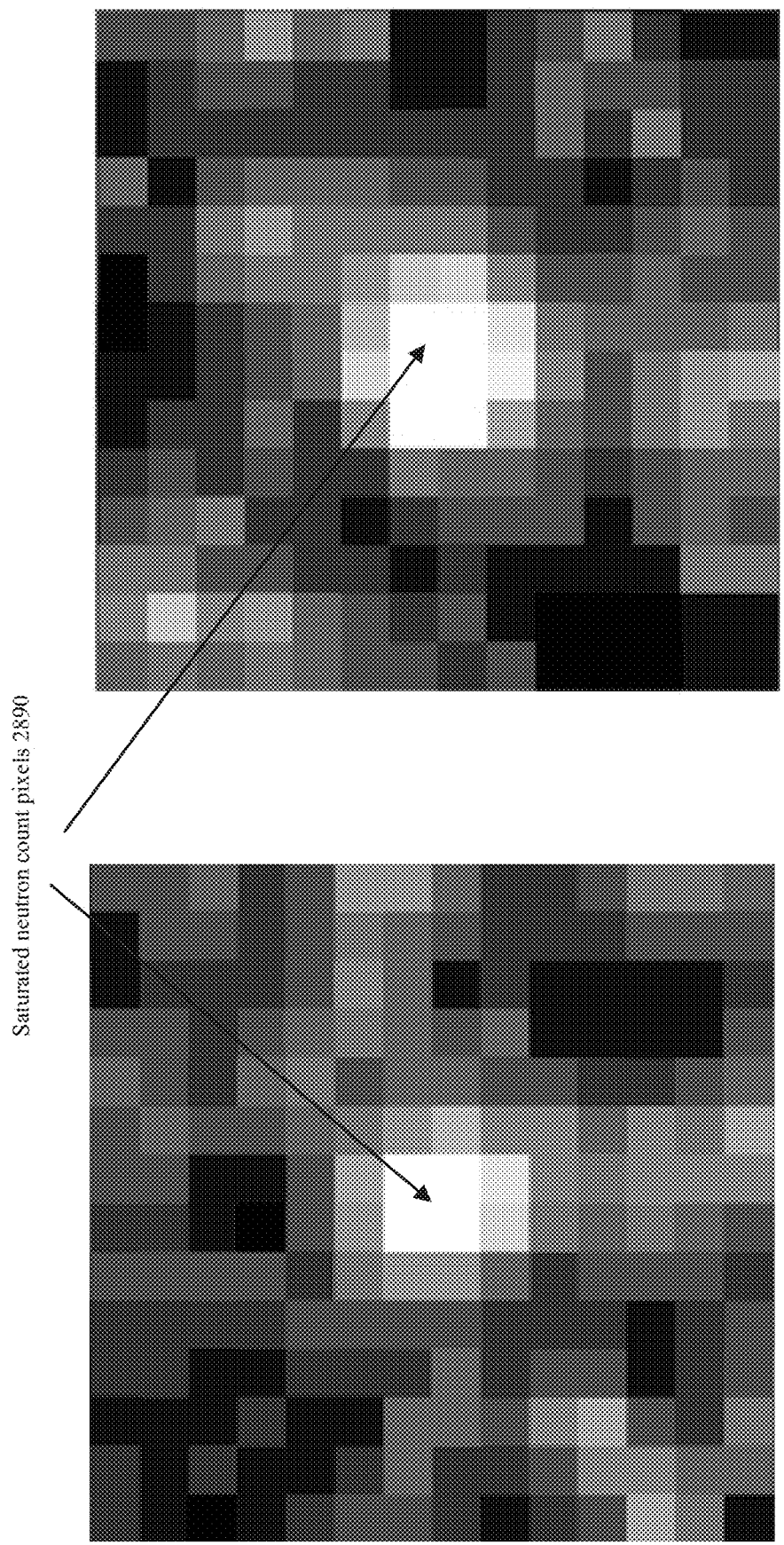
FIG. 28 illustrates pixel level images with neutron counts under high gamma conditions in accordance with an embodiment of the present invention.

FIG. 28 illustrates pixel level images with neutron counts under high gamma conditions in accordance with an embodiment of the present invention. The pixel level images shown in FIG. 28 each contain a bright neutron count 2890 under 1,000 Gy/hr gamma conditions. As seen in FIG. 28, at 1,000 Gy/hr the bright count 2890 in each frame is less visible than at 62 Gy/hr but still reliably distinguishable by shape (size and symmetry) and intensity. Accordingly, the deep learning algorithms can easily be trained to recognize bright neutron counts even in images with a high degree of gamma radiation, e.g., 1,200 Gy/hr.

Figure 29:
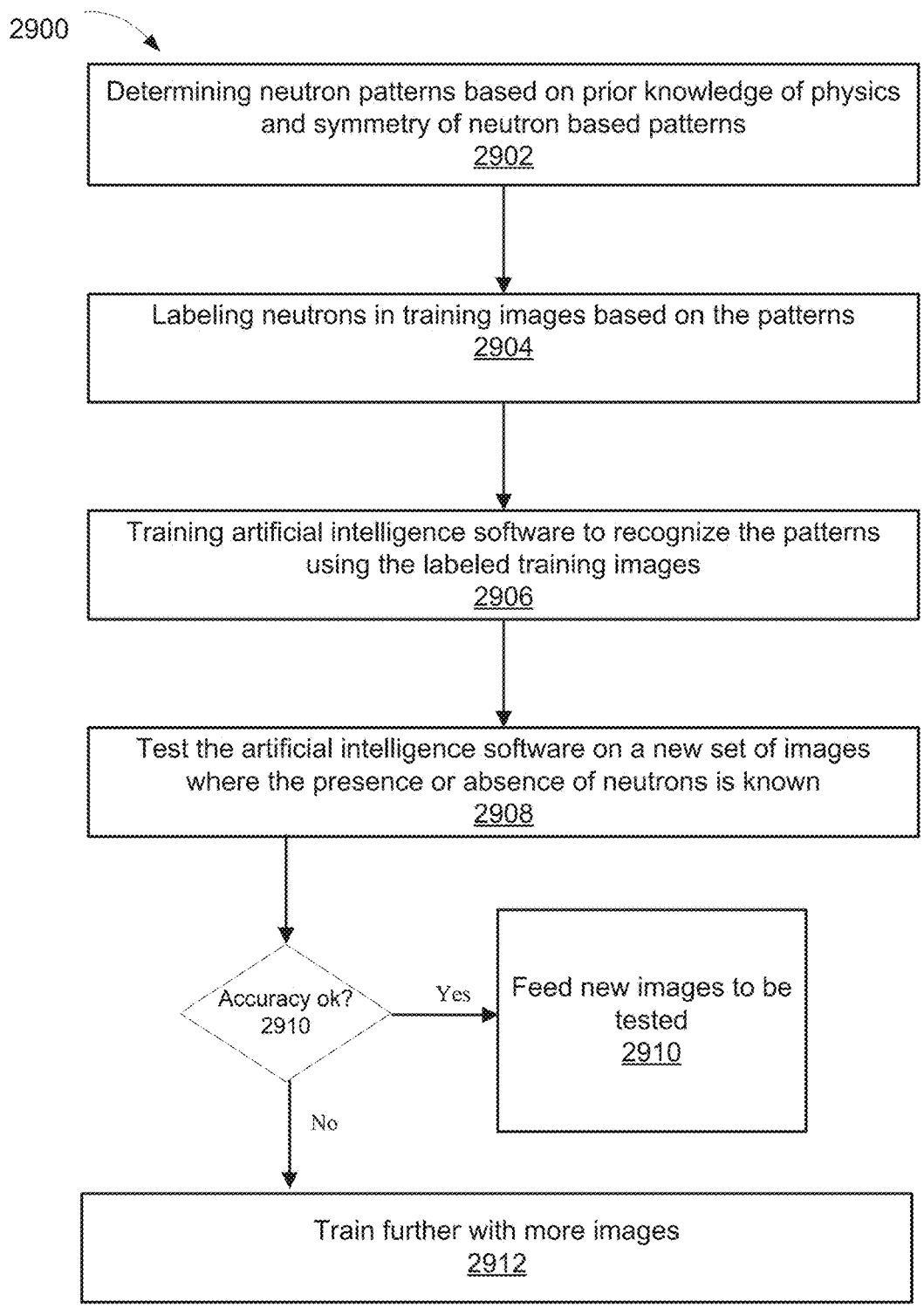
FIG. 29 depicts a flowchart of an exemplary computer implemented process for detecting the presence of neutrons in images produced from sensor information in accordance with an embodiment of the present invention.

FIG. 29 depicts a flowchart 2900 of an exemplary computer implemented process for detecting the presence of neutrons in images produced from sensor information in accordance with an embodiment of the present invention.

At step 2902, the neutron patterns first need to be established based on prior knowledge of the physics of neutron behavior and other information, for example, the known symmetrical behavior of neutron counts.

At step 2904, a collection of training images containing known neutron patterns in them are labeled. In other words, the neutron pattern in the training images is confirmed and the pixels that are part of the neutron pattern are clearly labeled.

At step 2906, the deep learning software, e.g., Deep CNN is trained to recognize the known patterns using the labeled training images.

At step 2908, the artificial intelligence software is tested on a new set of images where the presence or absence of neutrons is known. For example, a number of images known to either contain or be free of neutrons are fed to the artificial intelligence software.

If the accuracy is over a certain threshold at step 2910, then new images are ready to be tested using the deep learning software at step 2910. If the accuracy is not satisfactory, then the software needs to be re-trained with further images at step 2912.

As mentioned earlier, in one embodiment, the deep learning software can be programmed to execute on the computer modules 2130A-2130D shown in FIG. 21. In one embodiment, once the artificial intelligence software detects a neutron, information received from the command and control modules can be used to precisely identify the sensor number, the frame number, the time-stamp and the x-y coordinates of the pixel where the neutron was detected. In one embodiment, the information is displayed along with the image containing the neutron pattern on display 2150 for the user to view.

In one embodiment, the software running on the compute modules can also be programmed to combine the neutron detection information from various sensors, e.g., all the sensors arranged in a cubical configuration as shown in FIG. 13, to determine the source of the neutrons using the triangulation methods discussed above. Further, in an application such as the damaged nuclear reactor discussed above, the robot sent into the containment units to do a scan (equipped, e.g., with the exemplary detector unit from FIG. 14) can be programmed to operate in autonomous driving mode and use the information from the triangulation to independently locate the source of the neutrons. In one embodiment, machine learning can also be used to teach the robot to independently find the source of neutrons within the containment units. The robot can also use the information collected from the various sensors to generate a 3D debris map based on the detected neutrons.

Figure 30:
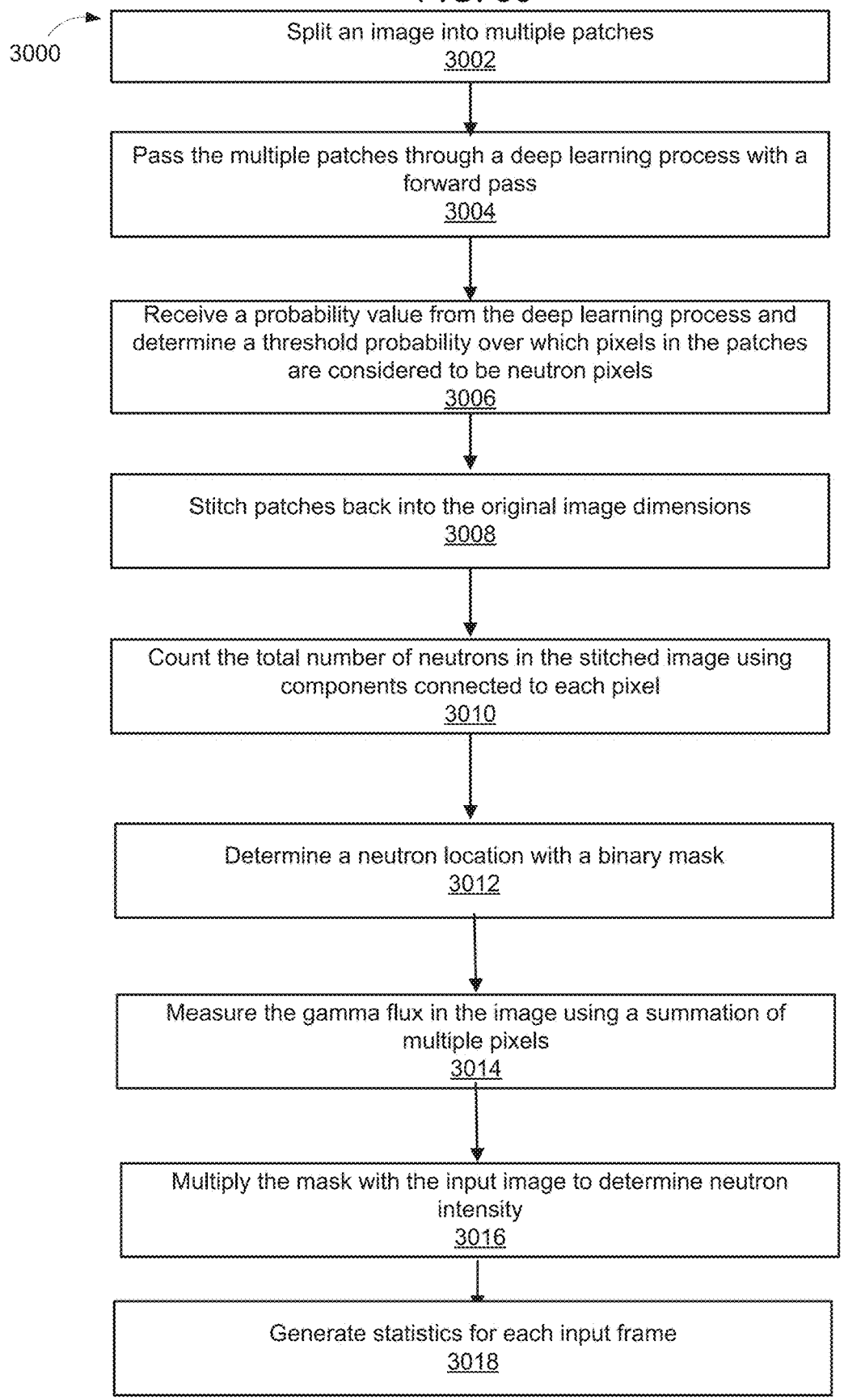
FIG. 30 depicts a flowchart of an exemplary computer implemented process for analyzing images to detect neutrons using deep learning processes in accordance with an embodiment of the present invention.

FIG. 30 depicts a flowchart 3000 of an exemplary computer implemented process for analyzing images to detect neutrons using deep learning processes in accordance with an embodiment of the present invention.

At step 3002, an input image is split into multiple frames or patches. For example, given an input image of certain dimensions (e.g., 752×480 px) captured from the sensor, the software running on compute modules 2130A-2130D first splits the image into frames or patches (e.g., 48×48 or 96×96 pixels).

At step 3004, these patches are passed through the trained Deep Learning model (e.g., Deep CNN) with a forward pass.

At step 3006, a probability value is received from the deep learning processes. In other words, the output from the Deep CNN is the probability of each image pixel being a neutron. In one embodiment, a predetermined threshold value can be used over which the pixels are considered as being neutron pixels. For example, over a predetermined threshold of 75% probability, a pixel can be considered as being a neutron pixel. Thereafter, if the Deep CNN indicates that a pixel is over the 75% threshold probability value, the pixel is considered as being a neutron related pixel.

At step 3008, the image is stitched back into the original image dimensions.

At step 3010, the total number of neutrons present in the stitched image are counted using components connected to each pixel. As seen, for example, in FIGS. 26A, 26B and 27A, a neutron is identified by not only considering a saturated pixel or a high intensity pixel, but also by examining the group of pixels around the high intensity pixel. Accordingly, in order to identify a neutron, all the pixels adjacent to the pixel identified as being over the threshold level of probability are examined. The connected components examined will typically be adjacent to, share a vertex, or share a common boundary with the identified pixel of interest. Further, any pixels that have relatively higher intensities and identified as a connected component may be examined. By examining the features of the pixel of interest along with the connected pixels, the deep learning process is able to determine whether the cumulative pattern formed by the pixel of interest and the connected pixels is associated with neutrons or gammas.

At step 3012, a neutron location is determined using a binary mask. A binary mask is a control image with the same number of pixels as the image that is run through the deep learning process. However, in a binary mask, a zero may be assigned to all pixels that do not have any part of the neutron generated pattern, and a 1 may be assigned to all pixels with any part of the neutron generated pattern. The binary mask, once created, can be used to extract all the neutrons from an image by convolving (pixel by pixel multiplication) it with the original image.

At step 3014, the gamma flux in the image is measured using a summation of pixels. As discussed in connection with FIG. 27A, one way gamma radiation can be distinguished from neutrons is by summing up pixel intensities. Gamma radiation will typically exhibit lower cumulative pixel intensities in a pattern than in a neutron pattern. As discussed in connection with FIG. 27A, summing up pixel intensities involves summing up the intensity values of each pixel that is part of the pattern. Each pixel in a CMOS sensor has an intensity value that ranges from 0 to 255 (for 8 bit CMOS sensor) or 0 to 1024 for (10 bit CMOS sensor) etc. When gamma radiation is incident on the pixels, charges get generated as a result of Compton scattering (interaction of high energy gamma photons with Silicon). Note that gamma dose rate can be measured reliably by measuring the extent of energy deposited on the pixels—this typically translates to a convolution or summation of the pixel intensities that the sensor generates in response to an independently calibration and measured gamma field.

Visible light which has photons such as green photons will typically cause silicon electrons to get excited and move to the conduction band. Gamma photons contain much more energy than green photons, e.g., a million times more. When gamma photons enter the silicon CMOS sensor pixel, they might pass through without interacting. However, if they do interact, they will dislodge an electron from the atom itself. The gamma photons excited the silicon electrons to an extent that the electrons move beyond the condition band and get dislodged from the atom itself. These energetic fast electrons are responsible for the charges that are observed on the CMOS sensor in gamma related patterns.

Since the CMOS sensor is an excellent charge detection device, it registers the charges produced in each pixel as an "intensity" value that is a measure of how many electrons have been collected in the pixel. If the electrons fill up the pixel, it is possible that they will spill over by diffusion to adjacent pixels. The more the gamma photons that are incident on the silicon, the more charges get produced and the more the intensity observed in the pixels that see such interaction. Accordingly, one can derive a linear calibration regime for gamma incident dose, where the dose is the amount of energy that gets deposited in the silicon. Higher intensity values for pixels in a gamma pattern simply means a higher dose of gamma radiation. From the intensity values of the pixels in a gamma pattern, the gamma flux can be determined. As noted above, embodiments of the present invention, are able to detect neutrons in environments where the gamma flux is as high as 1,200 Gy/hr.

At step 3016, the binary mask can also be multiplied with the input image to determine neutron intensity. The multiplication is simply a pixel by pixel multiplication of two images. In other words, it is the element by element multiplication of two matrices—one of which has the intensity values in it (the original image) and the other has 1s and 0s (the binary mask).

Finally, at step 3018, statistics are generated for each input frame and are written into a file to be used for later analysis.

Figure 31:
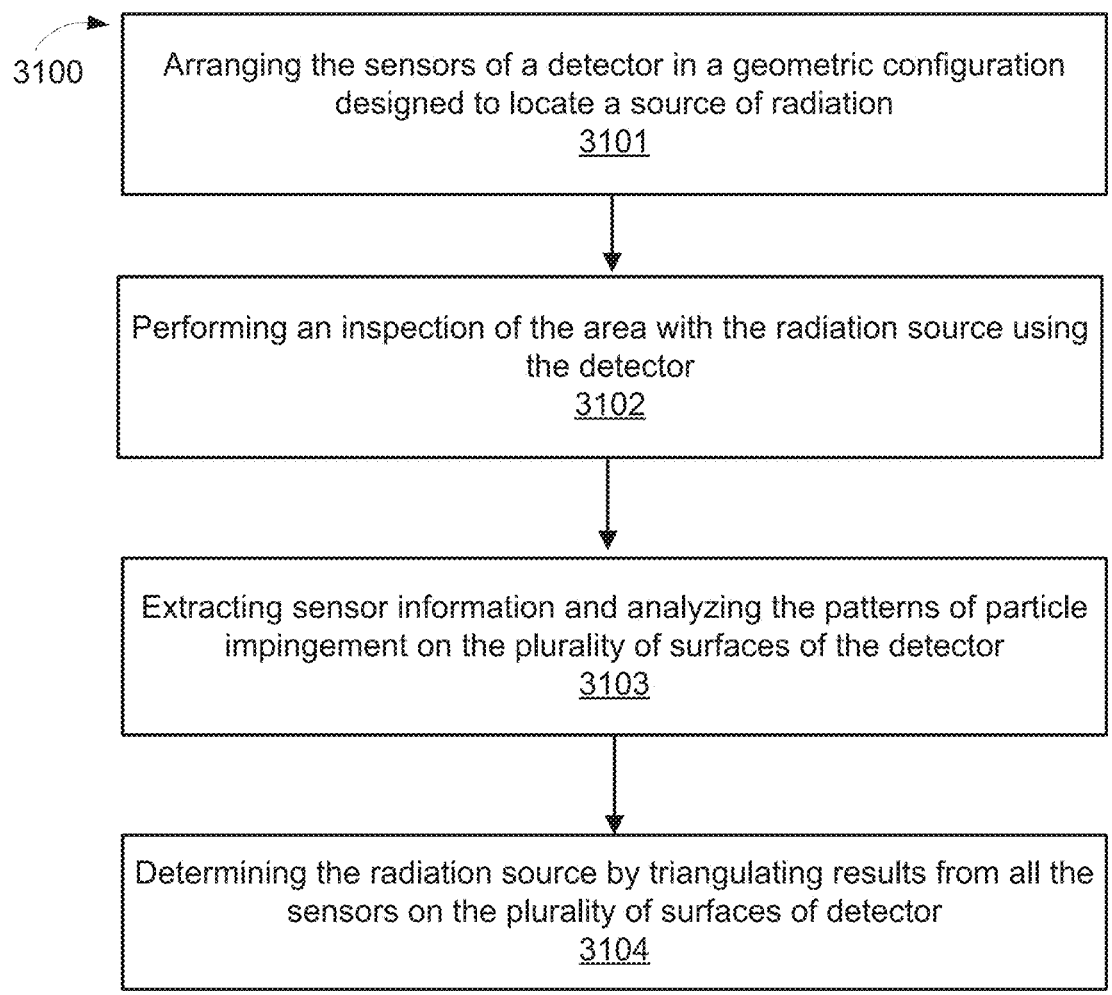
FIG. 31 depicts a flowchart of an exemplary computer implemented process for triangulating a source location for neutron particles in accordance with an embodiment of the present invention.

FIG. 31 depicts a flowchart 3100 of an exemplary computer implemented process for triangulating a source location for neutron particles in accordance with an embodiment of the present invention. It should be noted that while FIG. 31 is discussed in the context of neutrons, similar techniques may be applied to triangulate sources of any particle of interest to the user of a detector.

At step 3101, the sensing elements in a detector are configured geometrically in various different ways to scan an area in order to locate for sources of radiation. For example, the sensing elements or sensors can be arranged around a cube, cuboid, sphere, icosahedron, etc. Each of these configurations is reminiscent of a compound "eye" that is scanning some or all directions looking for neutrons and other subatomic particles.

At step 3102, an inspection is conducted of the area under investigation using the detector. In other words, the detector is used to locate particles of interest in the area suspected to contain the source of the radiation.

At step 3103, the information is extracted from the sensors in the detector and analyzed using software tools in the command, control and compute modules shown in FIG. 21. The pattern of impingement of the neutrons on the detector, for example, may be analyzed by the software. For instance, as discussed above in connection with FIGS. 12 and 13, if the detector is a cubed detector, then the patterns of neutron impingement on each sensor on each face of the cube may be analyzed.

As mentioned previously, the neutrons incident on one face of the cube will largely be detected by the sensing elements on that face. Since the sensing elements can be pixelated, with each pixel serving as a detection element, the angle between a sensing element and the source also creates a gradient of detection within the pixels. Within the same sensing element (e.g., the same SPU), the pixels closest to the source will likely detect more neutrons than the pixels farther away. By using the counts and profiles of neutrons detected on each side of the cube, it becomes possible to determine the location of the source by triangulating the results from all the elements on different sides of the cube.

Accordingly, at step 3104, the radiation source can be determined by triangulating results from all the sensors on the plurality of surfaces of the detector.

FIG. 32 depicts a flowchart 3200 of an exemplary computer implemented process for independently controlling sensors in order to ensure reliability in accordance with an embodiment of the present invention.

At step 3201, data is received at one or more command and control modules 2120A-2120D from a plurality of sensors in a detector.

At step 3202, based on the data received, the command and control modules can determine the number of particles of interest in the environment being detected. For example, if a high number of neutrons are detected in a nuclear reactor, the command and control modules can determine that the signal level is high. Alternatively, the command and control modules can also use the particle count to determine if the signal level is low.

At step 3203, in response to a determination that the signal level is high, one or more sensors in the detector are turned off. Since multiple redundant sensors are used in the detector to ensure reliability, this does not affect the overall performance of the detector. Similarly, at step 3204, in response to a determination that the signal level is low, some of the previously turned off redundant sensors can be turned back on again.

Figure 33:
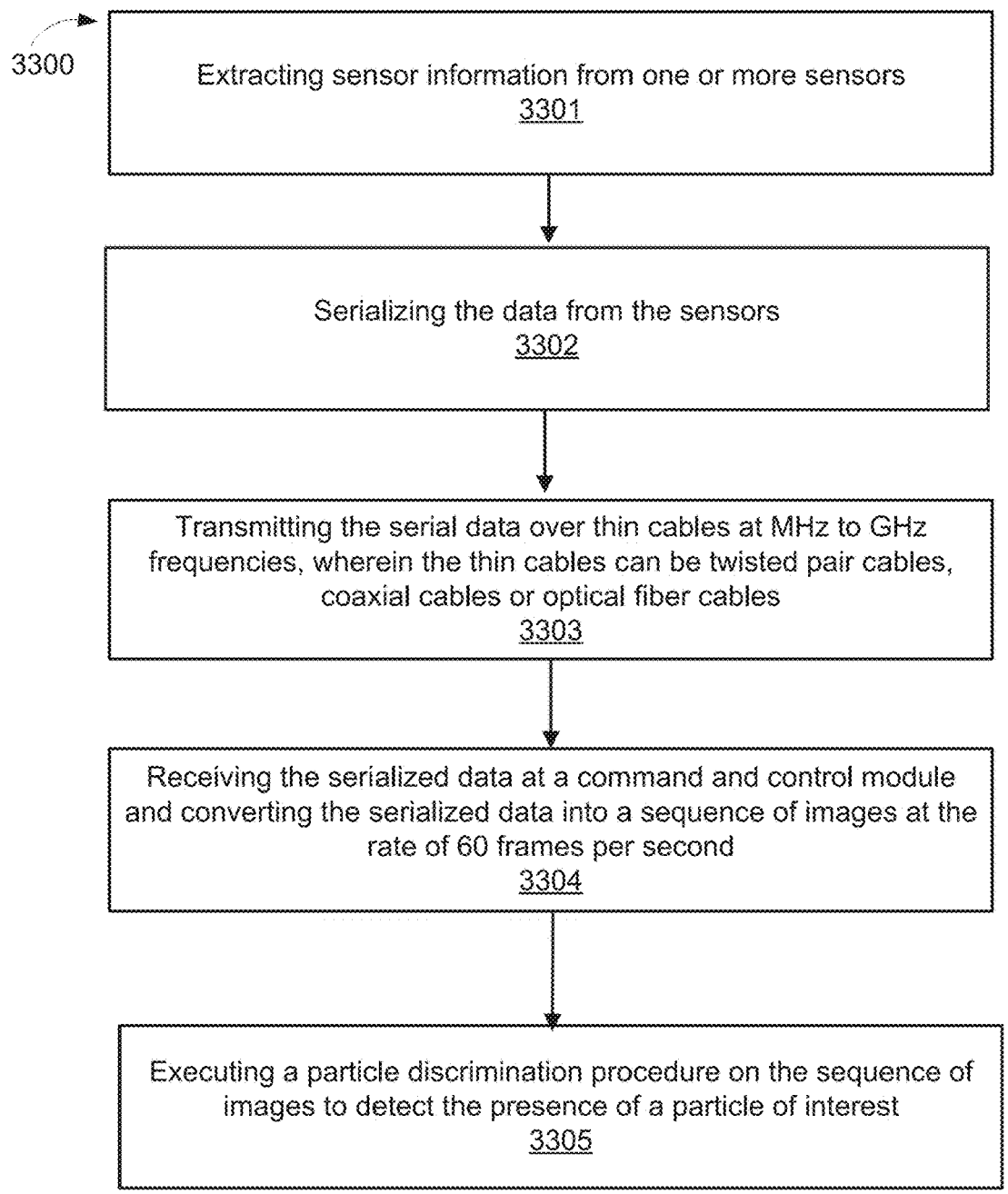
FIG. 33 depicts a flowchart of an exemplary computer implemented process for gathering information from tunable sensors used for particle detection in accordance with an embodiment of the present invention.

FIG. 33 depicts a flowchart 3300 of an exemplary computer implemented process for gathering information from tunable sensors used for particle detection in accordance with an embodiment of the present invention.

At step 3301, information is extracted from one or more tunable sensors used for particle detection. In one embodiment, the sensors can be in an adverse environment. At step 3302, the data from the sensors is serialized so that it can transmitted over long distances using thin cables, e.g., cables that are less than or equal to 3 mm in diameter. In one embodiment, the data from the sensor can also be tagged with the ID number of the sensor and a timestamp prior to transmitting.

At step 3303, the data is transmitted over the cables at MHz to GHz frequencies. In one embodiment, the thin cables can be twisted pair cables, coaxial cables or optical fiber cables. In another embodiment, the thin cables comprise protective shielding in order to make sure they can endure the adverse environmental conditions.

At step 3304, the serialized data can be received at the command and control modules 2120A-2120D where the serialized data can be converted into a sequence of images at the rate of 60 frames per second.

Finally, at step 3305, the compute modules 2130A-2130D can be used to execute particle discrimination procedures, e.g., using deep learning processes, on the sequence of images to detect the presence of particles of interest, e.g., gamma photons, neutrons, etc.

FIG. 34 depicts a flowchart 3400 of an exemplary computer implemented process for disabling sensors that are not functioning in order to ensure reliability of the detector and increases the operational life of the detector in accordance with an embodiment of the present invention.

At step 3401, a pattern is transmitted from the command and control modules 2120A-2120D to a plurality of sensors. For example, in one embodiment, a chessboard pattern can be transmitted to the plurality of sensors.

At step 3402, the pattern is received back from each of the plurality of sensors at the command and control module.

At step 3403, the received patterns are examined and compared with the patterns that were transmitted in order to determine a deviation between the two for each of the sensor modules.

At step 3404, responsive to a determination that the deviation is above a predetermined threshold for a particular sensor, the malfunctioning sensor is taken offline. In other words, the command and control module has individual control over the sensors and can deactivate malfunctioning sensors.

Further, at step 3405, a previously deactivated sensor that was turned off (for power related or other reasons) but is still operational can be turned back on to replace the sensor that was taken offline.

FIG. 35 depicts a flowchart 3500 of an exemplary computer implemented process for conserving power and managing heat in a tunable detector system in accordance with an embodiment of the present invention.

At step 3501, temperature readings are received at the command and control modules 2120A-2120D from a plurality of sensors inside a detector.

At step 3502, the command and control modules determine if the temperature of any of the sensors has exceeded a predetermined threshold.

At step 3503, the sensors, where the temperature has exceeded the threshold values, are placed in partial shutdown mode. If the partial shutdown mode is unavailable, then the sensors are completely shut off.

At step 3504, the sensors that were shut down are cycled back on after a predetermined amount of time has elapsed. In this way, power is conserved and heat is managed by cycling sensors on and off as needed based on the temperature readings from the sensors.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A computer implemented method of detecting neutrons in images from a tunable sensor system, the method comprising:
    training a deep learning process to recognize known radiation-dependent signature patterns created by neutrons in test images;

splitting an input image into a plurality of frames, wherein the input image comprises a plurality of pixels;

passing the plurality of frames through the deep learning process in order to recognize neutrons in the plurality of frames;

recombining the plurality of frames back into the input image;

for each pixel within the input image, examining pixels connected to a respective pixel to determine if a signature pattern particular to neutrons is present within the input image; and counting a number of neutrons within the input image using results from the examining.

2. The method of claim 1, further comprising:

determining a binary mask for the input image, wherein the binary mask assigns a value of '1' to each pixel in the image associated with the signature pattern particular to neutrons and assigns a value of '0' to remaining pixels in the input image; and convolving the binary mask with the input image to determine neutron intensity values for neutrons in the input image.

3. The method of claim 2, further comprising:

prior to the convolving, measuring a gamma flux in the input image by using a summation of multiple pixel intensities within the input image, wherein the gamma flux has lower cumulative intensity values than the signature pattern particular to neutrons.

4. The method of claim 3, further comprising:

generating statistics for the input image comprising information regarding the number of neutrons, the neutron intensity values and the gamma flux; and saving the statistics for further analysis.

5. The method of claim 1, wherein the training the deep learning process comprises:

labeling neutrons in a first plurality of images based on the known radiation-dependent signature patterns created by neutrons;

training the deep learning process to recognize the known radiation-dependent signature patterns created by neutrons using the labeled neutrons in the first plurality of images;

testing the deep learning process to recognize a presence of neutrons using a second plurality of images, wherein the second plurality of images are test images with known results;

responsive to a determination that an accuracy of recognition of the second plurality of images is above a threshold value, inputting new images to be tested to the deep learning process; and responsive to a determination that the accuracy of recognition is below the threshold value, training the deep learning processes with further images.

6. The method of claim 1, wherein the deep learning processes comprises a Deep Fully Convolutional Neural Network (CNN) process.

7. The method of claim 1, wherein the pixels connected to a respective pixel comprise pixels that share a common border or a vertex with the respective pixel.

8. The method of claim 1, wherein the examining pixels connected to a respective pixel comprises:

determining a number of saturated pixels in a pattern formed by the respective pixel and the pixels connected to the respective pixel;

determining if the pattern is symmetric; and determining if the pixels in the pattern exhibit gradually decreasing pixel intensity from a center of the pattern.

9. A non-transitory computer-readable storage medium having stored thereon, computer executable instructions that, if executed by a computer system cause the computer system to perform a method for detecting particles of interest in images from a tunable sensor system, the method comprising:

training a deep learning process to recognize known radiation-dependent signature patterns created by a particle of interest in test images;

recombining an input mage into a plurality of frames, wherein the input image comprises a plurality of pixels;

passing the plurality of frames through the deep learning process in order to recognize the particle of interest in the plurality of frames;

stitching the plurality of frames back into the input image;

for each pixel within the input image, examining pixels connected to a respective pixel to determine if a signature pattern particular to the particle of interest is present within the input image; and determining a count of the particle of interest within the input image using the connected pixels.

10. The non-transitory computer-readable storage medium of claim 9, wherein the method further comprises:

determining a binary mask for the input image, wherein the binary mask assigns a value of '1' to each pixel in the image associated with the signature pattern particular to the particle of interest and assigns a value of '0' to remaining pixels in the input image; and convolving the binary mask with the input image to determine intensity values for the particle of interest in the input image.

11. The non-transitory computer-readable storage medium of claim 10, wherein the method further comprises:

generating statistics for the input image comprising information regarding the count of the particle of interest and the intensity values of pixels associated with the signature pattern; and saving the statistics for further analysis.

12. The non-transitory computer-readable storage medium of claim 9, wherein the training the deep learning process comprises:

labeling the particle of interest in a first plurality of images based on the known radiation-dependent signature patterns created by the particle of interest;

training the deep learning process to recognize the known radiation-dependent signature patterns created by the particles of interest using the labeled particles of interest in the first plurality of images;

testing the deep learning process to recognize the presence of the particle of interest using a second plurality of images, wherein the second plurality of images are test images with known results;

responsive to a determination that an accuracy of recognition of the second plurality of images is above a threshold value, feeding new images to be tested to the deep learning process; and responsive to a determination that the accuracy of recognition is below the threshold value, training the deep learning processes with further images.

13. The non-transitory computer-readable storage medium of claim 12, wherein the deep learning processes comprises a Deep Fully Convolutional Neural Network (CNN) process.

14. The non-transitory computer-readable storage medium of claim 9, wherein the particle of interest is a neutron.

15. A system for detecting neutrons in images from a tunable sensor system, said system comprising:
- a memory for storing a plurality of test images, an input image, and instructions associated with a deep learning process and a process for detecting particles of interest in images;
- a processor coupled to the memory, the processor being configured to operate in accordance with the instructions to:
  - train the deep learning process to recognize known radiation-dependent signature patterns created by a particle of interest in test images;
  - split an input image into a plurality of frames, wherein the input image comprises a plurality of pixels;
  - pass the plurality of frames through the deep learning process in order to recognize the particle of interest in the plurality of frames;
  - combine the plurality of frames back into the input image;
  - for each pixel within the input image, examine pixels connected to a respective pixel to determine if a signature pattern particular to the particle of interest is present within the input image; and
  - determine a count of the particle of interest within the input image using the connected pixels.

16. The system of claim 15, wherein the processor is further configured to:
- determine a binary mask for the input image, wherein the binary mask assigns a value of '1' to each pixel in the image associated with the signature pattern particular to the particle of interest and assigns a value of '0' to remaining pixels in the input image; and
- convolve the binary mask with the input image to determine intensity values for the particle of interest in the input image.

17. The system of claim 16, wherein the processor is further configured to:
- generate statistics for the input image comprising information regarding the count of the particle of interest and the intensity values of pixels associated with the signature pattern; and
- save the statistics for further analysis.

18. The system of claim 15, wherein in order to train the deep learning process, the processor is configured to:
- label the particle of interest in a first plurality of images based on the known radiation-dependent signature patterns created by the particle of interest;
- train the deep learning process to recognize the known radiation-dependent signature patterns created by the particles of interest using the labeled particles of interest in the first plurality of images;
- test the deep learning process to recognize the presence of the particle of interest using a second plurality of images, wherein the second plurality of images are test images with known results;
- responsive to a determination that an accuracy of recognition of the second plurality of images is above a threshold value, feed new images to be tested to the deep learning process; and
- responsive to a determination that the accuracy of recognition is below the threshold value, train the deep learning processes with further images.

19. The system of claim 18, wherein the deep learning processes comprises a Deep Fully Convolutional Neural Network (CNN) process.

20. The system of claim 15, wherein the particle of interest is a neutron.

* * * * *